(12) United States Patent
Sniegowski et al.

(10) Patent No.: US 6,778,305 B2
(45) Date of Patent: Aug. 17, 2004

(54) SURFACE MICROMACHINED OPTICAL SYSTEM WITH REINFORCED MIRROR MICROSTRUCTURE

(75) Inventors: Jeffry J. Sniegowski, Edgewood, NM (US); M. Steven Rodgers, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 0 days.

(21) Appl. No.: 10/409,352

(22) Filed: Apr. 8, 2003

(65) Prior Publication Data

US 2003/0210481 A1 Nov. 13, 2003

Related U.S. Application Data

(62) Division of application No. 09/840,698, filed on Apr. 23, 2001, now Pat. No. 6,600,587.

(51) Int. Cl.[7] .......................... G02B 26/00; G02B 26/08
(52) U.S. Cl. ...................... 359/224; 359/223; 359/290; 359/846; 359/848
(58) Field of Search ................................ 359/223, 224, 359/225, 290, 291, 295, 846, 848, 849

(56) References Cited

U.S. PATENT DOCUMENTS

| | | | |
|---|---|---|---|
| 4,460,252 A | 7/1984 | Volleau et al. | |
| 5,227,921 A | 7/1993 | Bleier et al. | 359/846 |
| 5,550,090 A | 8/1996 | Ristic et al. | 437/228 |
| 5,583,688 A | 12/1996 | Hornbeck | 359/281 |
| 5,600,383 A | 2/1997 | Hornbeck | 348/771 |
| 5,637,539 A | 6/1997 | Hofmann et al. | 438/20 |
| 5,661,591 A | 8/1997 | Lin et al. | 359/214 |
| 5,751,469 A | 5/1998 | Arney et al. | 359/247 |
| 5,757,536 A * | 5/1998 | Ricco et al. | 359/224 |
| 5,766,367 A | 6/1998 | Smith et al. | 134/2 |
| 5,783,340 A | 7/1998 | Farino et al. | 430/22 |
| 5,798,283 A | 8/1998 | Montague et al. | 438/24 |
| 5,804,084 A | 9/1998 | Nasby et al. | 216/2 |
| 5,867,302 A | 2/1999 | Fleming | 359/291 |
| 5,919,548 A | 7/1999 | Barron et al. | 428/138 |
| 5,920,421 A | 7/1999 | Choi | 359/224 |
| 5,955,801 A | 9/1999 | Romero et al. | 310/40 MM |
| 5,959,376 A | 9/1999 | Allen | 310/40 MM |
| 5,963,788 A | 10/1999 | Barron et al. | 438/48 |
| 5,990,473 A | 11/1999 | Dickey et al. | 250/231.13 |
| 5,994,801 A | 11/1999 | Garcia | 310/40 MM |
| 6,012,336 A | 1/2000 | Eaton et al. | 73/754 |
| 6,020,272 A | 2/2000 | Fleming | 438/734 |
| 6,045,231 A | 4/2000 | Martineau | 359/838 |
| 6,046,966 A | 4/2000 | Drake et al. | 369/112.29 |
| 6,082,208 A | 7/2000 | Rodgers et al. | 74/406 |
| 6,236,490 B1 | 5/2001 | Shen | 359/247 |
| 6,253,001 B1 | 6/2001 | Hoen | 385/17 |
| 6,283,601 B1 | 9/2001 | Hagelin et al. | 359/871 |
| 6,329,738 B1 | 12/2001 | Hung et al. | 310/309 |
| 6,433,917 B1 | 8/2002 | Mei et al. | 359/291 |
| 2001/0048265 A1 | 12/2001 | Miller et al. | 310/309 |

OTHER PUBLICATIONS

Nee et al.; "Stretched–Film Micromirrors for Improved Optical Flatness"; Jan., 2000; IEEE MEMS—2000 Conference, Miyazaki, Japan; pp. 704–709.

* cited by examiner

*Primary Examiner*—John Juba, Jr.
(74) *Attorney, Agent, or Firm*—Marsh Fischmann & Breyfogle LLP

(57) ABSTRACT

Various embodiments of reinforced mirror microstructures for a surface micromachined optical system are disclosed. Multi-layered and structurally reinforced mirror microstructures are disclosed, including both two and three-layer microstructures. Adjacent structural layers in these multi-layered mirror microstructures may be structurally reinforced and interconnected by a plurality of vertically disposed columns, or by a plurality of at least generally laterally extending rails or ribs, or some combination thereof. Various embodiments of a single layered mirror microstructure with a structural reinforcement assembly that cantilevers from a lower surface thereof is also disclosed.

48 Claims, 32 Drawing Sheets

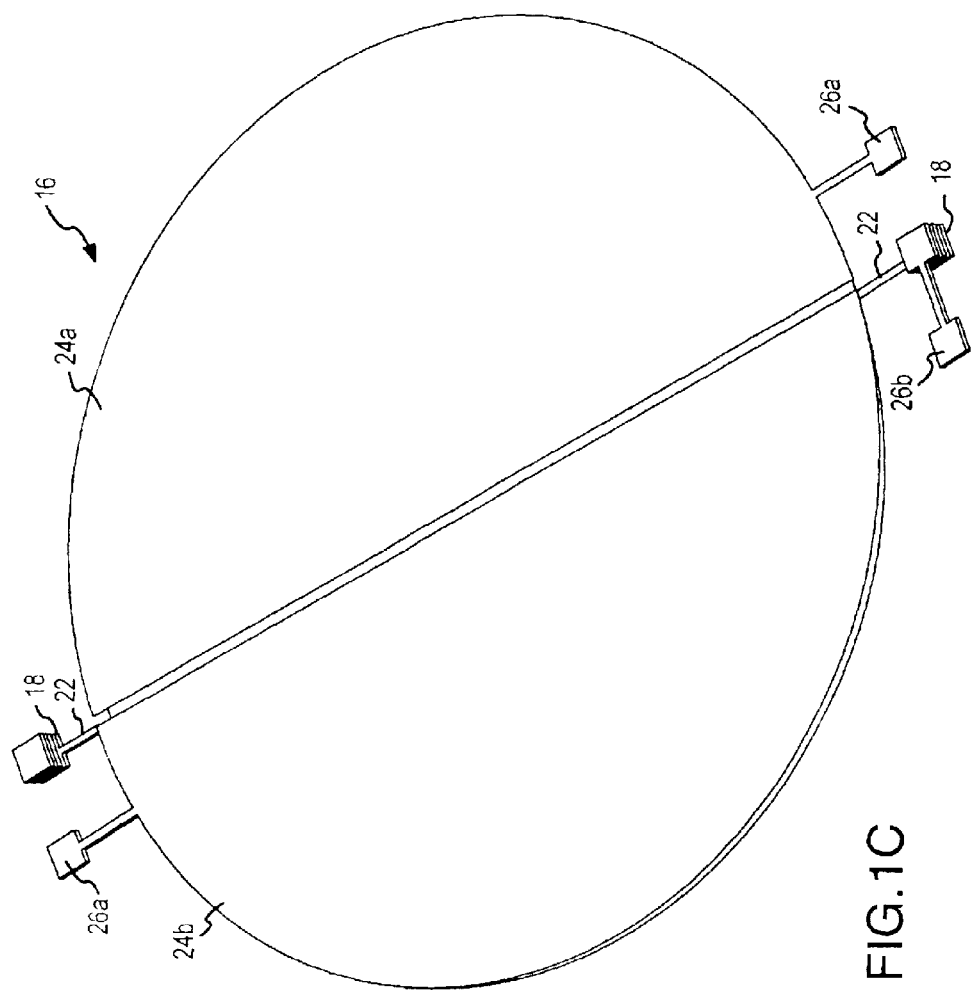

SURFACE MICROMACHINED OPTICAL SYSTEM WITH REINFORCED MIRROR MICROSTRUCTURE

RELATED APPLICATIONS

This patent application is a divisional of, and claims priority under 35 U.S.C. §120 to, U.S. patent application Ser. No. 09/840,698, that was filed on Apr. 23, 2001, now U.S. Pat. No. 6,600,587, that is entitled"SURFACE MICROMACHINED OPTICAL SYSTEM WITH REINFORCED MIRROR MICROSTRUCTURE," and the entire disclosure of which is incorporated by reference in its entirety herein.

FIELD OF THE INVENTION

The present invention generally relates to surface micromachined optical systems and, more particularly, to such systems that include at least one structurally reinforced surface micromachined mirror microstructure.

BACKGROUND OF THE INVENTION

There are a number of microfabrication technologies that have been utilized for making microstructures (e.g., micromechanical devices, microelectromechanical devices) by what may be characterized as micromachining, including LIGA (Lithographie, Galvonoformung, Abformung), SLIGA (sacrificial LIGA), bulk micromachining, surface micromachining, micro electrodischarge machining (EDM), laser micromachining, 3-D stereolithography, and other techniques. Bulk micromachining has been utilized for making relatively simple micromechanical structures. Bulk micromachining generally entails cutting or machining a bulk substrate using an appropriate etchant (e.g., using liquid crystal-plane selective etchants; using deep reactive ion etching techniques). Another micromachining technique that allows for the formation of significantly more complex microstructures is surface micromachining. Surface micromachining generally entails depositing alternate layers of structural material and sacrificial material using an appropriate substrate which functions as the foundation for the resulting microstructure. Various patterning operations may be executed on one or more of these layers before the next layer is deposited so as to define the desired microstructure. After the microstructure has been defined in this general manner, the various sacrificial layers are removed by exposing the microstructure and the various sacrificial layers to one or more etchants. This is commonly called "releasing" the microstructure from the substrate, typically to allow at least some degree of relative movement between the microstructure and the substrate. Although the etchant may be biased to the sacrificial material, it may have some effect on the structural material over time as well. Therefore, it is generally desirable to reduce the time required to release the microstructure to reduce the potential for damage to its structure.

Microstructures are getting a significant amount of attention in the field of optical switches. Microstructure-based optical switches include one or more mirror microstructures. Access to the sacrificial material that underlies the support layer that defines a given mirror microstructure is commonly realized by forming a plurality of small etch release holes down through the entire thickness or vertical extent of the mirror microstructure (e.g., vertically extending/disposed etch release holes). The presence of these small holes on the upper surface of the mirror microstructure has an obvious detrimental effect on its optical performance capabilities. Another factor that may have an effect on the optical performance capabilities of such a mirror microstructure is its overall flatness, which may be related to the rigidity of the mirror microstructure. "Flatness" may be defined in relation to a radius of curvature of an upper surface of the mirror microstructure. This upper surface may be generally convex or generally concave. Known surface micromachined mirror microstructures have a radius of curvature of no more than about 0.65 meters.

BRIEF SUMMARY OF THE INVENTION

The present invention is a surface micromachined optical system that is fabricated on a substrate that is compatible with surface micromachining. Multiple structural layers may be utilized by this system. In this regard, the system includes a first mirror microstructure that is movably interconnected with the substrate, and that may be moved relative to the substrate by at least one actuator that is interconnected with the mirror microstructure. Any way of interconnecting the mirror microstructure with the substrate that allows the mirror microstructure to move relative to the substrate in the desired/required manner may be utilized by the present invention. Moreover, any type of actuator, any number of actuators, or both may be utilized to accomplish the desired movement of the mirror microstructure relative to the substrate. All aspects of the present invention that will now be discussed in more detail utilize the various features addressed in this paragraph and will not be repeated on each occasion.

A first aspect of the above-described surface micromachined optical system has a first mirror microstructure that includes a first structural layer that is spaced from the substrate, a second structural layer that is spaced from the first structural layer away from the substrate, and a plurality of first columns that extend between and fixedly interconnect the first and second structural layers (i.e., so that the first and second structural layers are joined together), and further that are appropriately spaced. As such, the first structural layer is disposed between the second structural layer and the substrate, or at a lower elevation or level relative to the substrate than the second structural layer. Relative movement is allowed between the first mirror microstructure associated with the first aspect and the substrate.

Various refinements exist of the features noted in relation to the first aspect of the present invention. Further features may also be incorporated in the first aspect of the present invention as well. These refinements and additional features may exist individually or in any combination. The surface micromachined optical system of the first aspect may include other microstructures at the same or different elevations or levels relative to the substrate than that which is occupied by the first and/or second structural layers and/or the plurality of first columns of the first mirror microstructure of the first aspect. One or more microstructures or a part thereof may also be disposed directly under the first mirror microstructure such that the same is located directly between the first structural layer and the substrate. There will still be a space between the first structural layer and any underlying structure of the system to allow for relative movement between the first mirror microstructure and the substrate.

Typically the first and second structural layers associated with the first aspect will be vertically aligned such that the second structural layer will be directly above the first structural layer, and further such that their respective centers will be vertically aligned. There may be circumstances where such will not be the case. Appropriate materials for the first and second structural layers and the plurality of first columns include polysilicon in which case the substrate may be silicon-based. Other materials that are appropriate for surface micromachining operations may be utilized for the first and second structural layers associated with the first aspect, such as various other forms of silicon; poly germanium-silicon; various metal films (e.g., aluminum); various metals (e.g., Al/Ni); and silicon carbide.

The surface micromachined optical system of the first aspect may be used for various applications, including optical switching, optical correction such as adaptive optics, and optical scanning. Materials that are used to define the second structural layer may possess sufficient optical properties for providing the desired/required optical function. However, it may be desirable to apply an optically reflective layer to the upper surface of the second structural layer to achieve desired optical properties/characteristics for the first mirror microstructure. Appropriate materials that may be deposited on the upper surface of the second structural layer include gold, silver, and aluminum for metal coatings. For metals, gold and an associated adhesion layer are preferable to obtain a suitable reflectance.

Other structural layers may be utilized by the first mirror microstructure of the first aspect. For instance, a third structural layer may be spaced from the second structural layer in a manner such that the second structural layer is located between the first and third structural layers, in which case the third structural layer would provide the desired/required optical functionality. Those features addressed above in relation to the optical features/characteristics of the second structural layer could then be utilized by the third structural layer. Structural interconnection of the third structural layer to the second structural layer may be accomplished by a plurality of second columns that extend between the second and third structural layers to fixedly interconnect the same. In one embodiment, none of the columns that structurally interconnect the first and second structural layers are aligned with any of the columns that structurally interconnect the second and third structural layers.

Increasing the number of spaced, but interconnected structural layers as a general rule and in accordance with the first aspect is believed to increase the rigidity or stiffness of the first mirror microstructure. This may be beneficial for optical as well as other applications. Therefore, a three-layered optical mirror microstructure in accordance with the first aspect should be more rigid or stiffer than a two-layered optical mirror microstructure in accordance with the first aspect. Similarly, a two-layered optical mirror microstructure in accordance with the first aspect should be more rigid or stiffer than a single layer or laminated mirror microstructure.

The first mirror microstructure of the first aspect may also have a desired radius of curvature on its uppermost structural layer. In one embodiment, the radius of curvature of a structurally reinforced structural layer in the first mirror microstructure that provides an optical function in accordance with the first aspect is at least about 1 meter, in another embodiment is at least about 2 meters, and in yet another embodiment is about 14 meters.

A second aspect of the above-described surface micromachined optical system has a mirror microstructure that includes a first structural layer that is spaced from the substrate, a second structural layer that is spaced from the first structural layer away from the substrate, and a plurality of at least generally laterally extending first ribs or rails that also extend between and structurally interconnect the first and second structural layers so as to fix the first structural layer to the second structural layer. Ribs or rails differ from columns in that the ribs or rails have a length dimension that is greater (and typically significantly greater) than their width dimension, in contrast to the types of columns addressed above in relation to the first aspect which do not. As in the case of the first aspect, the first structural layer is disposed between the second structural layer and the substrate, or at a lower elevation or level relative to the substrate than the second structural layer. Relative movement is also allowed between the first mirror microstructure associated with the second aspect and the substrate.

Various refinements exist of the features noted in relation to the second aspect of the present invention. Further features may also be incorporated in the second aspect of the present invention as well. These refinements and additional features may exist individually or in any combination. The surface micromachined optical system of the second aspect may include other microstructures at the same or different elevations or levels relative to the substrate than that which is occupied by the first and/or second structural layers and/or the plurality of first rails of the first mirror microstructure of the second aspect. One or more microstructures or a part thereof may also be disposed directly under the first mirror microstructure such that the same is located directly between the first structural layer and the substrate. There will still be a space between the first structural layer and any underlying structure of the system to allow for relative movement between the first mirror microstructure and the substrate.

Typically the first and second structural layers associated with the second aspect will be vertically aligned such that the second structural layer will be directly above the first structural layer, and further such that their respective centers will be vertically aligned. There may be circumstances where such will not be the case. Appropriate materials for the first and second structural layers, as well as the plurality of first rails, include polysilicon in which case the substrate may be silicon-based. Other materials that are appropriate for surface micromachining operations may be utilized by the second aspect as well and as noted above in relation to the first aspect.

The surface micromachined optical system of the second aspect may then be used for the type of optical applications addressed above in relation to the first aspect. Materials that are used to define the second structural layer may possess sufficient optical properties/characteristics for providing the desired/required optical function. However, it may be desirable to apply an optically reflective layer to the upper surface of the second structural layer to achieve desired optical properties/characteristics for the first mirror microstructure, including those noted above in relation to the first aspect.

As noted above, the plurality of first rails associated with the second aspect are at least generally laterally extending. "At least generally laterally extending" herein, and specifically in the context of the second aspect, means that the plurality of first rails extend at least generally parallel with the substrate. Typically this will be such that the first rails will be disposed at a constant, fixed elevation relative to the first substrate, although such may not necessarily be the case (i.e., the elevation of one or more of the first rails relative to the substrate may change progressing along its length). Various layouts of the plurality of first rails may be utilized. For instance, the plurality of first rails may be disposed: 1) in at least substantially parallel relation; 2) in non-intersecting relation; 3) so as to extend at least toward (and thereby including to) a first point (e.g., each of the first rails may terminate at least substantially equidistantly from this first point; one or more of the first rails may extend closer to the first point than at least one other first rail; at least two of the first rails may intersect at the first point; or any combination thereof); 4) such that at least two of the first rails extend at least toward (and thereby including to) a first point, and such that at least two other first rails extend at least toward (and thereby including to) a second point that is spaced from the first point (i.e., not all first rails need to converge toward the same common point); 5) such that at least two of the first rails intersect; and 6) any combination thereof. Yet another embodiment has multiple groups of the first rails that are in different orientations. For instance, one group of the first rails may all extend in a first direction, and another group of the first rails may all extend in a second direction that is different from the first direction, and including being perpendicular to the first direction to define a waffle-like pattern. Stated another way, the structural interconnection between the first and second structural layers may be in the form of a grid or the like, and the first rails associated with the second aspect may be considered as a part thereof.

Multiple configurations may define the length dimension of the first rails or how the extend within the lateral dimension. For instance, the first rails may be axially or linearly extending in the lateral dimension (i.e., the first rails may extend laterally in axial or linear fashion). The first rails may also extend in non-linear fashion in the lateral dimension as well. One example is where the first rails meander in the lateral dimension, such as sinusoidally or in a "zig-zag" fashion within a plane that is at least generally parallel relation with the substrate.

Other structural layers may be utilized by the first mirror microstructure of the second aspect. For instance, a third structural layer may be spaced from the second structural layer in a manner such that the second structural layer is located between the first and third structural layers, in which case the third structural layer would provide the desired/required optical functionality. Those features addressed above in relation to the optical features/characteristics of the second structural layer could then be utilized by the third structural layer. Structural interconnection of the third structural layer to the second structural layer may be accomplished by a plurality of at least generally laterally extending second ribs or rails that extend between and structurally interconnect the second and third structural layers so as to fix the third structural layer to the second structural layer. The various characteristics/features discussed above in relation to the plurality of first rails are equally applicable to the plurality of second rails. In one embodiment, the plurality of first rails are disposed in a first orientation in the lateral dimension and the plurality of second rails are disposed in a second, different orientation in the lateral dimension. These first and second orientations may be such that the plurality of first rails are disposed in an at least substantially perpendicular orientation to the plurality of second rails.

Increasing the number of spaced, but interconnected layers as a general rule and in accordance with the second aspect is believed to increase the rigidity or stiffness of the first mirror microstructure, which is beneficial in optical applications. Therefore, a three-layered optical mirror microstructure in accordance with the second aspect should be more rigid or stiffer than a two-layered optical mirror microstructure in accordance with the second aspect. Similarly, a two-layered optical mirror microstructure in accordance with the second aspect should be more rigid or stiffer than a single layer or laminated mirror microstructure.

The microstructure of the second aspect may also have a desired radius of curvature on its uppermost structural layer. In one embodiment, the radius of curvature of a structurally reinforced structural layer in the first mirror microstructure in accordance with the second aspect is at least about 1 meter, in another embodiment is at least about 2 meters, and in yet another embodiment is about 14 meters.

A third aspect of the above-described surface micromachined optical system has a mirror microstructure that includes a first structural layer that is spaced from the substrate, a second structural layer that is spaced from the first structural layer away from the substrate, and at least one structural interconnection that extends between and fixedly interconnects the first and second structural layers. An upper surface of the second structural layer has a radius of curvature that is at least about 1 meter, and more typically at least about 2 meters. Therefore, the upper surface of the second structural layer is substantially flat which makes the first mirror microstructure of this third aspect particularly beneficial for various optical applications. The various features discussed above in relation to the first and second aspects may be utilized by this third aspect of the present invention as well, alone or in any combination.

A fourth aspect of the above-described surface micromachined optical system has a mirror microstructure that includes a first structural layer that is spaced from the substrate, and at least one structurally reinforcing member that extends from the first structural layer toward, but not to, the substrate. Each such structural reinforcement member may fixedly attach to an underlying structural layer, although such need not be the case (i.e., the structural reinforcement member(s) of the fourth aspect may be cantilever, or may be of the form of the first mirror microstructures noted above in relation to the first or second aspects). The first structural layer has an upper surface with a radius of curvature that is at least about 1 meter, and more typically at least about 2 meters. Therefore, the upper surface of the first structural layer is substantially flat which makes the first mirror microstructure of this fourth aspect particularly beneficial for use in various optical applications. The various features discussed above in relation to the first and second aspects may be utilized by this fourth aspect of the present invention as well, alone or in any combination.

A fifth aspect of the above-described surface micromachined optical system has a mirror microstructure that includes a first structural layer that is spaced from the substrate, a second structural layer that is spaced from the first structural layer away from the substrate, and at least one structural interconnection that extends between and fixedly interconnects the first and second structural layers. A first structural interconnection that fixes the first structural layer to the second structural layer is positioned to provide a reinforcement ratio of no more than about 0.5. This reinforcement ratio is a ratio of a first distance to a second distance. The first distance is a distance from a center of the second structural layer in the lateral dimension to a portion of the first structural interconnection that is disposed closest to the center of the second structural layer. The second distance is the diameter of the second structural layer. Therefore, the second structural layer is structurally reinforced at least close to (and thereby including at) its center.

A sixth aspect of the above-described surface micromachined optical system has a mirror microstructure that includes a first structural layer that is spaced from the substrate, and at least one structural reinforcing member that extends from the first structural layer toward, but not to, the substrate. Each structural reinforcement member may fixedly attached to an underlying structural layer, although such need not be the case (i.e., the structural reinforcement member(s) of the sixth aspect may be cantilever, or may be of the form of the structures noted above in relation to the first or second aspects). A first structural reinforcement member that extends down from the first structural layer is positioned to provide a reinforcement ratio of no more than about 0.5. This reinforcement ratio is a ratio of a first distance to a second distance. The first distance is a distance from a center of the second structural layer in the lateral dimension to a portion of the first structural reinforcement member that is disposed closest to the center of the second structural layer. The second distance is the diameter of the second structural layer. Therefore, the second structural layer is structurally reinforced at least close to (and thereby including at) its center.

A seventh aspect of the above-described surface micromachined optical system has a mirror microstructure that includes a first structural layer that is spaced from the substrate, a second structural layer that is spaced from the first structural layer away from the substrate, at least one structural interconnection that extends between and fixedly interconnects the first and second structural layers, a third structural layer that is spaced from the second structural layer away from the second structural layer, and at least one structural interconnection that extends between and fixedly interconnects the second and third structural layers. The various features discussed above in relation to the first and second aspects may be used by this seventh aspect as well, alone or in any combination, including using the various reinforcing structures noted above for the structural interconnections between the first and second structural layers, and between the second and third structural layers.

BRIEF DESCRIPTION OF THE SEVERAL VIEWS OF THE DRAWING

FIG. 1C is a bottom view of the surface micromachined optical system of FIG. 1B.

DETAILED DESCRIPTION OF THE INVENTION

Figure 1A:
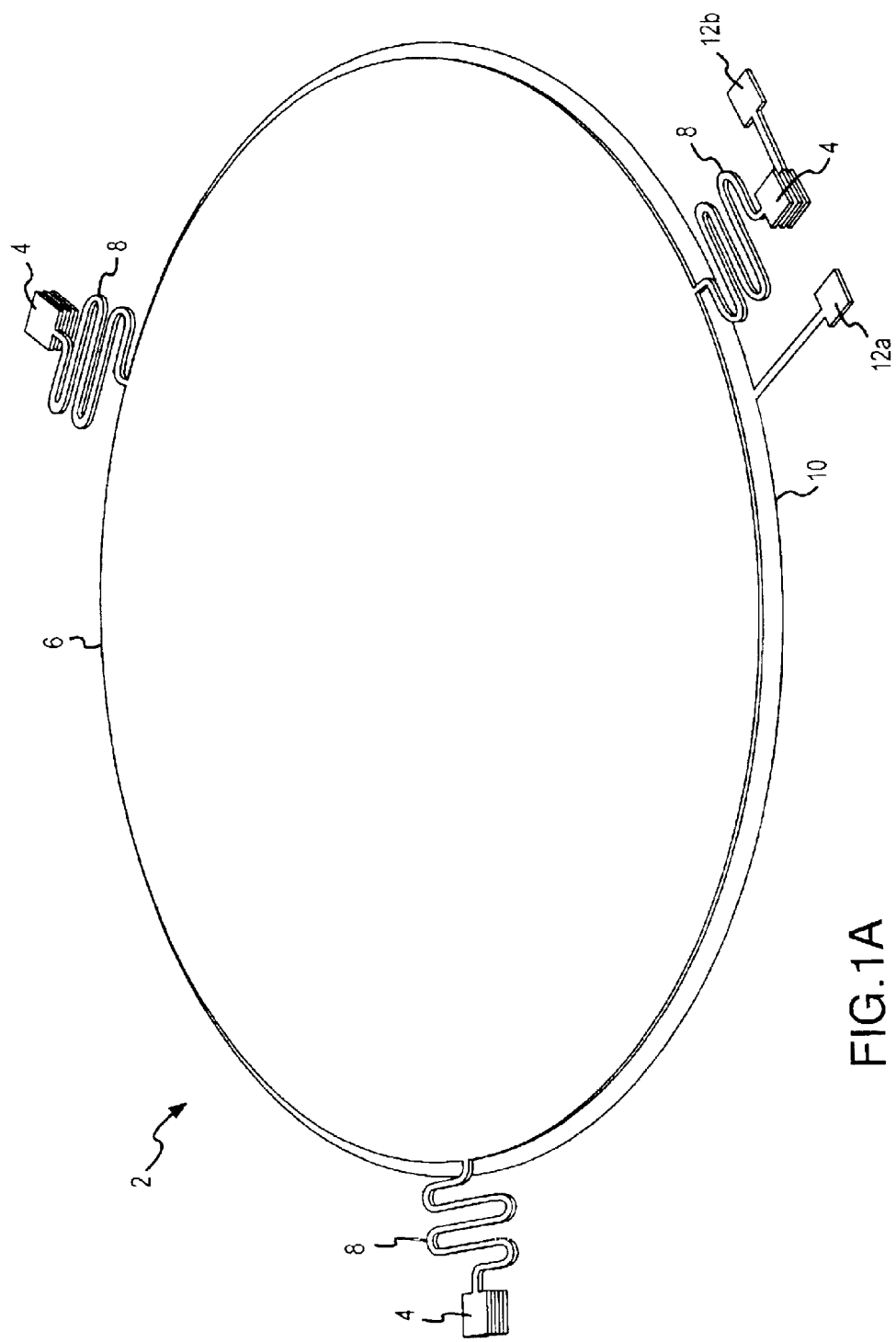
FIG. 1A is a plan view of one embodiment of surface micromachined optical system that includes a movable mirror microstructure.

The present invention will now be described in relation to the accompanying drawings which at least assist in illustrating its various pertinent features. Surface micromachined microstructures and methods of making the same are the general focus of the present invention. Various surface micromachined microstructures and surface micromachining techniques are disclosed in U.S. Pat. No. 5,783,340, issued Jul. 21, 1998, and entitled "METHOD FOR PHOTOLITHOGRAPHIC DEFINITION OF RECESSED FEATURES ON A SEMICONDUCTOR WAFER UTILIZING AUTO-FOCUSING ALIGNMENT"; U.S. Pat. No. 5,798,283, issued Aug. 25, 1998, and entitled "METHOD FOR INTEGRATING MICROELECTROMECHANICAL DEVICES WITH ELECTRONIC CIRCUITRY; U.S. Pat. No. 5,804,084, issued Sep. 8, 1998, and entitled "USE OF CHEMICAL MECHANICAL POLISHING IN MICROMACHINING"; U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED, the entire disclosures of which are incorporated by reference in their entirety herein.

The term "sacrificial layer" as used herein means any layer or portion thereof of any surface micromachined microstructure that is used to fabricate the microstructure, but which does not exist in the final configuration. Exemplary materials for the sacrificial layers described herein include undoped silicon dioxide or silicon oxide, and doped silicon dioxide or silicon oxide ("doped" indicating that additional elemental materials are added to the film during or after deposition). The term "structural layer" as used herein means any other layer or portion thereof of a surface micromachined microstructure other than a sacrificial layer and a substrate on which the microstructure is being fabricated. Exemplary materials for the structural layers described herein include doped or undoped polysilicon and doped or undoped silicon. Exemplary materials for the substrates described herein include silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD) and including evaporative PVD and sputtering PVD, as examples.

In more general terms, surface micromachining can be done with any suitable system of a substrate, sacrificial film(s) or layer(s) and structural film(s) or layer(s). Many substrate materials may be used in surface micromachining operations, although the tendency is to use silicon wafers because of their ubiquitous presence and availability. The substrate is essentially a foundation on which the microstructures are fabricated. This foundation material must be stable to the processes that are being used to define the microstructure(s) and cannot adversely affect the processing of the sacrificial/structural films that are being used to define the microstructure(s). With regard to the sacrificial and structural films, the primary differentiating factor is a selectivity difference between the sacrificial and structural films to the desired/required release etchant(s). This selectivity ratio is preferably several hundred to one or much greater, with an infinite selectivity ratio being preferred. Examples of such a sacrificial film/structural film system include: various silicon oxides/various forms of silicon; poly germanium/poly germanium-silicon; various polymeric films/various metal films (e.g., photoresist/aluminum); various metals/various metals (e.g., aluminum/nickel); polysilicon/silicon carbide; silicone dioxide/polysilicon (i.e., using a different release etchant like potassium hydroxide, for example). Examples of release etchants for silicon dioxide and silicon oxide sacrificial materials are typically hydrofluoric (HF) acid based (e.g., undiluted or concentrated HF acid, which is actually 49 wt % HF acid and 51 wt % water; concentrated HF acid with water; buffered HF acid (HF acid and ammonium fluoride)).

Only those portions of a surface micromachined microstructure that are relevant to the present invention will be described herein. There may and typically will be other layers that are included in a given surface micromachined microstructure, as well as in any system that includes such microstructures. For instance and in the case where the surface micromachined microstructures described herein are utilized as a movable mirror microstructure in a surface micromachined optical system, a dielectric isolation layer will typically be formed directly on an upper surface of the substrate on which such a surface micromachined optical system is to be fabricated, and a structural layer will be formed directly on an upper surface of the dielectric isolation layer. This particular structural layer is typically patterned and utilized for establishing various electrical interconnections for the surface micromachined optical system which is thereafter fabricated thereon.

One embodiment of at least a portion of a surface micromachined optical system 2 is presented in FIG. 1A. The surface micromachined optical system 2 is fabricated on a substrate (not shown) and includes at least one microstructure in the form of a mirror microstructure 6. The surface micromachined optical system 2 may and typically will include multiple mirror microstructures 6 that are disposed/arranged in the form of an array (not shown), although there may be applications where only a single mirror microstructure 6 is required. The mirror microstructure 6 is interconnected with the substrate by a plurality of suspension springs 8. One end of each spring 8 is interconnected with the mirror microstructure 6, while its opposite end is interconnected with a structural support 4 that is in turn interconnected with the substrate (possibly through one or more underlying structural layers, which is the configuration shown in FIG. 1A).

A lower electrode 10 is disposed below the mirror microstructure 6 in spaced relation and is interconnected with the substrate as well. An electrical contact 12a is interconnected with the lower electrode 10, while an electrical contact 12b is interconnected with the mirror microstructure 6. Appropriate voltages may be applied to both of the electrical contacts 12a, 12b to move the mirror microstructure 6 toward or away from the lower electrode 10 (and thereby the substrate) into a desired position to provide an optical function. This movement is typically at least generally perpendicular relative to the lower electrode 10 and the substrate. The mirror microstructure 6 is commonly referred to as a piston mirror based upon the described motion.

Figure 1B:
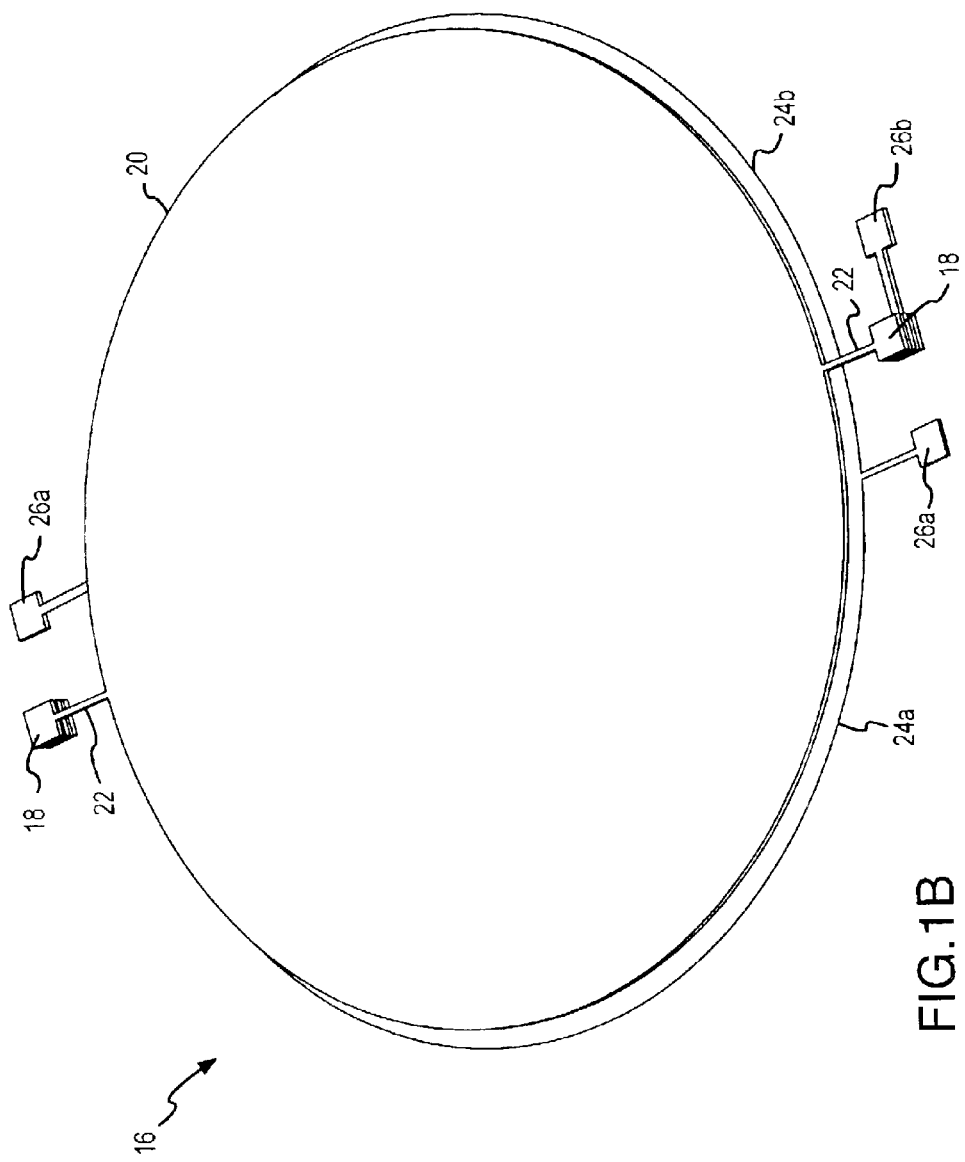
FIG. 1B is a plan view of another embodiment of a surface micromachined optical system that includes a movable mirror microstructure.

Another embodiment of at least a portion of a surface micromachined optical system 16 is presented in FIGS. 1B–C. The surface micromachined optical system 16 is fabricated on a substrate (not shown) and includes at least one microstructure in the form of a mirror microstructure 20. The surface micromachined optical system 16 may and typically will include multiple mirror microstructures 20 that are disposed/arranged in the form of an array (not shown), although there may be applications where only a single mirror microstructure 20 is required. The mirror microstructure 20 is interconnected with the substrate by a pair of suspension springs 22. An imaginary line that extends between the springs 22 defines an axis about which the mirror microstructure 20 may pivot. One end of each spring 22 is interconnected with the mirror microstructure 20, while its opposite end is interconnected with a structural support 18 that is in turn interconnected with the substrate.

A pair of lower electrodes 24 are disposed below the mirror microstructure 20 and are interconnected with the substrate as well. One electrode 24a is associated with one side of the above-noted pivot axis, while the electrode 24b is associated with the opposite side of the above-noted pivot axis. There is one electrical contact 26a electrically interconnected with each lower electrode 24, while there is an electrical contact 26b electrically interconnected with the mirror microstructure 20. Appropriate voltages may be applied to appropriate ones of the contacts 26 to pivot the mirror microstructure 20 about its pivot axis in the desired direction and amount into a desired position to provide an optical function.

Figure 2A:
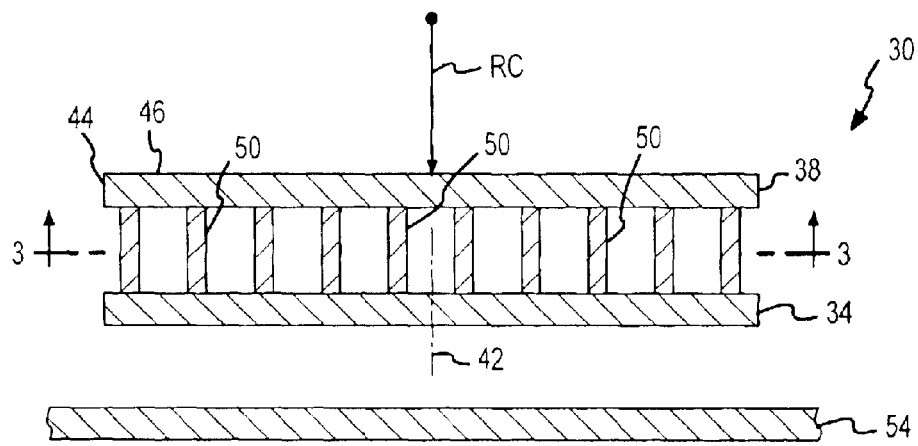
FIG. 2A is a cross-sectional view of one embodiment of a mirror microstructure that may be used in a surface micromachined optical system.
Figure 3:
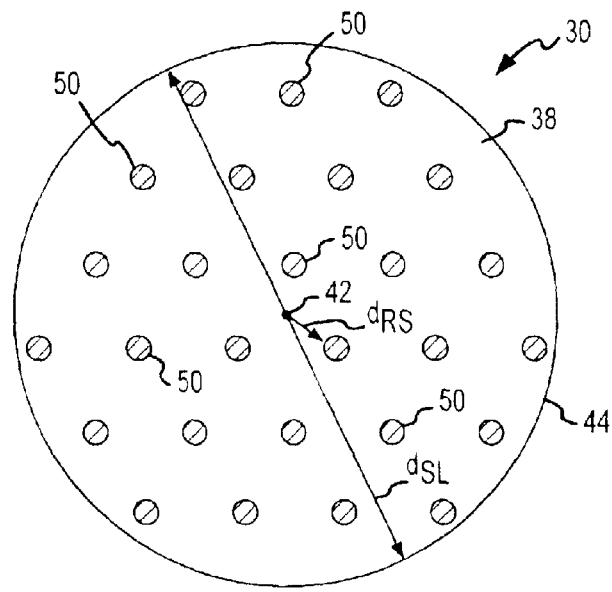
FIG. 3 is a cross-sectional view of the mirror microstructure of FIG. 2A along line 3—3.

Details regarding a particular configuration of a mirror microstructure in a surface micromachined optical system, such as for the mirror microstructures 6 and 20 in the surface micromachined optical systems 2 and 16 of FIGS. 1A and 1B–C, respectively, are presented in FIGS. 2A and 3 in the form of a two-layered mirror microstructure 30. The mirror microstructure 30 is made on an appropriate substrate 54 by surface micromachining techniques. Components of the mirror microstructure 30 include a first structural layer or support 34 that is spaced vertically upward relative to the substrate 54 (e.g., disposed at a higher elevation relative to the substrate 54), a second structural layer or support 38 that is spaced vertically upward relative to the first structural layer 34 (e.g., disposed at a higher elevation relative to the substrate 54), and a plurality of separate and discrete columns or posts 50 that are disposed in spaced relation. The columns 50 extend between and fixedly interconnect the first structural layer 34 and the second structural layer 38 for providing structural reinforcement for the microstructure 30 and, more particularly, the second structural layer 38. The columns 50 may be disposed in either equally spaced relation or the spacing between adjacent columns 50 may vary in at least some manner. Therefore, the second structural layer 38 and first structural layer 34, along with the interconnecting columns 50, may be moved simultaneously if acted upon by any interconnected actuator to provide a desired/required optical function.

Figure 2B:
FIG. 2B is a cross-sectional view of a portion of the mirror microstructure of FIG. 2A with an optical coating thereon.

An upper surface 46 of the second structural layer 38 is or may include an optically reflective layer or film. That is, the materials that are used to define the second structural layer 38 may provide the desired/required optical properties/characteristics for the mirror microstructure 30. More typically a separate layer or film 48 (FIG. 2B) will be deposited on an upper surface 46 of the second structural layer 38 to realize the desired/required optical properties/characteristics. Appropriate materials that may be deposited on the second structural layer 38 for providing the desired/required optical properties include gold, silver, and aluminum for metal coatings. For metals, gold and an associated adhesion layer are preferable to obtain a suitable reflectance.

Depending upon the method of manufacture, a plurality of small etch release holes (not shown) may be formed through the entire vertical extent of the first and/or second structural layer 34, 38 to allow for the removal of any sacrificial layer(s) that is disposed between the first structural layer 34 and the second structural layer 38 of the mirror microstructure 30, and that is disposed between the first structural layer 34 and the substrate 54, respectively, when the mirror microstructure 30 is released from the substrate 54 (i.e., during the fabrication of the mirror microstructure 30). For instance, using the general principles of the manufacturing technique represented in FIGS. 12A–M to define the microstructure 30 would require such etch release holes. It should be appreciated that having etch release holes that extend entirely through the second structural layer 38, and which are thereby exposed on its upper surface 46, may have an adverse effect on its optical performance capabilities. Certain degradations in optical performance may be acceptable in some instances. However, the mirror microstructure 30 also may be made without having any etch release holes that extend down through the second structural layer 38, including in accordance with the methodology represented in FIGS. 17A–G.

Various desirable characteristics of the types of reinforced mirror microstructures described herein are addressed following the discussion of various other embodiments. Certain parameters are used in this summarization. One such parameter is the diameter of the uppermost structural layer in the mirror microstructure, and that is represented by the dimension "$d_{SL}$" ("SL" being an acronym for "structural layer"). "Diameter" does not of course limit this uppermost structural layer to having a circular configuration (in plan view), but is a simply the distance of a straight cord or line that extends laterally from one location on a perimeter of this uppermost structural layer, through a center of this uppermost structural layer, and to another location on the perimeter of this uppermost structural layer. The dimension $d_{SL}$ for the case of the mirror microstructure 30 thereby represents the diameter of the second structural layer 38 (the distance from one location on a perimeter 44 of the second structural layer 38, through a center 42 of the second structural layer 38, and to another location on this perimeter 44).

Another parameter that is used in the summarization of the desirable characteristics of the mirror microstructures disclosed herein is the distance from the center (in the lateral dimension) of the uppermost structural layer in the mirror microstructure to that reinforcing structure (by engaging a lower surface of this uppermost structural layer) which is closest to the center of this uppermost structural layer. This is represented by the dimension "$d_{RS}$" ("RS" being an acronym for "reinforcing structure"). The dimension $d_{RS}$ for the case of the mirror microstructure 30 represents the distance from the center 42 of the second structural layer 38 to that column 50 which is closest to the center 42. A final parameter that is used in the noted summarization is the radius of curvature of the uppermost structural layer in the mirror microstructure (i.e., the amount which this uppermost structural layer is "cupped" or "bulged"). This is represented by the dimension RC. The dimension RC for the case of the mirror microstructure 30 thereby defines the radius of curvature of the second structural layer 38.

Figure 4:
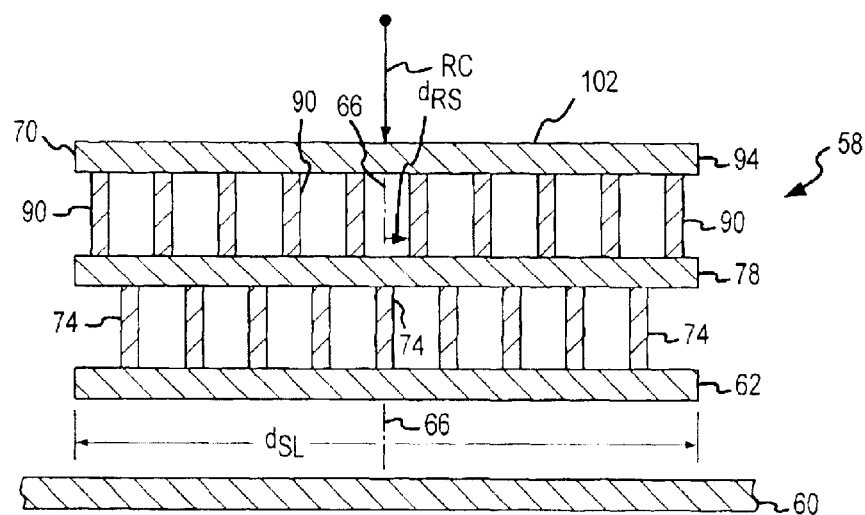
FIG. 4 is a cross-sectional view of another embodiment of a mirror microstructure that may be used in a surface micromachined optical system.

Another configuration of a mirror microstructure for a surface micromachined optical system, such as for the mirror microstructures 6 and 20 in the surface micromachined optical systems 2 and 16 of FIGS. 1A and 1B–C, respectively, is presented in FIG. 4 in the form of a three-layered mirror microstructure 58. The mirror microstructure 58 is fabricated on a substrate 60 by surface micromachining techniques. Components of the mirror microstructure 58 include a first structural layer or support 62 that is spaced vertically upward relative to the substrate 60 (e.g., disposed at a higher elevation than the substrate 60), a second structural layer or support 78 that is spaced vertically upward relative to the first structural layer 62 (e.g., disposed at a higher elevation relative to the substrate 60), a third structural layer or support 94 that is spaced vertically upward relative to the second structural layer 78 (e.g., disposed at a higher elevation relative to the substrate 60), a plurality of separate and discrete first columns or posts 74 that are disposed in spaced relation to each other, and a plurality of separate and discrete second columns or posts 90 that are also disposed in spaced relation to each other. The first columns 74 extend between and fixedly interconnect the first structural layer 62 and the second structural layer 78, while the second columns 90 extend between and fixedly interconnect the second structural layer 78 and the third structural layer 94, all for structurally reinforcing the mirror microstructure 58 and, more particularly, the third structural layer 94. Therefore, the first structural layer 62, the second structural layer 78, the interconnecting columns 74, the third structural layer 94, and the interconnecting columns 90 may be moved simultaneously if acted upon by any interconnected actuator to provide a desired/required optical function.

The first columns 74 may be disposed in either equally spaced relation or the spacing between adjacent columns 74 may vary in at least some manner. The same applies to the columns 90. The plurality of first columns 74 may be offset in relation to the plurality of second columns 90 or such that no first column 74 is axially aligned (in the vertical direction) with any second column 90 as shown. However, other relative positionings between the plurality of first columns 74 and plurality of second columns 90 may be utilized as well, including where one or more of the plurality of first columns 74 is at least partially aligned with a second column 90.

An upper surface 102 of the third structural layer 94 is or includes an optically reflective layer or film. That is, the materials that are used to define the third structural layer 94 may provide the desired/required optical properties/characteristics for the mirror microstructure 58. More typically a separate layer or film will be deposited on the third structural layer 94 to realize the desired/required optical properties/characteristics. Those materials discussed above in relation to the mirror microstructure 30 for this purpose may be utilized by the mirror microstructure 58 and in the general manner illustrated in FIG. 2B.

Depending upon the method of fabrication, a plurality of small release holes (not shown) may be formed through the entire vertical extent of one or more of the first structural layer 62, the second structural layer 78, and the third structural layer 94 to allow for the removal of any underlying and adjacently disposed sacrificial layer(s), or when the mirror microstructure 58 is released from the substrate 60 (i.e., during the fabrication of the mirror microstructure 58). For instance, using the general principles of the manufacturing technique represented in FIGS. 12A–M to define the mirror microstructure 58 would require such etch release holes. It should be appreciated that having etch release holes that extend entirely through the third structural layer 94, and which are thereby exposed on its upper surface 102, may have an effect on its optical performance capabilities. Certain degradations in optical performance may be acceptable in some instances. However, the mirror microstructure 58 also may be made without having any etch release holes that extend down through the third structural layer 94, including in accordance with the methodology represented in FIGS. 17A–G.

Certain parameters are identified on FIG. 4 and that are addressed in the above-noted summarization of certain desirable characteristics that follows below. The dimension "$d_{SL}$" for the case of the mirror microstructure 58 represents the diameter of the third structural layer 94 (e.g., a line that extends laterally from one location on a perimeter 70 of the third structural layer 94, through a center 66 of the third structural layer 94, and to another location on this perimeter 70) that is being structurally reinforced collectively by the plurality of columns 90, the second structural layer 78, the plurality of columns 74, and the first structural layer 62. The dimension "$d_{RS}$" for the case of the mirror microstructure 58 represents the distance from the center 66 of the third structural layer 94 to that column 90 which is closest to the center 66. Finally, RC for the case of the mirror microstructure 58 represents the radius of curvature of the third structural layer 94.

Figure 5:
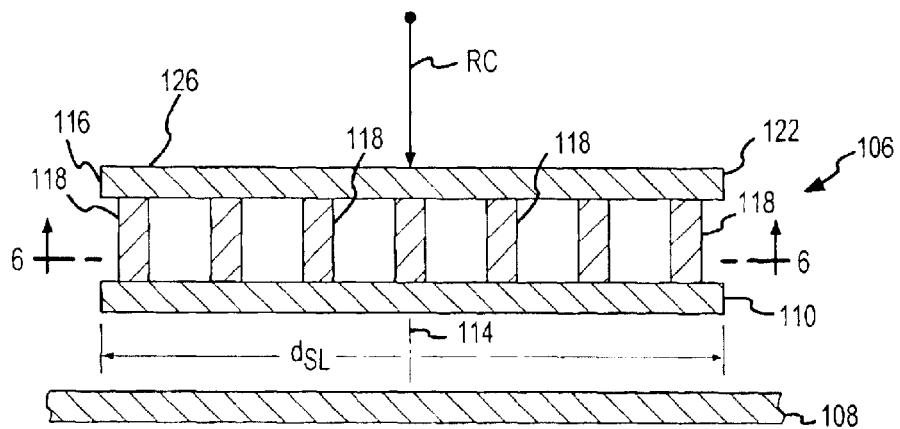
FIG. 5 is a cross-sectional view of another embodiment of a mirror microstructure that may be used in a surface micromachined optical system.
Figure 6:
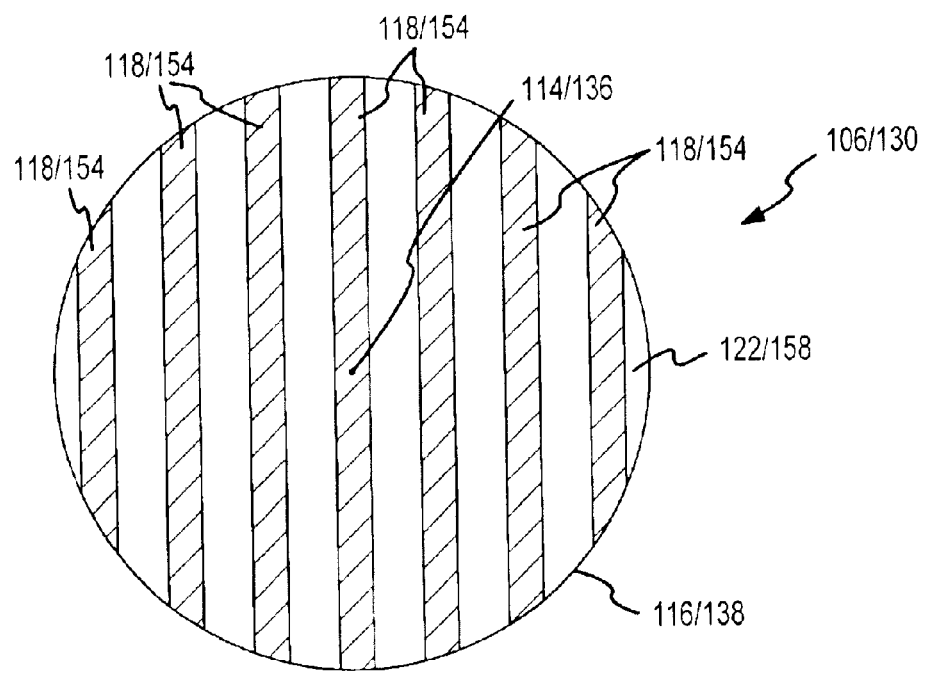
FIG. 6 is a cross-sectional view of the mirror microstructure of FIG. 5 taken along line 6—6, as well as of the mirror microstructure of FIG. 7 taken along line 6—6.

Another configuration of a mirror microstructure for a surface micromachined optical system, such as for the mirror microstructures 6 and 20 in the surface micromachined optical systems 2 and 16 of FIGS. 1A and 1B–C, respectively, is presented in FIGS. 5–6 in the form of a two-layered mirror microstructure 106. The mirror microstructure 106 is fabricated on a substrate 108 by surface micromachining techniques. Components of the mirror microstructure 106 include a first structural layer or support 110 that is spaced vertically upward relative to the substrate 108 (e.g., disposed at a higher elevation relative to the substrate 108), a second structural layer or support 122 that is spaced vertically upward relative to the first structural layer 110 (e.g., disposed at a higher elevation relative to the substrate 108), and a plurality of at least generally laterally extending ribs or rails 118 (i.e., with their length dimension being measured in a lateral dimension or at least generally parallel with the substrate 108). The upper and lower extremes of the rails 118 extend between and fixedly interconnect the first structural layer 110 and the second structural layer 122 to structurally reinforce the mirror microstructure 106 and, more particularly, the second structural layer 122. Therefore, the second structural layer 122 and first structural layer 110, along with the interconnecting rails 118, may be moved simultaneously if acted upon by any interconnected actuator to provide a desired/required optical function.

The rails 118 further extend at least generally laterally from one location on or at least generally proximate to a perimeter 116 of the microstructure 106 (e.g., within 50 μm of the perimeter 116, more preferably within 25 μm of this perimeter 116) to another location on or at least generally proximate to this perimeter 116 (e.g., within 50 μm of the perimeter 116, more preferably within 25 μm of this perimeter 116). In the illustrated embodiment, the rails 118 are of an axial or linear configuration in the lateral dimension, and further are disposed in at least generally parallel and equally spaced relation.

An upper surface 126 of the second structural layer 122 is or includes an optically reflective layer or film. That is, the materials that are used to define the second structural layer 126 may provide the desired/required optical properties/characteristics for the mirror microstructure 106. More typically a separate layer or film will be deposited on the second structural layer 122 to realize the desired/required optical properties/characteristics. Those materials discussed above in relation to the mirror microstructure 30 for this purpose may be utilized by the mirror microstructure 106 and in the general manner illustrated in FIG. 2B.

There are a number of significant advantages in relation to the design utilized by the mirror microstructure 106 of FIGS.

5–6. First is in relation to its optical characteristics. The upper surface 126 of the second structural layer 122 of the mirror microstructure 106 need not and preferably does not include any vertically disposed etch release holes which extend downwardly therethrough in order to allow for the removal of any sacrificial material from between the first structural layer 110 and the second structural layer 122 when the microstructure 106 is released from the substrate 108, which significantly enhances the optical performance capabilities of the mirror microstructure 106 (vertically disposed etch release holes would extend through the first structural layer 110 to remove any sacrificial material between the first structural layer 110 and the substrate 108). That is, preferably the upper surface 126 of the mirror microstructure 106 is continuous and devoid of any indentations, etch release holes, or the like (depressions or indentations that may develop on the upper surface 126 of the second structural layer 122 from the manufacture of the mirror microstructure 106 may be addressed by a planarization operation). Exactly how the mirror microstructure 106 may alleviate the need for the etch release holes in the second structural layer 122 will be discussed in more detail below in relation to the manufacturing methodologies represented in FIGS. 12A–M, 13A–M, 15A–G, and 17A–G. Suffice it to say for present purposes that the rails 118 may at least assist in the definition of a plurality of at least generally laterally extending etch release pipes, channels, or conduits in a sacrificial layer(s) that is disposed between the second structural layer 122 and the first structural layer 110 during the manufacture of the mirror microstructure 106. Any rails described herein that provide this function are characterized as etch release rails or the like. How the rails 118 are oriented relative to each other, or stated another way the layout of the rails 118, may have an effect on their ability to create this plurality of etch release channels or conduits within any sacrificial layer that is disposed between the first structural layer 110 and the second structural layer 122 during the manufacture of the mirror microstructure 106 by surface micromachining techniques. The general design considerations for etch release rails is summarized below following the description of other embodiments of microstructures that include etch release rails.

Another function provided by the plurality of rails 118 is structural reinforcement of the second structural layer 122. That is, the plurality of rails 118 structurally interconnect the second structural layer 122 with the first structural layer 110. The structural reinforcement function of the rails 118 would not be adversely affected, and may in fact improve, by having at least some of the rails 118 be disposed in intersecting relation (e.g., see FIGS. 9A–B).

Certain parameters are identified on one or more of FIGS. 5–6 and that are addressed in the above-noted summarization of desirable characteristics that follows below. The dimension "$d_{SL}$" for the case of the mirror microstructure 106 represents the diameter of the second structural layer 122 (e.g., the distance of a line that extends from one location on the perimeter 116 of the second structural layer 122, through a center 114 of the second structural layer 122, and to another location on this perimeter) that is being structurally reinforced collectively by the plurality of rails 118 and the first structural layer 110. The dimension "$d_{RS}$" for the case of the mirror microstructure 106 represents the distance from the center 114 of the second structural layer 122 to that rail 118 that is closest to the center 114, which is "0" in the illustrated embodiment (FIG. 6) since one of the rails 118 actually extends through the center 114. It should be appreciated that a rail 118 need not extend through the center 114, in which case $d_{RS}$ would have a value greater than "0." Finally, RC for the case of the mirror microstructure 106 represents the radius of curvature of the second structural layer 122.

Figure 8:
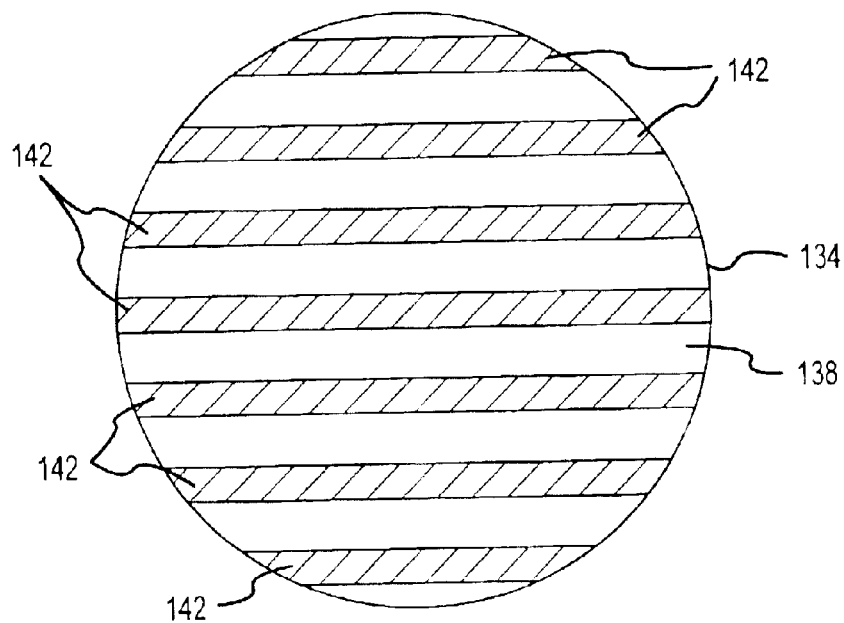
FIG. 8 is a cross-sectional view of the mirror microstructure of FIG. 7 taken along line 8—8.
Figure 7:
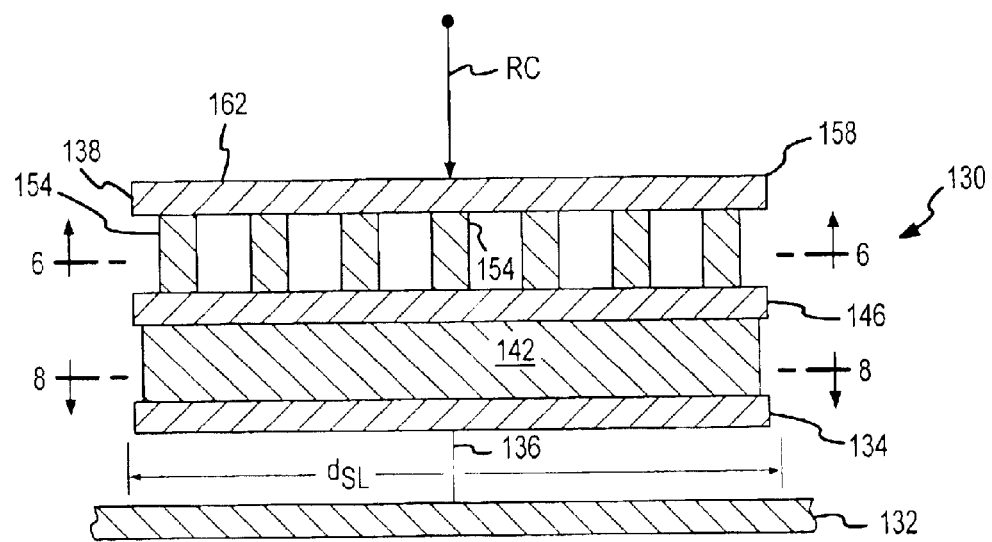
FIG. 7 is a cross-sectional view of another embodiment of a mirror microstructure that may be used in a surface micromachined optical system.

Another configuration of a mirror microstructure for a surface micromachined optical system, such as for the mirror microstructures 6 and 20 in the surface micromachined optical systems 2 and 16 of FIGS. 1A and 1B–C, respectively, is presented in FIGS. 6–8 in the form of a three-layered mirror microstructure 130. The mirror microstructure 130 is fabricated on an appropriate substrate 132 by surface micromachining techniques. Components of the mirror microstructure 130 include a first structural layer or support 134 that is spaced vertically upward relative to the substrate 132 (e.g., disposed at a higher elevation than the substrate 132), a second structural layer or support 146 that is spaced vertically upward relative to the first structural layer 134 (e.g., disposed at a higher elevation relative to the substrate 132), a third structural layer or support 158 that is spaced vertically upward relative to the second structural layer 146 (e.g., disposed at a higher elevation relative to the substrate 132), a plurality of at least generally laterally extending first rails 142, and a plurality of at least generally laterally extending second rails 154. The first rails 142 extend between and fixedly interconnect the first structural layer 134 and the second structural layer 146, while the second rails 154 extend between and fixedly interconnect the second structural layer 146 and the third structural layer 158, all to structurally reinforce the mirror microstructure 130 and, more particularly, the third structural layer 158. Therefore, the first structural layer 134, the second structural layer 146, the interconnecting rails 142, the third structural layer 158, and the interconnecting rails 154 may be moved simultaneously if acted upon by any interconnected actuator to provide a desired/required optical function.

The rails 154 extend at least generally laterally from one location on or at least generally proximate to a perimeter 138 of the third structural layer 158 (e.g., within 50 μm of the perimeter 138, more preferably within 25 μm of this perimeter 138) to another location on or least generally proximate to this perimeter 138 (e.g., within 50 μm of the perimeter 138, more preferably within 25 μm of this perimeter 138). In the illustrated embodiment, the plurality of rails 154 are of an axial or linear configuration in the lateral dimension, and further are disposed in at least generally parallel and equally spaced relation. The plurality of rails 142 are also of an axial or linear configuration in the lateral dimension, and further are disposed in at least generally parallel and equally spaced relation.

An upper surface 162 of the third structural layer 158 is or includes an optically reflective layer or film. That is, the materials that are used to define the third structural layer 158 may provide the desired/required optical properties/characteristics for the mirror microstructure 130. More typically a separate layer or film will be deposited on the third structural layer 158 to realize the desired/required optical properties/characteristics. Those materials discussed above in relation to the mirror microstructure 30 for this purpose may be utilized by the mirror microstructure 130 and in the general manner illustrated in FIG. 2B.

There are a number of significant advantages in relation to the design utilized by the mirror microstructure 130. First is in relation to its optical characteristics. The upper surface 162 of the third support layer 158 of the mirror microstructure 130 need not and preferably does not include any vertically disposed etch release holes in order to allow for the removal of any sacrificial material from between the third structural layer 158 and the second structural layer 146 when the microstructure 130 is released from the substrate 132, which significantly enhances the optical capabilities of the mirror microstructure 130. That is, preferably the upper surface 162 of the mirror microstructure 130 is continuous and devoid of any indentations, holes, or the like (depressions or indentations that may develop on the upper surface 162 of the third support layer 158 during the manufacture the microstructure 130 may be addressed by a planarization operation). Exactly how the mirror microstructure 130 may alleviate the need for any vertically disposed etch release holes in the third structural layer 158 will be discussed in more detail below in relation to the manufacturing methodologies represented in FIGS. 12A–M, 13A–M, 15A–G, and 17A–G. Suffice it to say for present purposes that the rails 154 may at least assist in the definition of a plurality of laterally extending etch release pipes, channels, or conduits in a sacrificial layer(s) that is disposed between the second structural layer 146 and the third structural layer 158 during the manufacture of the mirror microstructure 130. As such, the rails 154 may be characterized as etch release rails as noted above. Again and in this case, how the rails 154 are oriented relative to each other, or stated another way the layout of the rails 154, may have an effect on their ability to create this plurality of etch release channels or conduits within any sacrificial layer that is disposed between the second structural layer 146 and the third structural layer 158 during the manufacture of the mirror microstructure 130 by surface micromachining techniques. The general design considerations for etch release rails again are summarized below following the description of the various embodiments of microstructures that include such etch release rails.

In the event that it would be desirable to avoid the use of etch release holes in the second structural layer 146 to allow for the removal of any sacrificial layer(s) that is disposed between the second structural layer 146 and the first structural layer 134, the characteristics noted above in relation to the rails 154 could be utilized by the rails 142 as well. Etch release holes would likely be required in the first structural layer 134 in order to allow for the removal of any sacrificial layer(s) that is disposed between the first structural layer 134 and the substrate 132 during the release of the microstructure 130 from the substrate 132.

Another function provided by the plurality of first rails 142 and second rails 154 is structural reinforcement of the mirror microstructure 130, and more particularly the third structural layer 158. It is believed that enhanced structural reinforcement is realized by having the plurality of first rails 142 disposed in a different orientation within the lateral dimension than the plurality of second rails 154. In the illustrated embodiment, the plurality of first rails 142 are disposed at least substantially perpendicular to the plurality of second rails 154 in the lateral dimension. The structural reinforcement function of the rails 142 and 154 would not be adversely affected, and may fact improve, by having at least some of the rails 142 be disposed in intersecting in relation and/or by having at least some of the rails 154 be disposed in intersecting relation (e.g., see FIGS. 9A–B).

Certain parameters are identified on one or more of FIGS. 6–8 in relation to the mirror microstructure 130 and that are addressed in the above-noted summarization of desirable characteristics that follows below. The dimension "$d_{SL}$" for the case of the microstructure 130 represents the diameter of the third structural layer 158 (e.g., the distance of a straight line that extends from one location on the perimeter 138 of the third structural layer 158, through a center 136 of the third structural layer 158, and to another location on this perimeter 138) that is being structurally reinforced collectively by the plurality of rails 154, the second structural layer 146, the plurality of rails 142, and the first structural layer 134. The dimension "$d_{RS}$" for the case of the microstructure 130 represents the distance from the center 136 of the third structural layer 158 to that rail 154 that is closest to the center 136, which is "0" in the illustrated embodiment since one of the rails 154 actually extends through the center 136. It should be appreciated that a rail 154 need not extend through the center 136, in which case $d_{RS}$ would have a value greater than "0." Finally, RC for the case of the mirror microstructure 130 represents the radius of curvature of the third structural layer 158.

Figure 9A:
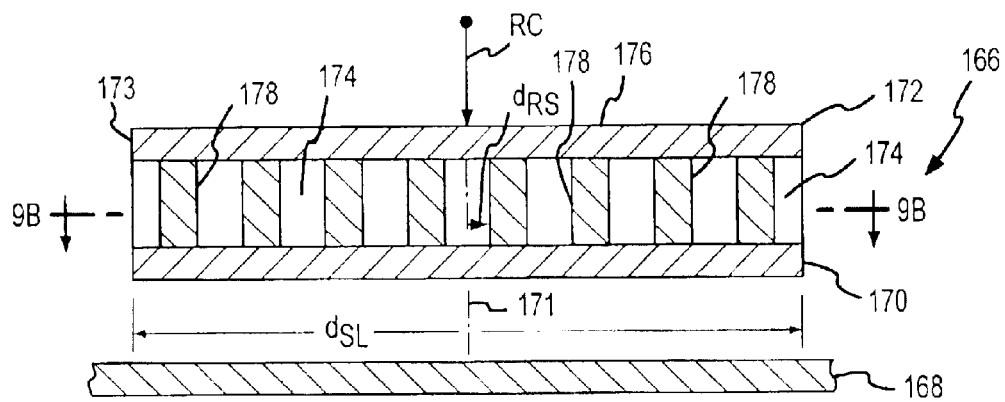
FIG. 9A is a cross-sectional view of another embodiment of a mirror microstructure that may be used in a surface micromachined optical system.
Figure 9B:
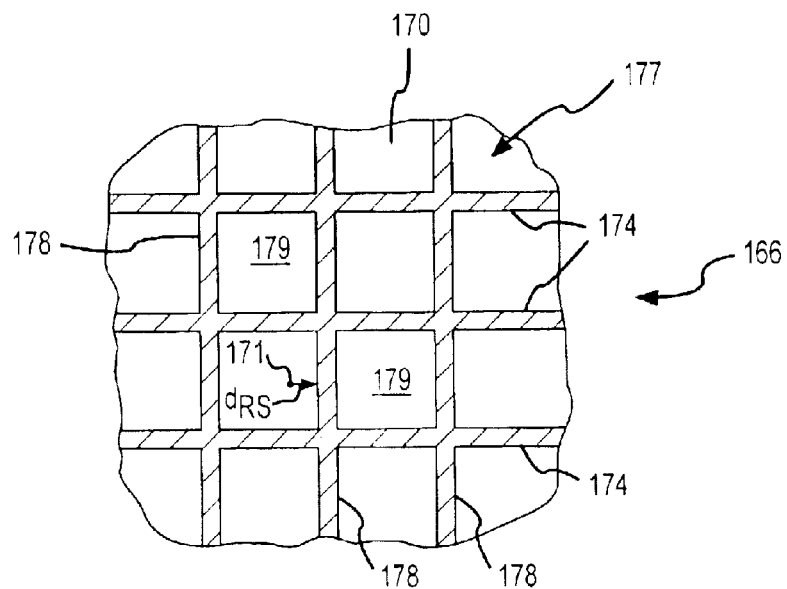
FIG. 9B is a cross-sectional view of the mirror microstructure of FIG. 9A taken along line 9B—9B.

Another configuration of a mirror microstructure for a surface micromachined optical system, such as for the mirror microstructures 6 and 20 in the surface micromachined optical systems 2 and 16 of FIGS. 1A and 1B–C, respectively, is presented in FIGS. 9A–B in the form of a two-layered mirror microstructure 166. The mirror microstructure 166 is fabricated on a substrate 168 by surface micromachining techniques. Components of the mirror microstructure 166 include a first structural layer or support 170 that is spaced vertically upward relative to the substrate 168 (e.g., disposed at a higher elevation relative to the substrate 168), a second structural layer or support 172 that is spaced vertically upward relative to the first structural layer 170 (e.g., disposed at a higher elevation relative to the substrate 168), a plurality of at least generally laterally extending first rails 174 that are disposed in spaced relation, and a plurality of at least generally laterally extending second rails 178 that are also disposed in spaced relation. Both the first rails 174 and the second rails 178 extend between and fixedly interconnect the first structural layer 170 and the second structural layer 172 to structurally reinforce the microstructure 166 and, more particularly, the second structural layer 172. In the illustrated embodiment, the plurality of first rails 174 are disposed in at least substantially parallel and equally spaced relation, as are the plurality of second rails 178. However, the plurality of first rails 174 are not disposed in the same orientation as the plurality of second rails 178 in the lateral dimension. In the illustrated embodiment, the first rails 174 are disposed at least substantially perpendicular to the second rails 178. As such, the first structural layer 170 and second structural layer 172, as well as the interconnecting rails 174, 178, may be moved simultaneously if acted upon by any interconnected actuator to provide a desired/required optical function.

The plurality of first rails 174 and the plurality of second rails 178 will not form the type of etch release channels or conduits in any sacrificial layer that may exist between the first structural layer 170 and the second structural layer 172 during the manufacture of the mirror microstructure 166 using surface micromachining in comparison to the mirror microstructures 106 and 130 discussed above. As such, a plurality of small vertically disposed etch release holes (not shown) will typically extend through the entire vertical extent of the second structural layer 172 to allow for the removal of any sacrificial layer(s) that is disposed between the first structural layer 170 and the second structural layer 172 of the mirror microstructure 166 used in the assembly thereof (a plurality of small vertically disposed etch release holes (not shown) will also typically extend through the entire vertical extent of the first structural layer 170 to allow for the removal of any sacrificial layer(s) that is disposed between the first structural layer 170 and the substrate 168 of the mirror microstructure 166 to release the microstructure 166 from the substrate 168). This again may have an adverse impact on the optical performance capabilities of an upper surface 176 of the second structural layer 172. However, the microstructure 166 still has desirable structural reinforcement characteristics. In this regard, the plurality of first rails 174 and the plurality of second rails 178 may be viewed as defining a grid 177 having a plurality of closed cells 179 (i.e., having a closed boundary). Any appropriate configuration may be used to define the perimeter of these closed cells 179 (e.g., a honeycomb, cylindrical), and each such closed cell 179 need not be of the same configuration.

An upper surface 176 of the second structural layer 172 is or includes an optically reflective layer or film of the type discussed above in relation to the mirror microstructure 30. Due to the likely existence of the plurality of vertically disposed etch release holes in the second structural layer 172, the upper surface 176 will at least have a plurality of dimples or the like which may have an effect on its optical performance capabilities. As such, the principal advantage of the mirror microstructure 166 is the structural reinforcement of the second structural layer 172 that is provided by the plurality of rails 174, 178 that structurally interconnect the second structural layer 172 with the first structural layer 170.

Certain parameters are identified on one or more of FIGS. 9A–B and that are addressed in the above-noted summarization of desirable characteristics that follows below. The dimension "$d_{SL}$" for the case of the microstructure 166 represents the diameter of the second structural layer 172 (e.g., the distance of a straight line that extends from one location on a perimeter 173 of the second structural layer 172, through a center 171 of the second structural layer 172, and to another location on this perimeter 173) that is being structurally reinforced collectively by the plurality of rails 174, the rails, 178, and the first structural layer 170. The dimension "$d_{RS}$" for the case of the microstructure 166 represents the distance from the center 171 of the second structural layer 172 to that portion of the grid 177 that is closest to the center 171. Finally, RC for the case of the microstructure 166 represents the radius of curvature of the second structural layer 172.

Figure 10A:
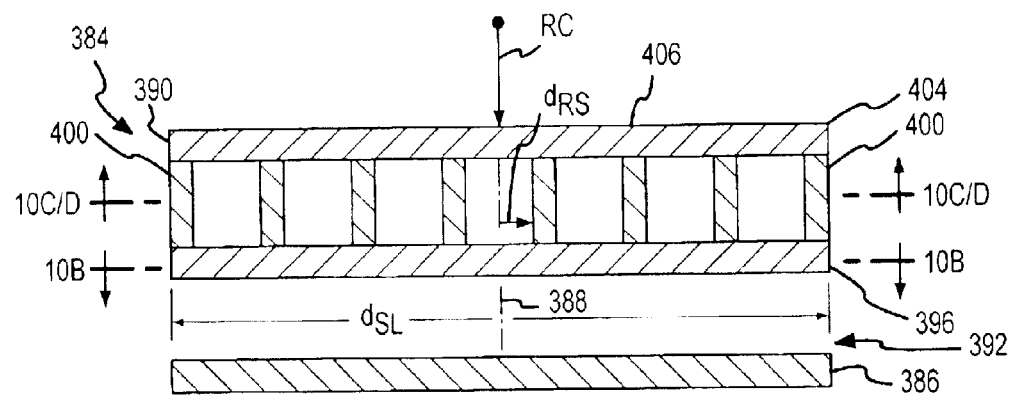
FIG. 10A is a cross-sectional view of another embodiment of a mirror microstructure that may be used in a surface micromachined optical system.
Figure 10B:
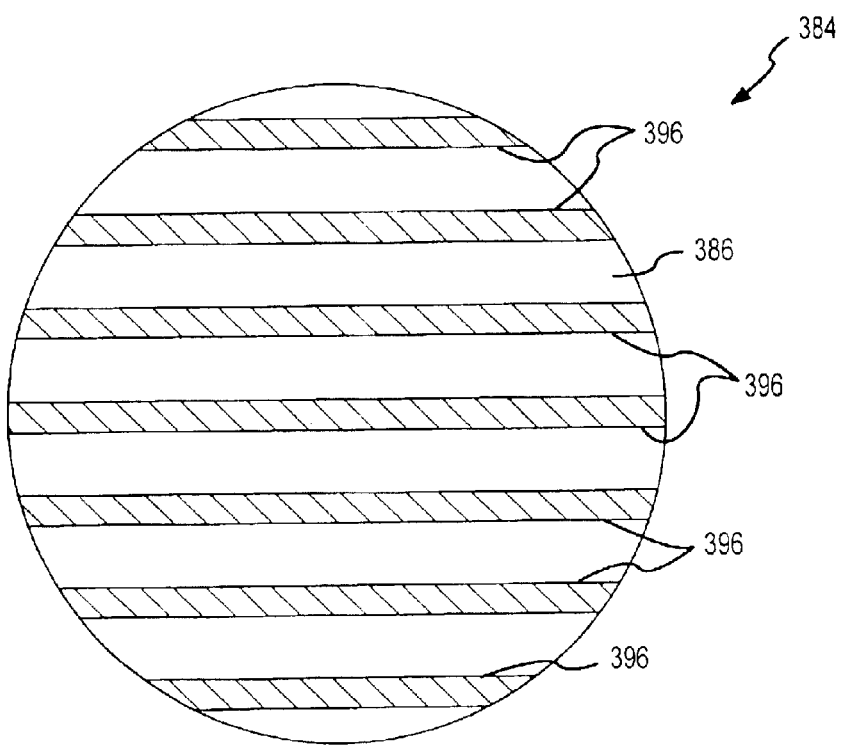
FIG. 10B is a cross-sectional view of the mirror microstructure of FIG. 10A taken along line 10B—10B.
Figure 10D:
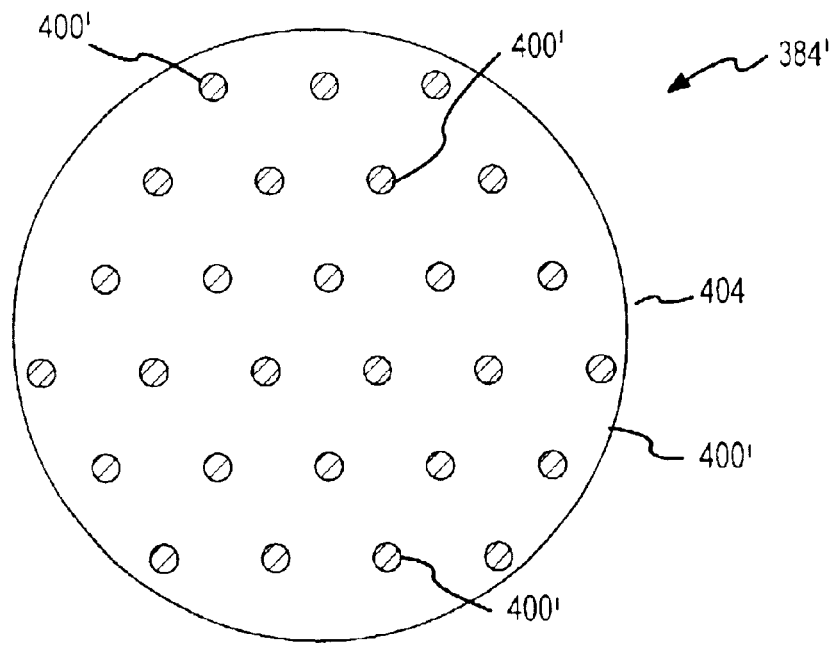
FIG. 10D is a cross-sectional view of a variation of the mirror microstructure of FIG. 10A taken along line 10C/D—10C/D.
Figure 10C:
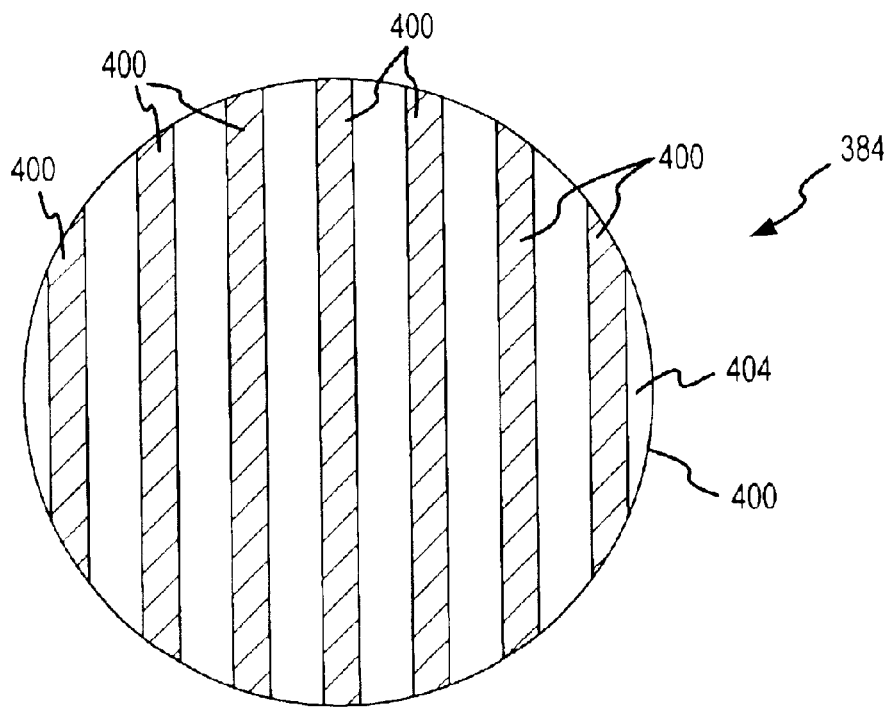
FIG. 10C is a cross-sectional view of the mirror microstructure of FIG. 10A taken along line 10C/D—10C/D.

Another configuration of a mirror microstructure for a surface micromachined optical system, such as for the mirror microstructures 6 and 20 in the surface micromachined optical systems 2 and 16 of FIGS. 1A and 1B–C, respectively, is presented in FIGS. 10A–C in the form of a reinforced, single-layer mirror microstructure 384. The mirror microstructure 384 is fabricated on a substrate 386 by surface micromachining techniques and is separated therefrom by a space 392. Other structural components could be disposed within this space 392, although any such structures would typically be spaced from the mirror microstructure 384 at least when providing its optical function. Components of the mirror microstructure 384 include a structural layer or support 404 that is spaced vertically upward relative to the substrate 386 (e.g., disposed at a higher elevation relative to the substrate 386); a plurality of at least generally laterally extending rails 400 that are fixedly interconnected with the structural layer 404, that extend toward but not to the substrate 386, and that are disposed in a first orientation; and a plurality of at least generally laterally extending rails 396 that are fixedly interconnected with the lower extreme of the rails 400 at a plurality of discrete locations, that extend toward but not to the substrate 386, and that are disposed in a second orientation that is different than the first orientation. In the illustrated embodiment, the rails 400 are disposed at least generally perpendicular to the rails 396, although other relative orientations or relative angular positions could be utilized. Therefore, the structural layer 404, as well as the rails 400 and 396, may be moved simultaneously if acted upon by any interconnected actuator to provide a desired/required optical function.

At least the rails 400, and possibly the rails 396, extend at least generally laterally from one radial location corresponding with or at least generally proximate to a perimeter 390 of the microstructure 384 (e.g., within 50 μm of the perimeter 390, more preferably within 25 μm of this perimeter 390) to another radial location corresponding with or at least generally proximate to this perimeter 390 (e.g., within 50 μm of the perimeter 390, more preferably within 25 μm of this perimeter 390). In the illustrated embodiment, the rails 400 are of an axial or linear configuration in the lateral dimension, and are further disposed in at least generally parallel and equally spaced relation, while the rails 396 are also of an axial or linear configuration in the lateral dimension, and are further disposed in at least generally parallel and equally spaced relation.

An upper surface 406 of the structural layer 404 is or includes an optically reflective layer or film. That is, the materials that are used to define the structural layer 404 may provide the desired/required optical properties/characteristics for the mirror microstructure 384. More typically a separate layer or film will be deposited on the structural layer 404 to realize the desired/required optical properties/characteristics. Those materials discussed above in relation to the mirror microstructure 30 for this purpose may be utilized by the mirror microstructure 384 and in the general manner illustrated in FIG. 2B.

There are a number of significant advantages in relation to the design utilized by the mirror microstructure 384. First is in relation to its optical characteristics. The upper surface 406 of the support layer 404 of the mirror microstructure 384 need not and preferably does not include any vertically disposed etch release holes which extend entirely through the structural layer 404 in order to allow for the removal of any sacrificial material from between the structural layer 404 and the substrate 386 when the microstructure 384 is released from the substrate 386, which significantly enhances the optical performance capabilities of the mirror microstructure 384. That is, preferably the upper surface 406 of the mirror microstructure 384 is continuous and devoid of any indentations, etch release holes, or the like (depressions or indentations that may develop on the upper surface 406 of the structural layer 404 from the manufacture of the mirror microstructure 384 may be addressed by a planarization operation). Exactly how the mirror microstructure 384 may alleviate the need for the etch release holes in the structural layer 404 will be discussed in more detail below in relation to the manufacturing methodologies represented in FIGS. 12A–M, 13A–M, 15A–G, and 17A–G. Suffice it to say for present purposes that the rails 396, the rails 400, or both may at least assist in the definition of a plurality of at least generally extending etch release pipes, channels, or conduits in a sacrificial layer(s) to allow for a more expedient removal of the same and without the need for any conventional etch release holes that extend downwardly entirely through the structural layer 404. As such, the plurality of rails 396 and 404 may both be characterized as etch release rails as noted above. Again and in this case, how the rails 400 are oriented relative to each other and how the rails 396 are oriented relative to each other, or stated another way the layout of the rails 396 and 404, may have an effect on their respective abilities to these etch release conduits within any sacrificial layer that is disposed between the structural layer 404 and the substrate 386 during the manufacture of the mirror microstructure 384 by surface micromachining techniques. The general design considerations for etch release rails again are summarized below following the description of the various embodiments of microstructures that include such etch release rails.

Another function provided by the plurality of rails 400 and the plurality of rails 396 is structural reinforcement of the microstructure 384 and, more particularly the structural layer 404. In the illustrated embodiment, the rails 400 provide enhanced stiffness in effectively one direction and the plurality of rails 396 provide enhanced stiffness in effectively one direction as well, but different from that associated with the rails 400. It is believed that enhanced structural reinforcement is realized by having the plurality of rails 400 disposed in a different orientation within the lateral dimension than the plurality of rails 396. In the illustrated embodiment, the plurality of rails 400 are disposed at least substantially perpendicular to the plurality of rails 396 in the lateral dimension. The structural reinforcement function of the rails 400 and 396 would not be adversely affected, and may in fact improve, by having at least some of the rails 400 be disposed in intersecting in relation and/or by having at least some of the rails 396 be disposed in intersecting relation (e.g., see FIGS. 9A–B).

Certain parameters are identified on one or more of FIGS. 10A–C in relation to the mirror microstructure 384 and that are addressed in the above-noted summarization of the desirable characteristics that follows below. The dimension "$d_{SL}$" for the case of the microstructure 384 represents the diameter of the structural layer 404 (e.g., the distance of a straight line that extends from one location on the perimeter 390 of the structural layer 404, through a center 388 of the structural layer 404, and to another location on this perimeter 390) that is being structurally reinforced collectively by the plurality of rails 400 and the plurality of rails 396. The dimension "$d_{RS}$" for the case of the microstructure 384 represents the distance from the center 388 of the structural layer 404 to that rail 400 that is closest to the center 388. Finally, RC for the case of the mirror microstructure 384 represents the radius of curvature of the structural layer 404.

FIG. 10D presents a variation of the mirror microstructure 384 of FIGS. 10A–C. The only difference between the FIGS. 10A–C and FIG. 10D configurations is that the rails 400 in the FIGS. 10A–C configuration are replaced with a plurality of columns or posts 400' in the FIG. 10D configuration. The FIG. 10D configuration still provides at least some degree of structural reinforcement for the structural layer 404, and also allows for formation of etch release conduits along the length of the rails 396.

Figure 11A:
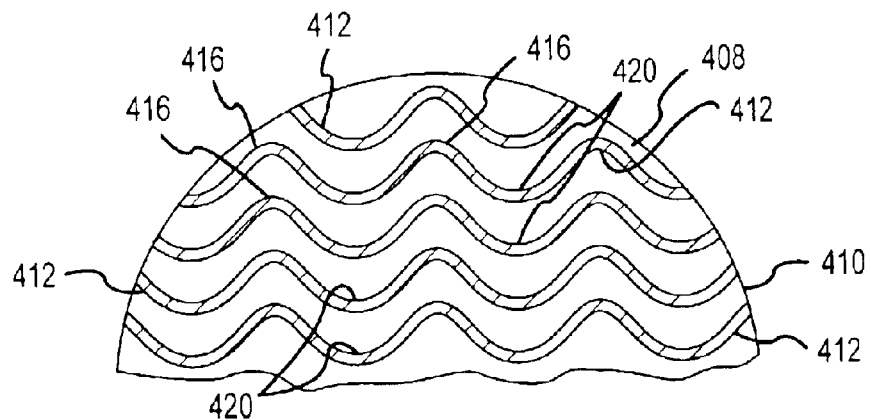
FIG. 11A is a cross-sectional view of another embodiment of a rail layout for structural reinforcement and/or rapid etch release.

Other layouts of rails that provide/allow for the formation of the etch release conduits in a sacrificial layer(s) (i.e., etch release rails), are within the scope of the present invention. Representative examples of other etch release rail layouts that may be appropriate for forming etch release channels and that may be used in any of the above-described embodiments of mirror microstructures are presented in FIGS. 11A–F. FIG. 11A illustrates an embodiment in which a plurality of rails 412 are fixed to and extend away from a structural layer or support 408. These rails 412 may "cantilever" from this structural layer 408, or alternatively may interconnect the structural layer 408 with another structural layer (not shown) to provide a multi-layered mirror microstructure. In any case, the rails 412 have what may be characterized as a sinusoidal lateral dimension or a sinusoidal configuration in plan view, and further extend from one location on or at least generally proximate to a perimeter 410 (e.g., within 50 $\mu$m of this perimeter 410, more preferably within 25 $\mu$m of this perimeter 410) of the structural layer 408 to another location on or at least generally proximate to this perimeter (e.g., within 50 $\mu$m of this perimeter 410, more preferably within 25 $\mu$m of this perimeter 410). Stated another way, the plurality of rails 412 extend sinusoidally within a plane that is at least generally parallel with the substrate 408. In the illustrated embodiment, none of the rails 412 intersect and adjacent rails 412 are nested to a degree such that the peaks 416 of one rail 412 extend at least partially within the space defined by a corresponding trough 420 of the adjacent rail 412. Stated another way, the peaks 416 of one rail 412 preferably extend beyond a line that is tangent to the troughs 420 of an adjacent rail 412. The "amplitude" of this sinusoidal configuration need not remain constant along the length of the rails 412. The rails 412 also may be characterized as "meandering" so as to provide enhanced stiffness in more than one dimension. Other "meandering" configurations than the sinusoidal type illustrated in relation to FIG. 11A may be utilized as well for structural reinforcement and to allow for the formation of etch release channels (e.g., in zig-zag fashion).

Figure 11B:
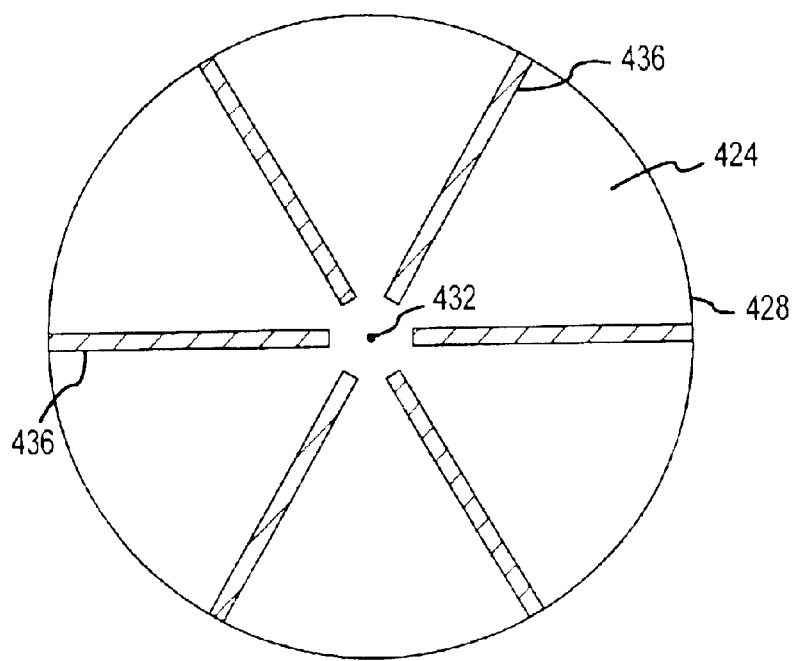
FIG. 11B is a cross-sectional view of another embodiment of a rail layout for structural reinforcement and/or rapid etch release.

FIG. 11B illustrates an embodiment in which a plurality of rails 436 are fixed to and extend away from a structural layer or support 424. These rails 436 may "cantilever" from this structural layer 424, or alternatively may interconnect the structural layer 424 with another structural layer (not shown) to provide a multi-layered mirror microstructure. In any case, instead of being disposed in parallel relation, the plurality of rails 436 are at least generally radially disposed or extending (but still within the lateral dimension). In the illustrated embodiment, the plurality of rails 436 extend from or at least generally proximate to a perimeter 428 (e.g., within 50 $\mu$m of this perimeter 428, more preferably within 25 $\mu$m of this perimeter 428) of the structural layer 424 toward, but not to, a center 432 of the structural layer 424.

Figure 11C:
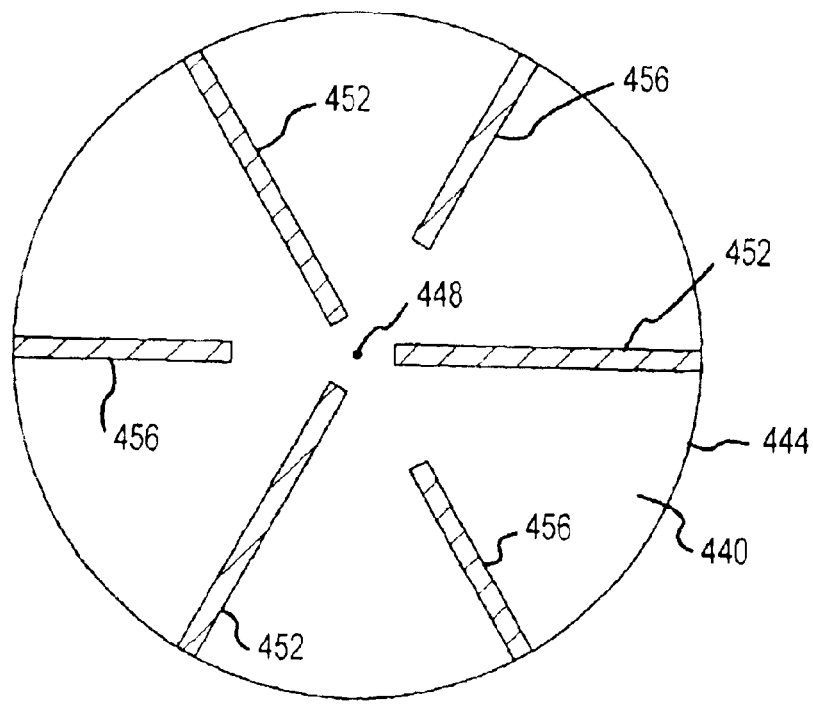
FIG. 11C is a cross-sectional view of another embodiment of a rail layout for structural reinforcement and/or rapid etch release.

FIG. 11C illustrates an embodiment in which a plurality of rails 452, 456 are fixed to and extend away from a structural layer or support 440. These rails 452, 456 may "cantilever" from this structural layer 440, or alternatively may interconnect the structural layer 440 with another structural layer (not shown) to provide a multi-layered mirror microstructure. In any case, instead of being disposed in parallel relation, the plurality of rails 452, 456 are at least generally radially disposed or extending (but still within the lateral dimension). In the illustrated embodiment, the plurality of rails 452, 456 extend from or at least generally proximate to a perimeter 444 (e.g., within 50 $\mu$m of this perimeter 444, more preferably within 25 $\mu$m of this perimeter 444) of the structural layer 440 at least toward a center 448 of the structural layer 440. The rails 452 extend further toward the center 448 than the rails 456. This reduces the potential for adversely affecting the formation of the etch release channels at radially inward locations (i.e., at locations that are closer to the center 448).

Figure 11D:
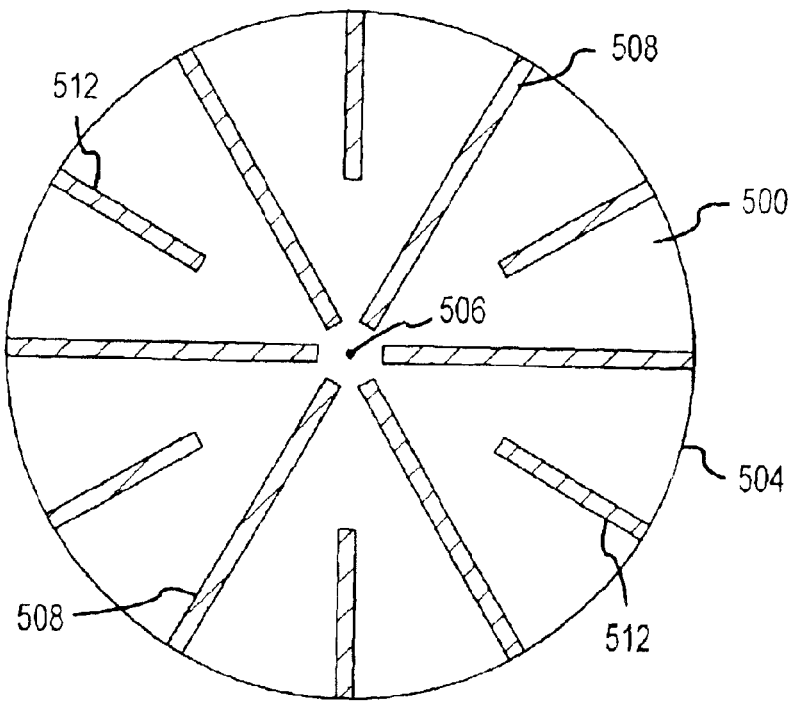
FIG. 11D is a cross-sectional view of another embodiment of a rail layout for structural reinforcement and/or rapid etch release.

FIG. 11D illustrates an embodiment in which a plurality of first rails 508 and a plurality of second rails 512 are fixed to and extend away from a structural layer or support 500. These rails 508, 512 may "cantilever" from this structural layer 500, or alternatively may interconnect the structural layer 500 with another structural layer (not shown) to provide a multi-layered mirror microstructure. In any case, instead of being disposed in parallel relation, the plurality of first rails 508 and the plurality of second rails 512 are at least generally radially disposed or extending (but still within the lateral dimension). In the illustrated embodiment, the plurality of first rails 508 and the plurality of second rails 512 extend from or at least generally proximate to a perimeter 504 (e.g., within 50 μm of this perimeter 504, more preferably within 25 μm of this perimeter 504) of the structural layer 500 toward, but not to, a center 506 of the structural layer 500. Generally, the plurality of first rails 508 extend further toward the center 506 than do the plurality of second rails 512, and at least one second rail 512 is disposed between adjacent pairs of first rails 508.

Figure 11E:
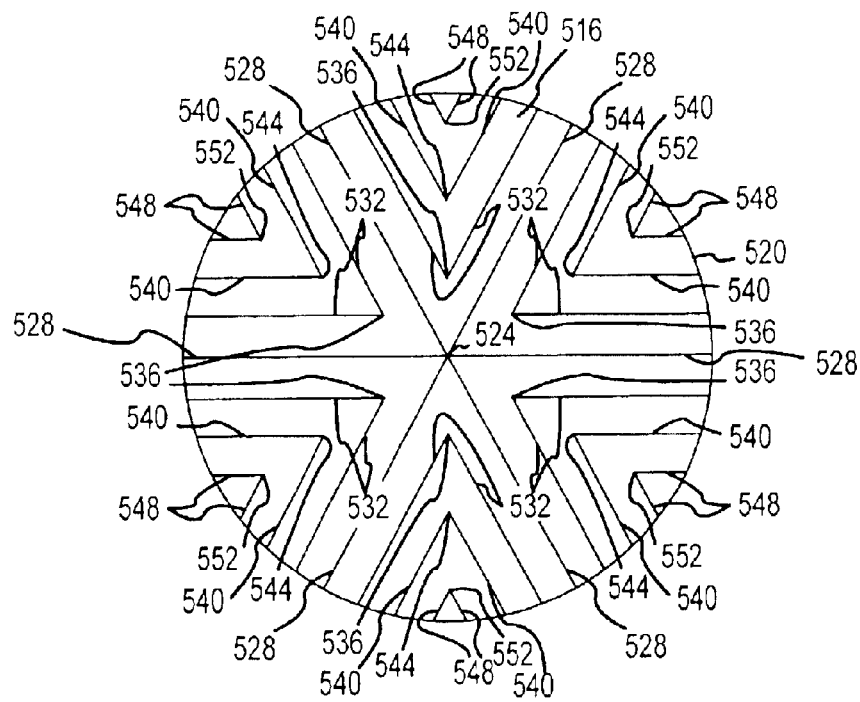
FIG. 11E is a cross-sectional view of another embodiment of a rail layout for structural reinforcement and/or rapid etch release.

FIG. 11E illustrates an embodiment in which a plurality of first rails 528, second rails 532, third rails 540, and fourth rails 548 are fixed to and extend away from a structural layer or support 516. Although these rails 528, 532, 540, and 548 are illustrated as being simply a line in FIG. 11E, it should be appreciated that these rails 528, 532, 540, and 548 may be of any appropriate width. These rails 528, 532, 540, and 548 may "cantilever" from this structural layer 516, or alternatively may interconnect the structural layer 516 with another structural layer (not shown) to provide a multi-layered mirror microstructure. In the illustrated embodiment, all of the rails 528, 532, 540, and 548 are not disposed in parallel relation to each other, and furthermore all of the rails 528, 532, 540, and 548 are not radially disposed or extending within the lateral dimension (i.e., all rails 528, 532, 540, and 548 do not extend toward a point corresponding with a center 524 of the structural layer 516). Instead, in the illustrated embodiment: 1) the plurality of first rails 528 extend from or at least generally proximate to a perimeter 520 (e.g., within 50 μm of this perimeter 520, more preferably within 25 μm of this perimeter 520) of the structural layer 516 to a point corresponding with the center 524 of the structural layer 516—that is, the rails 528 intersect at a point corresponding with the center 524, and effectively define a column or post that is disposed at the center 524; 2) a pair of second rails 532 are disposed between each adjacent pair of first rails 528, and extend from or at least generally proximate to the perimeter 520 (e.g., within 50 μm of this perimeter 520, more preferably within 25 μm of this perimeter 520) of the structural layer 516 to an intersection 536—that is, a pair of second rails 532 that terminate at an intersection 536 are "nested" between each adjacent pair of first rails 528; 3) a pair of third rails 540 are disposed within the space that is inward of each pair of second rails 532 that are joined at an intersection 536, and extend from or at least generally proximate to the perimeter 520 (e.g., within 50 μm of this perimeter 520, more preferably within 25 μm of this perimeter 520) of the structural layer 516 to an intersection 544—that is, a pair of third rails 540 that terminate at an intersection 544 are "nested" between each adjacent pair of second rails 532 that are joined at an intersection 536; and 4) a pair of fourth rails 548 are disposed within the space that is inward of each pair of third rails 540 that are joined at an intersection 544, and extend from or at least generally proximate to the perimeter 520 (e.g., within 50 μm of this perimeter 520, more preferably within 25 μm of this perimeter 520) of the structural layer 516 to an intersection 552—that is, a pair of fourth rails 548 that terminate at an intersection 552 are "nested" between each adjacent pair of third rails 540 that are joined at an intersection 544. Therefore, the layout presented in FIG. 11E has at least some etch release rails that intersect at one common point (e.g., rails 528 that intersect at a point corresponding with the center 524), while other rails intersect at a different common point (e.g., at intersections 536, 544, 552).

Figure 11F:
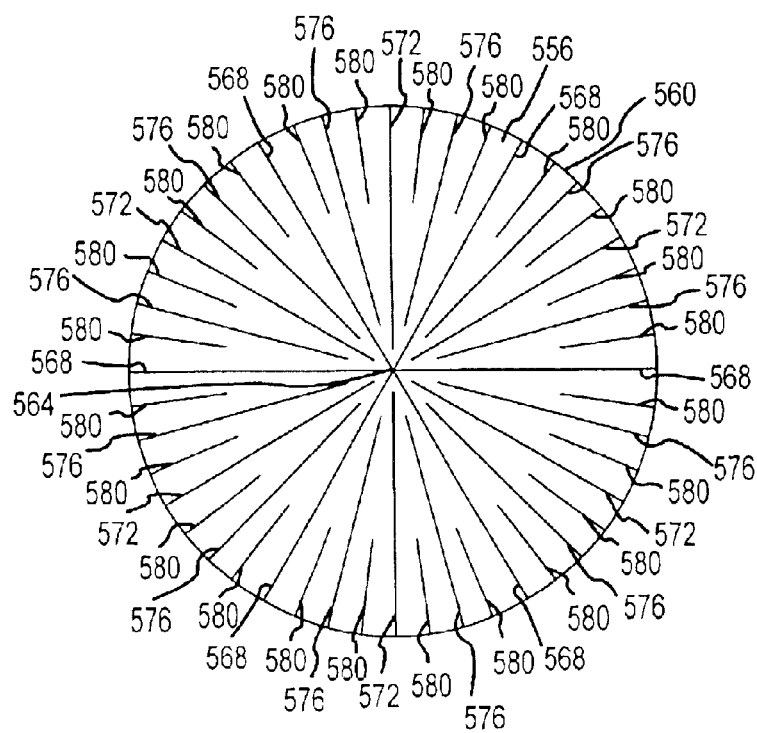
FIG. 11F is a cross-sectional view of another embodiment of a rail layout for structural reinforcement and/or rapid etch release.

FIG. 11F illustrates an embodiment in which a plurality of first rails 568, second rails 572, third rails 576, and fourth rails 580 are fixed to and extend away from a structural layer or support 556. These rails 568, 572, 576, and 580 may "cantilever" from this structural layer 556, or alternatively may interconnect the structural layer 556 with another structural layer (not shown) to provide a multi-layered mirror microstructure. In any case, instead of being disposed in parallel relation, the plurality of rails 568, 572, 576, and 580 are at least generally radially disposed or extending (but still within the lateral dimension). That is, the plurality of rails 568, 572, 576, and 580 extend from or at least generally proximate to a perimeter 560 (e.g., within 50 μm of this perimeter 560, more preferably within 25 μm of this perimeter 560) of the structural layer 556 at least toward a point corresponding with a center 564 of the structural layer 556. Generally, the rails 568, 572, 576, and 580 terminate at different radial positions relative to the center 564 of the structural layer 556. In the illustrated embodiment: 1) the plurality of first rails 568 extend from or at least generally proximate to the perimeter 560 (e.g., within 50 μm of this perimeter 560, more preferably within 25 μm of this perimeter 560) of the structural layer 556 to the center 564 of the structural layer 556—that is, the plurality of first rails 568 intersect at a common point corresponding with the center 564, and effectively define a column or post that is disposed at the center 564; 2) one second rail 572 is disposed between each adjacent pair of first rails 568, and extends from or at least generally proximate to the perimeter 560 (e.g., within 50 μm of this perimeter 560, more preferably within 25 μm of this perimeter 560) of the structural layer 556 toward, but not to, the center 564 of the structural layer 556; 3) one third rail 576 is disposed between each first rail 568 and an adjacent second rail 572, and extends from or at least generally proximate to the perimeter 560 (e.g., within 50 μm of this perimeter 560, more preferably within 25 μm of this perimeter 560) of the structural layer 556 toward, but not to, the center 564 of the structural layer 556; and 4) one fourth rail 580 is disposed between each pair of adjacent rails 568, 572, and 576, and extends from or at least generally proximate to the perimeter 560 (e.g., within 50 μm of this perimeter 560, more preferably within 25 μm of this perimeter 560) of the structural layer 556 toward, but not to, the center 564 of the structural layer 556. The second rails 572 extend further toward the center 564 than the third rails 576, and the third rails 576 extend further toward the center 564 than the fourth rails 580.

Various layouts of etch release rails have been described above. However, it should be appreciated that these layouts are merely representative of the various ways in which etch release rails may be patterned to define a plurality of etch release conduits. Any layout of etch release rails may be utilized that will allow for the removal of one or more sacrificial layers in a desired manner by providing or allowing for the formation of a plurality of at least generally laterally extending etch release conduits or channels within one or more sacrificial layers through which an appropriate etchant may flow during the release of the corresponding microstructure from its substrate. What etch release rail layouts are appropriate for this purpose is based upon a number of factors. Generally, the etchant will proceed at least generally perpendicularly away from its corresponding etch release conduit. At least one and more typically a pair of etch release conduits will extend at least generally along the lateral extent of each etch release rail. A targeted total etch release time will be established or specified. The maximum total etch release time for the types of microstructures described herein is preferably that which does not significantly damage any of the structural layers of the corresponding microstructure by exposure of the same to the etchant. The etch rate will also be known and for design purposes may be assumed to be constant. Therefore, a determination may then be made as to how far from a given etch release conduit the etchant will proceed in the specified total etch release time to create what may be characterized as a projected etch release void. So long as the projected etch release voids between adjacent etch release rails abut or more preferably overlap to a degree, or stated another way such that the entirety of the space between adjacent etch release rails is defined by at least one and more typically a plurality of projected etch release voids, the proposed layout of the etch release rails will be appropriate for affecting the release.

Another way to characterize an appropriate layout of etch release rails is in relation to a maximum desired spacing between adjacentmost etch release rails. Each etch release rail should be positioned such that the maximum space between a given etch release rail and an adjacentmost etch release rail is no more than about twice the linear distance that an etchant will proceed through a sacrificial layer in a specified total etch release time. In one embodiment, this maximum spacing is less than about 100 microns, and in another embodiment is within a range of about 50–75 microns.

Another important factor in relation to the various mirror microstructures discussed above, as well as in relation to the methods and mirror microstructures to be discussed below, is the surface topography of the uppermost structural layer of these mirror microstructures. This is particularly an issue when reinforcing structures extend or depend from the lower surface of this uppermost structural layer. These types of structures are generally formed by first forming a plurality of apertures within a layer of sacrificial material, and then depositing a structural material over this layer of sacrificial material (discussed in more detail below). That portion of the structural material that is deposited within the apertures formed in the layer of sacrificial material defines the reinforcing structures. The surface topography that is desired for the upper surface of the uppermost structural layer of any of the mirror microstructures described herein, as deposited, or stated another way before being planarized, is one where the maximum distance between any peak and valley on the upper surface of this uppermost structural layer is less than the maximum thickness of this uppermost structural layer. This type of surface topography allows the upper surface of the uppermost structural layer to thereafter be planarized a reasonable amount to yield the desired degree of optical flatness.

There are a number of ways in which the desired surface topography can be realized for the case where reinforcing structures extend from the lower surface of the uppermost structural layer of the mirror microstructure. One is to form this uppermost structural layer for the mirror microstructure to a sufficient thickness such that appropriate planarization techniques (e.g., chemical mechanical polishing) may be utilized to reduce the surface roughness of this surface to a desired level without an undesirable amount of thinning of this uppermost structural layer at any location. A sufficient thickness for the uppermost structural layer in this scenario is where the thickness of the uppermost structural layer is thicker than the underlying layer of sacrificial material by an amount such that after being planarized (e.g., by chemical mechanical polishing) to realize the desired optical surface, the uppermost structural lay will still have sufficient mechanical integrity. Another option for the case when the thickness of the uppermost structural layer of the mirror microstructure is comparable to the thickness of the underlying layer of sacrificial material is to control the width of the apertures in this layer of sacrificial material that again are used to define the reinforcing structures that extend or depend from the lower surface of the uppermost structural layer of the mirror microstructure.

The mirror microstructures described herein that structurally reinforce the uppermost structural layer, that have one or more structures extending or depending from the lower surface of the uppermost structural layer for purposes of providing etch release rails, or both, have a desired surface topography on the uppermost structural layer. This may be provided or realized by the sizing of the structures that extend or depend from the lower surface of the uppermost structural layer. Generally, the maximum width of any individual structure that extends or depends from the lower surface of the uppermost structural layer (e.g., the width of a rail, the diameter of a post or column) should be less than twice the thickness of the uppermost structural layer to provide the desired surface topography based solely on the selection of reinforcement structure width. This "thickness of the uppermost structural layer" is that thickness that is disposed above the depending reinforcing structure, or stated another way the thickness at a location that is between any adjacent depending reinforcing structures. This provides a desirable surface topography for the uppermost structural layer, namely one that may be planarized (e.g., by chemical mechanical polishing) a reasonable amount to yield a desired degree of optical flatness while allowing the uppermost structural layer to retain sufficient mechanical integrity. These same principles may be applied to any underlying structural layer of the mirror microstructure as well to improve the surface topography. It should be noted that the maximum width of the reinforcing structures that extend or depend from the lower surface of the uppermost structural layer becomes less important as the ratio of the thickness of the uppermost structural layer to the thickness of the underlying sacrificial layer increases. Therefore, some combination of structural layer thickness and reinforcement structure width may provide the noted desired surface topography as well.

The various reinforcing structures discussed above may be used at any level within a mirror microstructure. That is, even though a particular reinforcing structure may have only been described herein in relation to a two-layered structure does not mean that the same could not be used to structurally reinforce a single structural layer of a mirror microstructure (i.e., so as to cantilever from the same) or to structurally interconnect adjacent but spaced structural layers in a mirror microstructure having three or more spaced structural layers. Moreover, any combination of the above-noted reinforcing structures may be used in any combination in a microstructure having three or more spaced structural layers (e.g., to interconnect any two adjacent but spaced structural layers), or may cantilever from a lower surface of a structural layer to structurally reinforce the same in the general manner, for instance, of the microstructure 302 to be discussed below in relation to the methodology of FIGS. 15A–G.

The above-noted reinforcing structures may also utilize any appropriate vertical and/or horizontal cross-sectional profiles/configurations, and further may extend in the lateral dimension in any appropriate manner (e.g., axially, sinusoidally, meandering, "zig-zagging"). Although the above-noted reinforcing structures have been illustrated as being at least generally perpendicular to an interconnected structural layer(s), such need not be the case. Moreover, all reinforcing structures need not necessarily be disposed in the same vertical orientation (i.e., the same may be disposed at one or more different angles relative to vertical).

It should be appreciated that the mirror microstructures 30, 58, 106, 130, 166, 384, and 384' discussed above may be incorporated into any surface micromachined system and at any elevation within such a system, and that these microstructures 30, 58, 106, 130, 166, 384, and 384' may be appropriate for applications other than as a mirror. Characterizing the various structural layers in these microstructures 30, 58, 106, 130, 166, 384, and 384' as "first," "second" and the like also does not necessarily mean that these are the first, second, or the like structural layers that are deposited over the associated substrate, although such may be the case. It should also be appreciated that the characterization of the various structural layers of these microstructures 30, 58, 106, 130, 166, 384, and 384' as "first," "second," and the like also does not mean that the same must be "adjacent" structural layers in any surface micromachined system that includes these microstructures 30, 58, 106, 130, 166, 384, and 384'. There may be one or more intermediate structural layers that are deposited over the associated substrate at an elevation that is between what has been characterized as "first" and "second" structural layers or the like, although any such structural layers will have been removed from the area occupied by the microstructures 30, 58, 106, 130, 166, 384, and 384' (e.g., there may be one or more of structural layers that are "off to the side" or laterally disposed relative to a given microstructure for various purposes). It should also be appreciated that the various structural layers of the noted microstructures 30, 58, 106, 130, 166, 384, and 384' may also be defined by one or more structural layers, such as involving multiple and spaced in time depositions.

One key advantage of the microstructures 30, 58, 106, 130, 166, 384, and 384' discussed above is their structurally reinforced nature. Some of these reinforcement alternatives may require etch release holes through one or more of the various structural layers depending upon the particular manufacturing technique that is employed, which may degrade the performance of the microstructures 30, 58, 106, 130, 166, 384, and 384' in a given application (e.g., when functioning as a mirror in an optical system, and where etch release holes are required for the uppermost structural layer because of the reinforcement structure that was utilized). A certain amount of degradation may be acceptable based upon the enhanced structural rigidity realized by these microstructures, and in certain applications the existence of the noted etch release holes may be irrelevant or at least of reduced significance. However, certain of the reinforcement structures utilized by the above-noted microstructures may actually enhance the release of the microstructure from the associated substrate and altogether alleviate the need for vertically disposed etch release holes in one or more structural layers. These techniques will be discussed in more detail below in relation to FIGS. 12–15, 17, and 20.

The above-described structurally reinforced mirror microstructures will typically have a minimum surface area of about 2,000 $\mu m^2$ with a minimum lateral dimension of about 50 $\mu m$ for the optically functional surface of the mirror microstructure (e.g., in the case of a circular mirror microstructure, this minimum lateral dimension would be its diameter; in the case of a square mirror microstructure, this minimum lateral dimension would be the length of any of its four sides; in the case of a rectangular mirror microstructure, this minimum lateral dimension would be the length of the shortest of its four sides). Moreover, the above-described structurally reinforced mirror microstructures will utilize a structural layer with the optically functional surface that has a maximum film thickness of about 10 $\mu m$ in one embodiment, and more typically about 6 $\mu m$ in another embodiment. This "maximum film thickness" does not include the thickness of any reinforcement structure that extends or depends from a lower surface of the relevant structural layer.

The actual amount by which the above-noted microstructures are structurally reinforced is affected by one or more characteristics of the reinforcing structures that are used. There may be two extremes in relation to the number or density of reinforcing structures that are used. The first is having a high density for the individual reinforcing structures, which is limited only by the design rules and minimum dimensions of the process technology, as well as the ability to insure that the etchant for the release can adequately access the sacrificial films for their removal. The second extreme is to go to a very sparse or low density for the reinforcing structures, which gets to the point of doing limited reinforcing or stiffening of the associated structural layer(s). The benefit of the former is to provide a maximum effect of reinforcement or stiffening of the associated structural layer(s) or microstructure, but at the expense of density and therefore total mass of the microstructure (i.e., in the case where the microstructure is a mirror, the microstructure may be very stiff, but too massive to allow for the use or realization of rapid switching speeds). Therefore, the optimum spacing and size of the reinforcing structures will oftentimes be an engineering compromise between stiffness and mass. If total mass does not matter, but stiffness is at a premium, then using a high density for the reinforcing structures, as allowed by the design and processed rules, would be optimum for the particular application. However, if the microstructure is a mirror or some other structure which must switch or otherwise move at a relatively fast rate (e.g., in sub-millisecond times), then a calculation of total mass versus available actuation forces will likely determine the appropriate density for the reinforcing structures. Mass may also be an issue for those microstructures that are moved in relation to the physical size of any associated actuator, the amount of voltage required to accomplish the desired movement, or both.

There are a number of ways in which the microstructures 30, 58, 106, 130, 166, 384, and 384' may be at least generally characterized. One or more of the microstructures 30, 58, 106, 130, 166, 384, and 384' may be characterized as including: 1) at least two separate and distinct (i.e., not interconnected and disposed in spaced relation) reinforcing structures (e.g., at least two separate and discrete columns or posts; at least two separate and discrete rails); 2) at least two separate and distinct reinforcing structures that are disposed at different and radially spaced locations or positions in the lateral dimension, or at least two different portions of what may be characterized as a single reinforcing structure (e.g., the "grid" defined by the rails 174 and rails 178 in the microstructure 166 of FIGS. 9A–B) being disposed at different and radially spaced locations or positions in this lateral dimension; 3) having a ratio of $d_{RS}/d_{SL}$ that is no more than about 0.5, and thereby including a ratio of "0", for instance where $d_{RS}$ is "0" (i.e., where there is a reinforcing structure at the center of the structural layer being structurally reinforced); or 4) or any combination thereof. Visualization of the second noted characterization may be enhanced by a reference to the FIGS. 2–3 embodiment where at least some of the plurality of columns 50 of the microstructure 30 are clearly disposed at a different distance from a center 42 of the microstructure 30, as well as the FIGS. 9A–B embodiment where at least some of the rails 174 and at least some of the rails 178 are disposed at different radial positions and are in spaced relation.

Another way of characterizing the microstructures 30, 58, 106, 130, 166, 384, and 384' is in relation to a radius of curvature RC of the uppermost structural layer (e.g., the amount by which the uppermost structural layer is "bowed" or "dished"). The radius of curvature RC may have its center on either side of the uppermost structural layer in the microstructures 30, 58, 106, 130, 166, 384, and 384'. That is, the upper surface of the uppermost structural layer in the microstructures 30, 58, 106, 130, 166, 384, and 384' may be generally concave or generally convex. In one embodiment, the uppermost structural layer of the microstructures 30, 58, 106, 130, 166, 384, and 384' has a radius of curvature RC that is at least about 1 meter, and in another embodiment that is at least about 2 meters. The reinforcement configuration used by the microstructure 166 in a three-layered mirror microstructure has been fabricated with a radius of curvature RC that is about 14 meters. It should be noted that increasing the stiffness of a microstructure does not in and of itself mean that the radius of curvature of an uppermost structural layer of this microstructure will in turn be increased. That is, the case of a constant stress gradient through a plate or a beam leads to the same radius of curvature independent of thickness to first order. This then indicates that simple stiffening by adding thickness to a plate or a beam does not, in and of itself, necessarily lead to a flatter structure with a greater radius of curvature. However, the complex method of reinforcing microstructures in the manner disclosed herein can lead to significant internal stress compensation between and within the individual structural layers of these reinforced microstructures, such that greater flatness (i.e., a larger radius of curvature for the uppermost structural layer) can be realized in addition to achieving greater stiffness.

Another characterization that can be made in relation to the microstructures 30, 58, 106, 130, 166, 384, and 384' is the effect of the various reinforcing structures/layouts on overall structural stiffness of the microstructures 30, 58, 106, 130, 166 384, and 384', which can be characterized by moment of inertia. In very general terms, the moment of inertia for a simple rectangular cross-section is $I=bh^3/12$, where h is the plate thickness and b the width. This illustrates the general idea or concept that structural stiffness is a cubic function of the corresponding thickness. Thus, going from a 2.25 µm thick single structural layer to an approximately 11.0 µm multi-layered, structurally reinforced microstructure of the type contemplated by the microstructures 30, 58, 106, 130, 166, 384, and 384' implies an approximate increase of stiffness by a factor of $11^3/2.25^3=117$, or roughly two orders of magnitude (with the orders by 10-based). This is important when there is a need for a structure to not deform out of plane, or in the case of a mirror microstructure that is coated with a reflective gold layer to not be deformed by the stress in the gold layer. In other words, because of thermal mismatch for example, the gold can be in relative tension to the underlying structural layer (e.g., polysilicon), and thus would have the tendency to cause the underlying structural layer to curl into a cup shape. The dramatic increase in stiffness by reinforcement will keep the mirror microstructure much flatter. Also, during temperature cycles, the gold-coated plate will not change its RC as much (i.e., it will be much more mechanically stable). The overall complexity of the geometry and the deposition and anneal precludes a simple 'estimate' of the resulting RC especially at the current levels being obtained. Empirical determination is less time consuming and more accurate.

Investigations are still being undertaken in relation to evaluating the structural reinforcement of the microstructures 30, 58, 106, 130, 166, 384, and 384'. Generally, it is believed that a structurally reinforced three-layered microstructure will be more rigid than a structurally reinforced two-layered microstructure. In this case, any combination of the above-noted reinforcing structures that structurally interconnect adjacent structural layers in the microstructures 30, 58, 106, 130, 166, 384, and 384' may be utilized in a three-layered microstructure in accordance with one or more principles of the present invention. However, evaluations are still ongoing in relation to "optimizing" the structural reinforcement of the microstructures 30, 58, 106, 130, 166, 384, and 384' in the general manner described herein. There may be instances where different combinations of the above-noted reinforcing structures may be more appropriate for when the associated microstructure is used in a given application or in certain conditions.

Various microstructure fabrication methods will now be described. Each of the various fabrication methods to be discussed that utilize reinforcement/etch release rails may also use the above-noted guidelines for maximum reinforcement structure widths to realize the desired surface topography for the uppermost structural layer prior to planarizing the same. Each of the various fabrication methods to be discussed which define etch release conduits should be implemented such that at least one end of at least one etch release conduit is disposed at or at least generally proximate to a perimeter of the microstructure being fabricated (e.g., within 50 microns of this perimeter in one embodiment, and more preferably within 25 microns of this perimeter in another embodiment). This again reduces the amount of time that the release etchant must "etch in" from this perimeter before reaching the etch release conduit(s), and thereby allows the release to be finished within a desired amount of time. Multiple ends of etch release conduits or etch release conduit accesses are preferably disposed at this radial position. It should be noted that sacrificial material is disposed about the perimeter of the microstructures that are fabricated in accordance with the following. Therefore, absent a preformed via or the like, the release etchant must first etch down to the level(s) at which the etch release conduits are disposed. However, the time required for the release etchant to go down to the level(s) of the etch release conduits is not that significant due to the rather minimal vertical distance which these microstructures extend above their corresponding substrate.

One method for making a microstructure is illustrated in FIGS. 12A–M. This methodology may be utilized to make the mirror microstructure 106 of FIGS. 5–6, and the principles of this methodology may be utilized in/adapted for the manufacture of the mirror microstructure 130 of FIG. 7, the mirror microstructure 384 of FIGS. 10A–C, and the mirror microstructure 384' of FIG. 10D, as well as the variations therefore that are presented in FIGS. 11A–F. In addition to being able to form a desired reinforcing structure, the methodology of FIGS. 12A–M further provides a desired manner for releasing the microstructure at the end of processing by forming a plurality of at least generally laterally extending etch release conduits in one or more of its sacrificial layers to facilitate the removal thereof to provide the releasing function.

Figure 12A:
FIGS. 12A–M are sequential views of one embodiment for making one embodiment of a microstructure for a surface micromachined system.
Figure 12B:
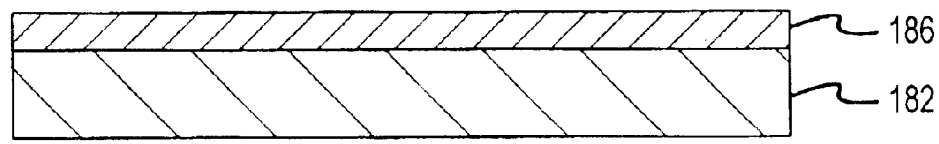
Figure 12C:
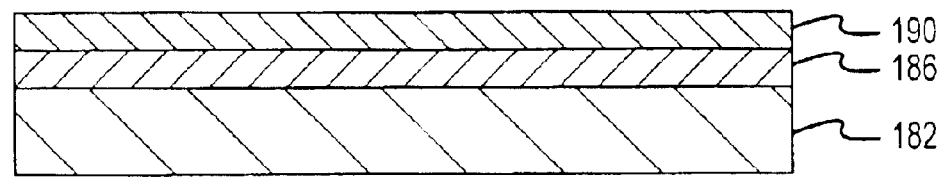
Figure 12D:
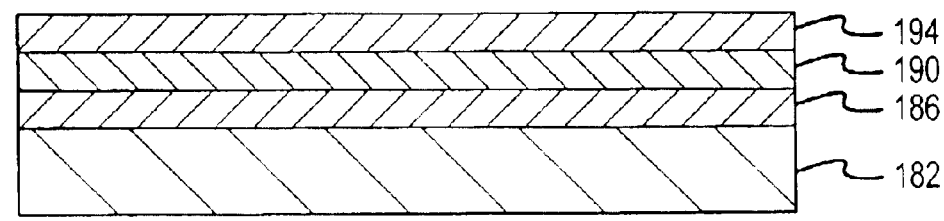
Figure 12E:
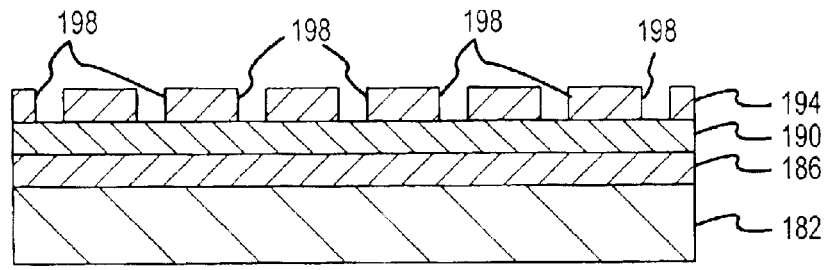

FIG. 12A illustrates a substrate 182 on which a microstructure 180 (FIG. 12M) will be fabricated by surface micromachining techniques. Multiple layers are first sequentially deposited/formed over the substrate 182. A first sacrificial layer 186 is deposited over the substrate 182 as illustrated in FIG. 12B, a first structural layer 190 is deposited on the first sacrificial 186 as illustrated in FIG. 12C, and a second sacrificial layer 194 is deposited on the first structural layer 190 as illustrated in FIG. 12D. The second sacrificial layer 194 is then patterned to define a plurality of interconnect apertures 198 as illustrated in FIG. 12E. These interconnect apertures 198 at a minimum allow for establishing a structural connection with the first structural layer 190, and may be in the form of at least generally laterally extending grooves or trenches (e.g., to define a plurality of rails or at least the lower portion thereof, such as the type utilized by the mirror microstructure 106 of FIG. 5, the mirror microstructure 130 of FIG. 7, and the mirror microstructure 384 of FIG. 10A, as well as the variations therefore illustrated in FIGS. 11A–F). These interconnect apertures 198 could also be in the form of a plurality of separate and discrete holes that are disposed in spaced relation to define a plurality of posts or columns that would structurally interconnect with the underlying first structural layer 190 (e.g., similar to the manner in which the columns 50 interconnect with the underlying first structural layer 34 in the case of the mirror microstructure 30 of FIG. 2A). Using the methodology of FIGS. 12A–M to make the mirror microstructure 384 of FIGS. 10A–C or the mirror microstructure 384' of FIG. 10D would not require this type of a patterning of the second sacrificial layer 194 to define the plurality of interconnect apertures 198, since the rails 396 of the microstructure 384/384' do not interconnect with any underlying structural layer.

Figure 12F:
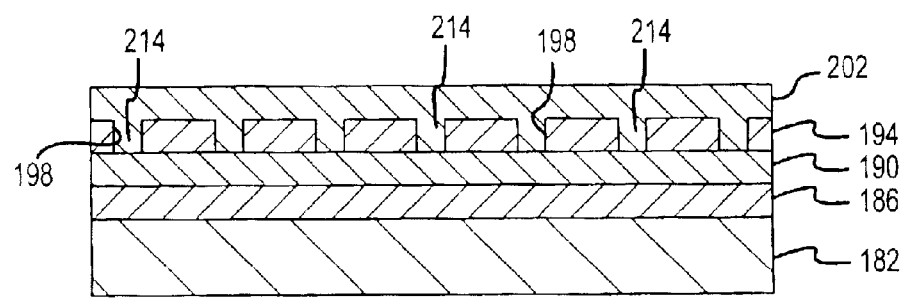

A second structural layer 202 is deposited on the second sacrificial layer 194 as illustrated in FIG. 12F. The material that defines the second structural layer 202 is also deposited within and at least substantially fills the interconnect apertures 198 that were previously formed in the second sacrificial layer 194, and such may be characterized as being part of the second structural layer 202. This portion of the second structural layer 202 may be characterized as a plurality of first reinforcement sections 214 that will be the lower extreme of a reinforcing assembly 208 for the microstructure 180 that is being fabricated. Although FIG. 12F shows an intersection between the lower extreme of each of the first reinforcement sections 214 and the upper extreme of the first structural layer 190, typically such an intersection will not exist and instead will at least appear to be continuous.

Figure 12G:
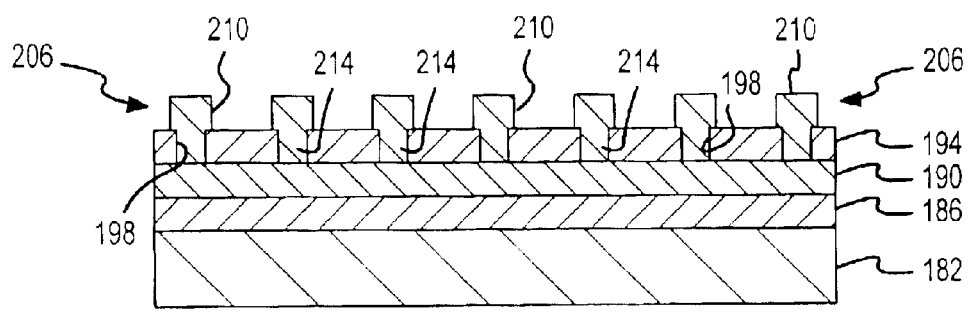

The second structural layer 202 is then patterned to define a plurality of at least generally laterally extending second reinforcement sections 210 for the reinforcing assembly 208, as illustrated in FIG. 12G (e.g., to define a plurality of rails or at least the middle portion thereof of the type utilized by the microstructure 106 of FIG. 5, the microstructure 130 of FIG. 7, the microstructure 384 of FIGS. 10A–C, and the microstructure 384' of FIG. 10D, as well as the variations therefore presented in FIGS. 11A–F). Each second reinforcement section 210 is disposed directly above (e.g., vertically aligned) with at least one first reinforcement section 214 (if used), although the second reinforcement sections 210 will typically have a slightly larger width than any corresponding first reinforcement section(s) 214.

Figure 12H:
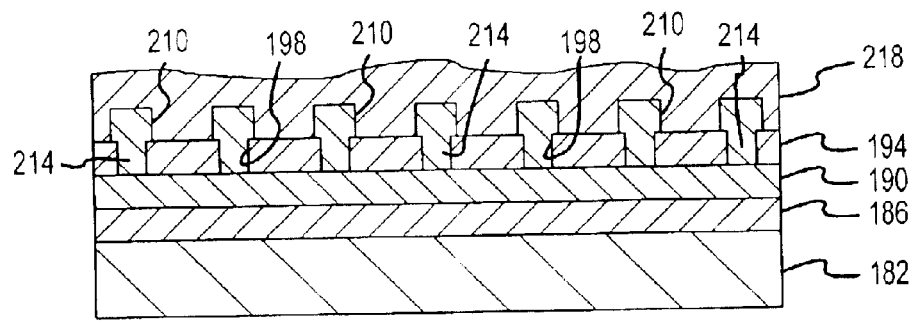
Figure 12I:
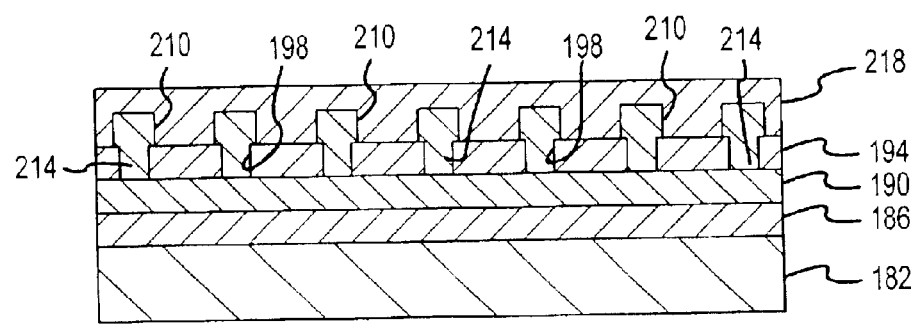

A third sacrificial layer 218 is then deposited on the second reinforcement sections 210 that were formed from the second structural layer 202 as illustrated in FIG. 12H. The upper surface of this third sacrificial layer 218 will typically have a wavy or uneven contour. Generally, those portions of the third sacrificial layer 218 that are disposed over the second reinforcement sections 210 will be disposed at a higher elevation than those portions of the third sacrificial layer 218 that are disposed between adjacent second reinforcement sections 210. Therefore, the upper surface of the third sacrificial layer 218 will typically be planarized in an appropriate manner, such as by chemical mechanical polishing to yield a sufficiently flat upper surface for the third sacrificial layer 218, as illustrated in FIG. 12I.

Figure 12J:
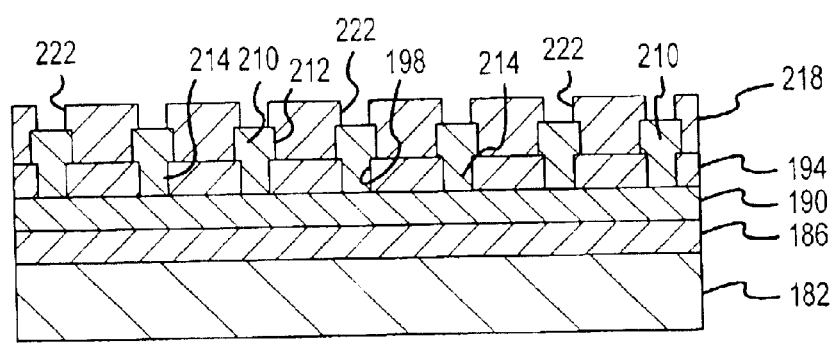

The third sacrificial layer 218 is then patterned to define a plurality of interconnect apertures 222 as illustrated in FIG. 12J. These interconnect apertures 222 at a minimum allow for establishing a structural interconnection with the second reinforcement sections 210, and may be in the form of at least generally laterally extending grooves or trenches (e.g., to define a plurality of rails or at least the upper portion thereof of the type utilized by the microstructure 106 of FIG. 5, the microstructure 130 of FIG. 7, and the microstructure 384 of FIG. 10A, as well as the variations therefore illustrated in FIGS. 11A–F), or may be in the form of a plurality of separate and discrete holes that are disposed in spaced relation (e.g., to define a plurality of posts or columns of the type utilized by the mirror microstructure 384' of FIG. 10D). Each interconnect aperture 222 is disposed directly above (e.g., vertically aligned) a corresponding second reinforcement section 210, although the second reinforcement sections 210 will typically have a slightly larger width than their corresponding interconnect aperture(s) 222.

Figure 12K:
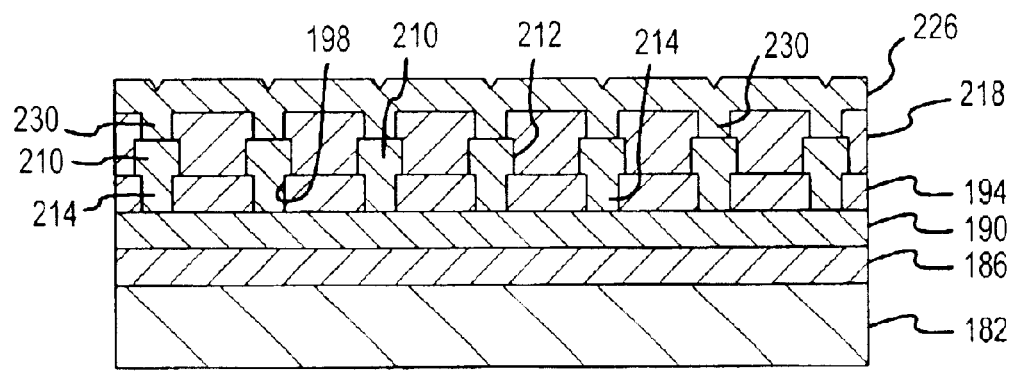

A third structural layer 226 is deposited on the third sacrificial layer 218 as illustrated in FIG. 12K. The material that defines the third structural layer 226 is also deposited within and at least substantially fills the interconnect apertures 222 that were previously formed in the third sacrificial layer 218, and such may be characterized as being part of the third structural layer 226. This portion of the third support layer 226 may be characterized as a plurality of third reinforcement sections 230 that are the upper extreme of the reinforcing assembly 208 for the microstructure 180 that is being fabricated. Although FIG. 12K shows an intersection between the lower extreme of each of the third reinforcement section 230 and the upper extreme of their corresponding second reinforcement 210, typically such an intersection will not exist and instead will at least appear to be continuous.

Figure 12L:
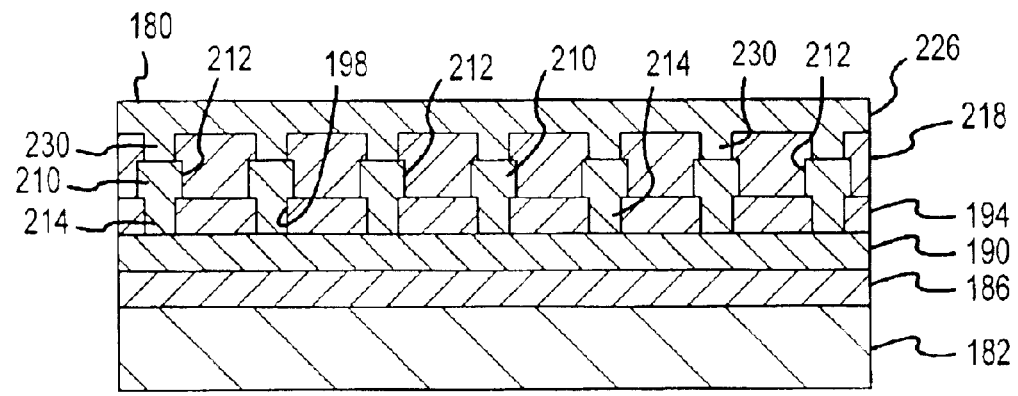

The upper surface of the third structural layer 226 will typically have a wavy or uneven contour as illustrated in FIG. 12K. Generally, those portions of the third structural layer 226 that are disposed between adjacent third reinforcement sections 230 will be recessed to a degree. Therefore, the upper surface of the third structural layer 226 will typically be planarized in an appropriate manner, such as by chemical mechanical polishing, to yield a sufficiently flat upper surface for the third structural layer 226 as illustrated in FIG. 12L. This completes the definition of the microstructure 180. It should be appreciated that the system that includes the microstructure 180 will likely include other components than those illustrated in FIGS. 12A–M and that may interface with the microstructure 180 in some manner (e.g., one or more actuators).

The microstructure 180 is now ready to be released. "Released" means to remove each of the sacrificial layers of the surface micromachined system and thereby including the first sacrificial layer 186, the second sacrificial layer 194, and the third sacrificial layer 218. An etchant is used to provide the releasing function. The manner in which the microstructure 180 was formed in accordance with the methodology of FIGS. 12A–M reduces the time required for the sacrificial layers 194 and 218 to be totally removed. Ultimately, a plurality of at least generally laterally extending etchant flow pipes, channels, or conduits are formed in the third sacrificial layer 218. Those portions of the third sacrificial layer 218 that are positioned against/near the second reinforcement sections 210 that were formed from the second structural layer 202 are believed to be less dense than the remainder of the third sacrificial layer 218 since the etch rate is greater in proximity to the second reinforcement sections 210 and including along the length thereof. Recall that the third sacrificial layer 218 was deposited after the second reinforcement sections 210 were formed, which creates these low density regions. Low density regions in the third sacrificial layer 218 thereby exist along the entire length of both sides of each second reinforcement 210. Principally these low density regions will exist along a sidewall 212 of each of the second reinforcement section 210 (e.g., the vertically disposed/extending portion of the second reinforcement section 210). The etch rate will be greater in the low density regions of the third sacrificial layer 218 than throughout the remainder of the third sacrificial layer 218. This will effectively form at least two etch release pipes, channels or conduits in the third sacrificial layer 218 along the side of each second reinforcement section 210. The development of the etch release channels during the initial portion of the release etch provides access to interiorly disposed locations within the sacrificial layers for the etchant to complete the release before the etchant has any significant adverse effect on the microstructure 180. Notwithstanding the characterization of the structures 214, 210, and 230 as "reinforcement sections," it should be appreciated that the entire focus of the methodology of FIGS. 12A–M could in fact be to simply provide a plurality of at least generally laterally extending etch release conduits, to in turn provide a "rapid etch release function" for the microstructure 180. That is, it is not required that the structures 214, 210, and 230 actually structurally reinforce the microstructure 180, although such is preferably the case. Therefore, the structures 210 that provide for the definition of the low density regions in the third sacrificial layer 218, and thereby the etch release conduits, could also be properly characterized as etch release rails or the like.

Figure 12M:
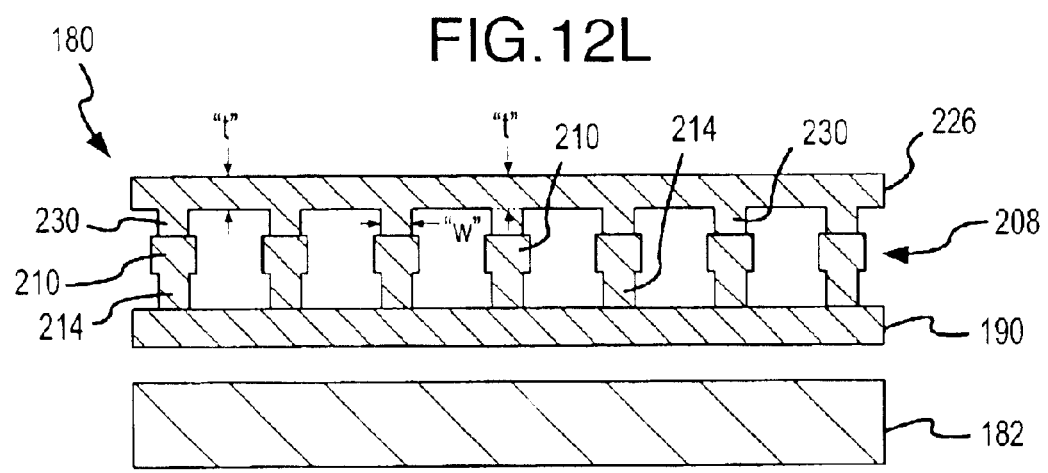

The microstructure 180 of FIG. 12M has a desired surface topography on its third structural layer 226 using the above-noted principles. For the case where the thickness of third structural layer 226 is comparable or less than the thickness of the underlying third sacrificial layer 218, the maximum lateral dimension of any rail upper section 230 (designated as "w" in FIG. 12M) again should be less than twice the thickness of the uppermost structural layer (designated as "t" in FIG. 12M, and which does not include the depending structure). This again provides a desirably smooth surface topography for the third structural layer 226, which is desired for optical applications. Having the third structural layer 218 be of a thickness which is greater than the thickness of the third sacrificial layer 218 reduces the effects of the width of the interconnect apertures 222 on the surface topography of the third structural layer 218.

The basic principle for forming etch release channels or conduits encompassed by the methodology represented in FIGS. 12A–M is that low density regions of sacrificial material are formed when the sacrificial material is deposited along at least generally vertically disposed surfaces of an etch release rail, and that the same each effectively defines a etch release channel or conduit. These etch release rails may exist at any desired level within the microstructure being fabricated and yet still provide this low density region formation function. Moreover, these etch release rails do not need to be structurally interconnected with the uppermost structural layer of the microstructure being fabricated to provide this low density region formation function. For instance, these etch release rails instead could be anchored to the underlying substrate or another underlying structural layer. In fact, these etch release rails need not remain in the final structure of the microstructure being fabricated at all, but instead may be removed during the release of the microstructure from the substrate.

Another method for making a microstructure is illustrated in FIGS. 13A–M. This methodology may be utilized to make the mirror microstructure 106 of FIGS. 5–6, and the principles of this methodology may be utilized in/adapted for the manufacture of the mirror microstructure 130 of FIG. 7, the mirror microstructure 384 FIGS. 10A–C, and the mirror microstructure 384' of FIG. 10D, as well as the variations therefore presented in FIGS. 11A–F. In addition to being able to form a desired reinforcing structure, the methodology of FIGS. 13A–M further provides a desired manner for releasing the microstructure at the end of processing by forming a plurality of at least generally laterally extending etch release conduits in one or more of its sacrificial layers to facilitate the removal thereof to provide the releasing function. In contrast to the methodology of FIGS. 12A–M, the methodology of FIGS. 13A–M forms these etch release conduits during the fabrication of the microstructure (i.e., there is at least one more deposition after these etch release conduits are formed). Stated another way, the plurality of etch release in the case of the methodology of FIGS. 13A–M exist before the microstructure and sacrificial layers are exposed to any etchant for providing the release function.

Figure 13A:
FIGS. 13A–M are sequential views of another embodiment for making one embodiment of a microstructure for a surface micromachined system.
Figure 13B:
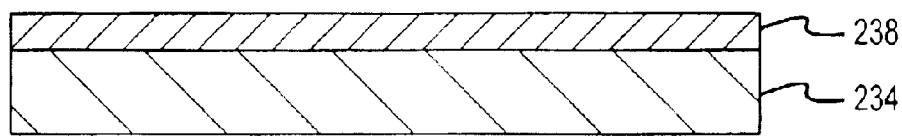
Figure 13C:
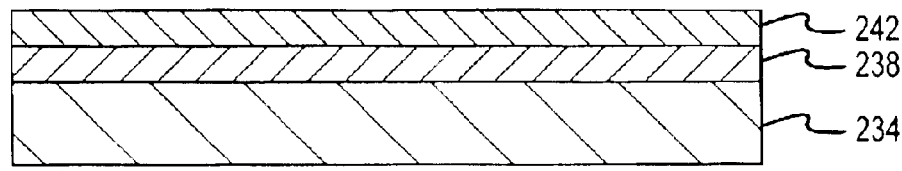
Figure 13D:
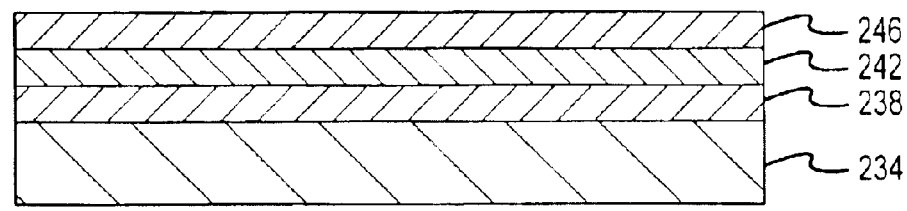
Figure 13E:
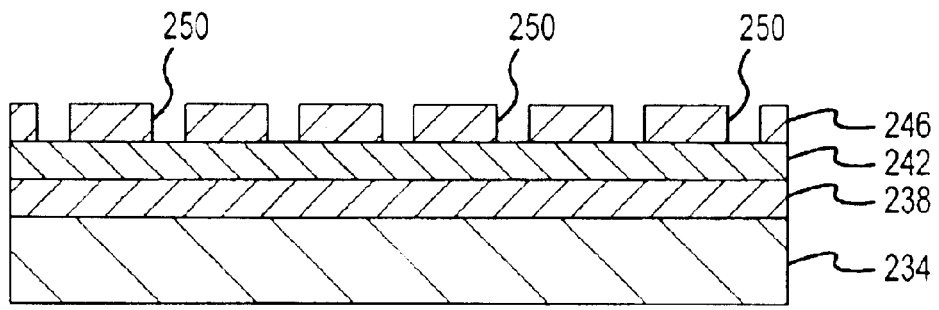

FIG. 13A illustrates a substrate 234 on which a microstructure 232 will be fabricated. Multiple layers are first sequentially deposited/formed over the substrate 234. A first sacrificial layer 238 is deposited over the substrate 234 as illustrated in FIG. 13B, a first structural layer 242 is deposited on the first sacrificial layer 238 as illustrated in FIG. 13C, and a second sacrificial layer 246 is deposited on the first structural layer 242 as illustrated in FIG. 13D. The second sacrificial layer 246 is then patterned to define a plurality of interconnect apertures 250 as illustrated in FIG. 13E. These interconnect apertures 250 at a minimum allow for establishing a structural connection with the first structural layer 242, and may be in the form of at least generally laterally extending grooves or trenches (e.g., to define a plurality of rails or at least the lower portion thereof of the type utilized by the microstructure 106 of FIG. 5 and the microstructure 130 of FIG. 7, as well as the variations therefore illustrated in FIGS. 11A–F). The interconnect apertures 250 could also be in the form of a plurality of separate and discrete holes that are disposed in spaced relation to define a plurality of posts or columns that would structurally interconnect with the underlying first structural layer 242 (e.g., similar to the manner in which the columns 50 interconnect with the underlying first structural layer 34 in the case of the mirror microstructure 30 of FIG. 2A). Using the methodology of FIGS. 13A–M to make the microstructure 384 of FIGS. 10A–C and microstructure 384' of FIG. 10D would not require this patterning of the second sacrificial layer 246 to define the plurality of interconnect apertures 250, since the rails 396 of the microstructure 384/384' do not interconnect with an underlying structural layer.

Figure 13F:
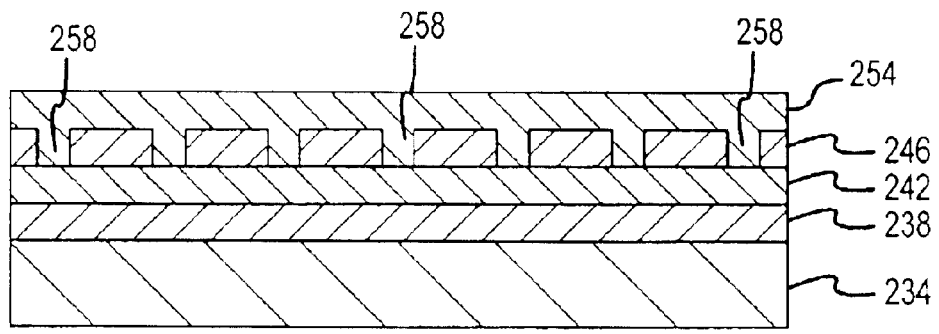

A second structural layer 254 is deposited on the second sacrificial layer 246 as illustrated in FIG. 13F. The material that defines the second structural layer 254 is also deposited within and at least substantially fills the interconnect apertures 250 that were previously formed in the second sacrificial layer 246, and such may be characterized as being part of the second structural layer 254. This portion of the second support layer 254 may be characterized as a plurality of first reinforcement sections 258 that are the lower extreme of a reinforcing assembly 256 for the microstructure 232 that is being fabricated (FIG. 13M). Although FIG. 13F shows an intersection between the lower extreme of each of the first reinforcement sections 258 and the upper extreme of the first structural layer 242, typically such an intersection will not exist and instead will at least appear to be continuous.

Figure 13G:
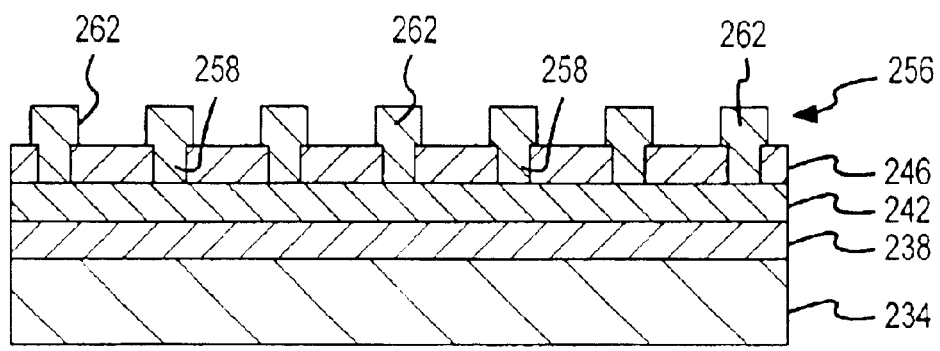
Figure 13H:
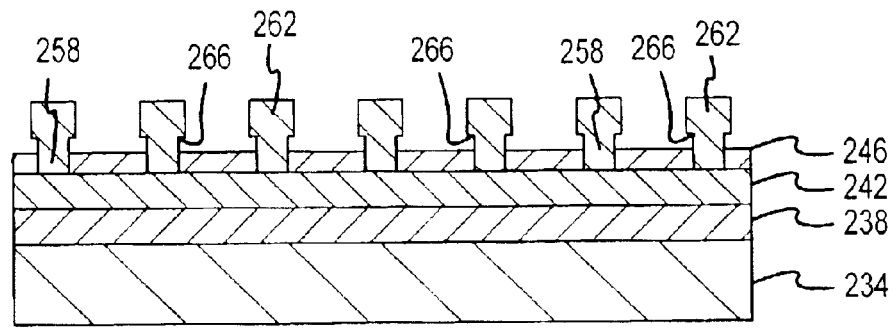

The second structural layer 254 from FIG. 13F is then patterned to define a plurality of at least generally laterally extending second reinforcement sections 262 for the reinforcing assembly 256 (FIG. 13M), as illustrated in FIG. 13G (e.g., to define a plurality of rails or at least the middle portion thereof of the type utilized by the microstructure 106 of FIG. 5, the microstructure 130 of FIG. 7, the microstructure 384 of FIGS. 10A–C, and the mirror microstructure 384' of FIG. 10D, as well as the variations therefore presented in FIGS. 11A–F). Each second reinforcement section 262 is disposed directly above (e.g., vertically aligned) with at least one first reinforcement section 258 (if any), although the second reinforcement sections 262 will typically have a slightly larger width than their corresponding first reinforcement section(s) 258 (if any). At this time an upper portion of the second sacrificial layer 246 is removed as illustrated in FIG. 13H. That is, a portion of the second sacrificial layer 246 remains after this removal operation. The second sacrificial layer 246 extends above the first structural layer 242 a distance which is less than the distance which the lower extreme of the second reinforcement sections 262 are disposed above the first structural layer 242. As, there is now a gap or an undercut 266 beneath the lower extreme of the second reinforcement sections 262 and the upper surface of the second sacrificial layer 246. One way in which only an upper portion of the second sacrificial layer 246 may be removed is by a timed or controlled etch. It is also basically a requirement that this etch be of an isotropic type in order to form the undercuts 266. This is most easily accomplished using a liquid HF-based etchant. An anisotropic dry plasma etch, for example, would only etch straight down and the undercuts 266 (and thereby the etch release channels 270 noted below) would not subsequently be formed.

Figure 13I:
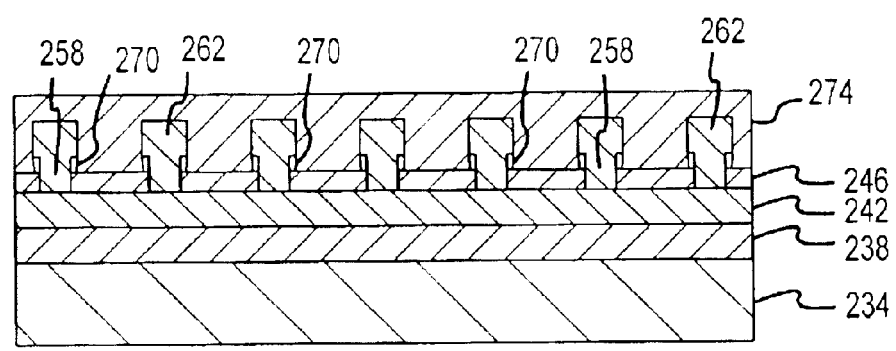

A third sacrificial layer 274 is then deposited on the second reinforcement sections 262 that were formed from the second structural layer 254 and on the second sacrificial layer 246 as illustrated in FIG. 13I. Although FIG. 13I shows an intersection between the third sacrificial layer 274 and the second sacrificial layer 246, typically this will not be the case such that the third sacrificial layer 274 and the second sacrificial layer 246 will appear to be continuous. Not all portions of the undercuts 266 will "fill" with the material that defines the third sacrificial layer 274, for example if the formation of the third sacrificial layer 274 is done with a PECVD oxide. These resulting voids define a plurality of at least generally laterally extending etch release channels 270. One of these etch release channels 270 is disposed on and extends along the entire length of each side of an upper extreme of the first reinforcement sections 258 of the reinforcing assembly 256 (and/or beneath the second reinforcement sections 262 along both sides thereof).

Figure 13J:
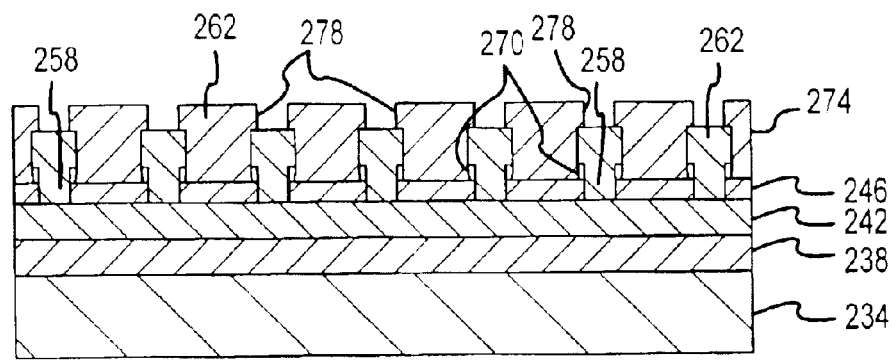

The upper surface of the third sacrificial layer 274 may retain a wavy or uneven contour after being deposited. The upper surface of the third sacrificial layer 274 may then be planarized in an appropriate manner, such as by chemical mechanical polishing, to yield a sufficiently flat upper surface for the third sacrificial layer 274 and as illustrated in FIG. 13I. In any case, the third sacrificial layer 274 is then patterned to define a plurality of interconnect apertures 278 as illustrated in FIG. 13J. These interconnect apertures 278 at a minimum allow for establishing a structural interconnection with the second reinforcement sections 262, and may be the form of at least generally laterally extending grooves or trenches (e.g., to define a plurality of rails or at least the upper portion thereof of the type utilized by the microstructure 106 of FIG. 5, the microstructure 130 of FIG. 7, and the microstructure 384 of FIGS. 10A–C, as well as the variations therefore illustrated in FIGS. 11A–F), or may be in the form of a plurality of separate and discrete holes that are disposed in spaced relation (e.g., to define a plurality of posts or columns of the type utilized by the microstructure 384' of FIG. 10D). In any case, each interconnect aperture 278 is disposed directly above (e.g., vertically aligned) with a corresponding second reinforcement section 262, although the second reinforcement sections 262 will typically have a slightly larger width than their corresponding interconnect aperture(s) 278.

Figure 13K:
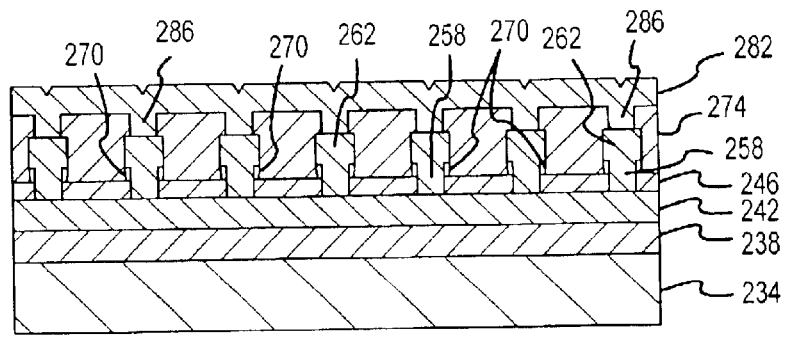

A third structural layer 282 is then deposited on the third sacrificial layer 274 as illustrated in FIG. 13K. The material that defines the third structural layer 282 is also deposited within and at least substantially fills the interconnect apertures 278 that were previously formed in the third sacrificial layer 274, and such may be characterized as being part of the third structural layer 282. This portion of the third structural layer 282 may be characterized as a plurality of third reinforcement sections 286 that are the upper extreme of the reinforcing assembly 256 for the microstructure 232 that is being fabricated. Although FIG. 13K shows an intersection between the lower extreme of each of the third reinforcement sections 286 and the upper extreme of their corresponding second reinforcement section 262, typically such an intersection will not exist and instead will at least appear to be a continuous structure.

Figure 13L:
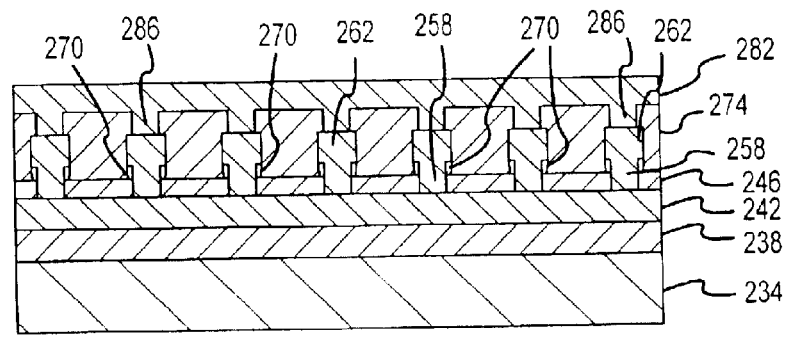
Figure 13M:
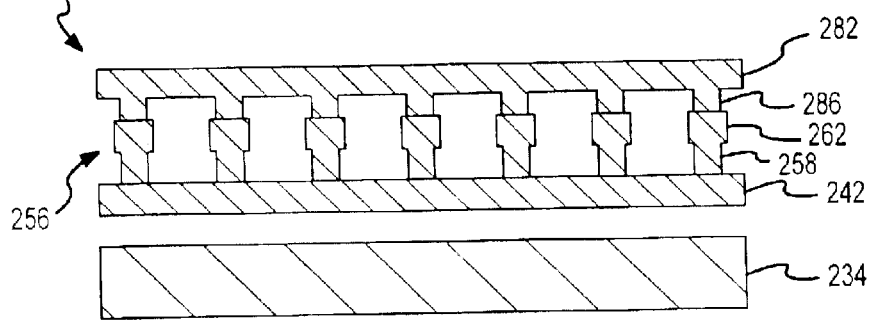

The upper surface of the third structural layer 282 will typically have a wavy or uneven contour, such as a plurality of laterally disposed and axially extending depressions. Generally, those portions of the third structural layer 282 that are disposed between adjacent third reinforcement sections 286 will be recessed to a degree. Therefore, the upper surface of the third structural layer 282 will typically be planarized in an appropriate manner, such as by chemical mechanical polishing, to yield a sufficiently flat upper surface for the third structural layer 282 and as illustrated in FIG. 13L. This completes the definition of the microstructure 232. It should be appreciated that the system that includes the microstructure 232 will likely include other components than those illustrated in FIGS. 13A–M and that may interface with the microstructure 232 in some manner (e.g., one or more actuators).

The microstructure 232 is now ready to be released. "Released" means to remove each of the sacrificial layers in the system, and thereby including the first sacrificial layer 238, the second sacrificial layer 246, and the third sacrificial layer 274. An etchant is used to provide the releasing function. Predefined flow paths for this etchant are defined in and extend through portions of the second sacrificial layer 246 and the third sacrificial layer 274 in the form of the above-noted etch release channels 270. The existence of the etch release channels 270 provides access to interiorly disposed locations within the sacrificial layers 246, 274 for the etchant to complete the release before the etchant has any significant adverse effect on the microstructure 232. Notwithstanding the characterization of the structures 258, 262, and 286 as "reinforcement sections," it should be appreciated that the entire focus of the methodology of FIGS. 13A–M could in fact be to simply provide a plurality of at least generally laterally extending etch release conduits, to in turn provide a "rapid etch release function" for the microstructure 232. That is, it is not required that the structures 258, 262, and 286 actually structurally reinforce the microstructure 232, although such is preferably the case. Therefore, the structures 258 and/or 262 that provide for the definition of the etch release conduits 270 could also be properly characterized as etch release rails or the like.

The basic principle for forming etch release channels or conduits encompassed by the methodology represented in FIGS. 13A–M is that one or more undercuts may be formed under an etch release rail in such a manner that the subsequent deposition of a sacrificial material will not entirely fill these undercuts, thereby leaving a void that defines an etch release channel or conduit. These etch release rails may exist at various levels within the microstructure being fabricated and yet still allow for the formation of etch release channels or conduits in this same general manner. Moreover, these etch release rails do not need to be structurally interconnected with the uppermost structural layer of the microstructure being fabricated to allow for the formation of etch release channels or conduits in this same general manner. For instance, these etch release rails instead could be anchored to the underlying substrate or another underlying structural layer. In fact, these etch release rails need not remain in the final structure of the microstructure being fabricated at all, but instead may be removed during the release of the microstructure from the substrate as in the case of the methodology of FIGS. 14A–F.

Figure 14A:
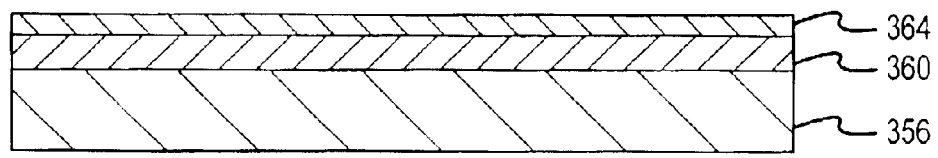
FIGS. 14A–F are sequential views of another embodiment for making one embodiment of a microstructure for a surface micromachined system.
Figure 14B:
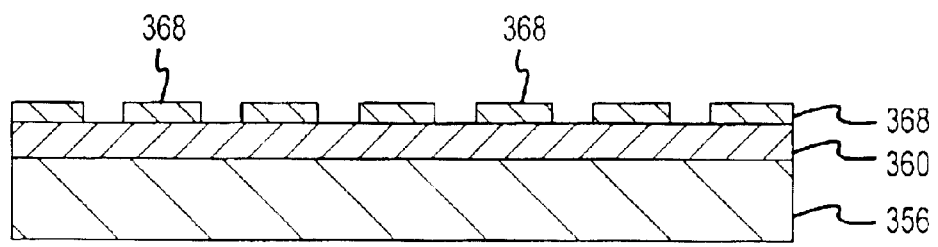

Another method for making another embodiment of a microstructure 358 is illustrated in FIGS. 14A–F. FIG. 14A illustrates that a first sacrificial layer 360 has been deposited over a substrate 356, and that an intermediate layer 364 has been deposited directly on the first sacrificial layer 360. The first sacrificial layer 360 is formed from a different material than the intermediate layer 364. In one embodiment, the first sacrificial layer 360 is formed from those types of materials identified above as being appropriate for the types of sacrificial layers described herein, while the intermediate layer 364 may be materials such as silicon nitride, polygermanium, or the like. The material that is selected for the intermediate layer 364 should be at least partially soluble in the etchant that is used to remove the first sacrificial layer 360, or in a secondary etchant that does not affect the various structural layers of the microstructure 358 and that can be applied after the release etchant. For example, if polygermanium were used for the intermediate layer 364, it will not dissolve in a release etch that uses HF, but could be dissolved subsequently in a short hydrogen peroxide bath that would not adversely affect the polysilicon that may be used for the various structural layers of the microstructure 358. In any case, of the intermediate layer 364 is then patterned to define a plurality of at least generally laterally extending strips 368 as illustrated in FIG. 14B, and which function as etch release rails. As such, any of the layouts noted above for etch release rails may be utilized. However, unlike other etch release rails described herein that also provide a reinforcing function, the strips 368 will be removed during the release of the microstructure 358 that is formed by the methodology of FIGS. 14A–F. In order to ensure the complete removal of the strips 368, they should be of a reduced thickness. In one embodiment, the thickness or vertical extent of the silicon nitride strips 368 is no more than about 1500 Å.

Figure 14C:
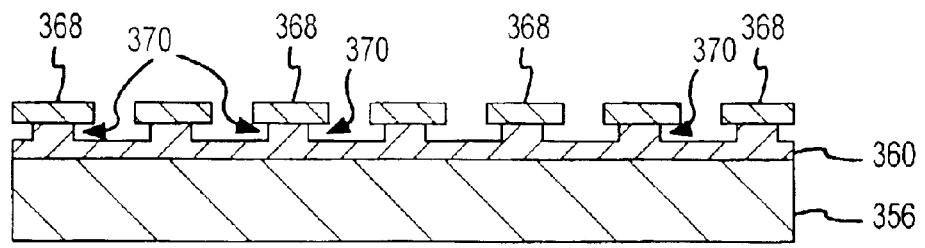

At this time, part of an upper portion of the first sacrificial layer 360 is removed as illustrated in FIGS. 14C. Generally, a portion of the first sacrificial layer 360 is removed from under the plurality of strips 368 along both of its edges to define a gap or an undercut 370 along both edge portions of each strip 368. The entirety of the first sacrificial layer 360 remains directly under a portion of the strips 368 in the form of a pedestal or the like to support the same. One way in which only an upper portion of the first sacrificial layer 360 may be removed is by a timed or controlled etch. It is also basically a requirement that this etch be of an isotropic type in order to form the undercuts 370. This is most easily accomplished using a liquid HF-based etchant. An anisotropic dry plasma etch, for example, would only etch straight down and the undercuts 370 (and thereby the etch release channels 380 noted below) would not subsequently be formed.

Figure 14D:
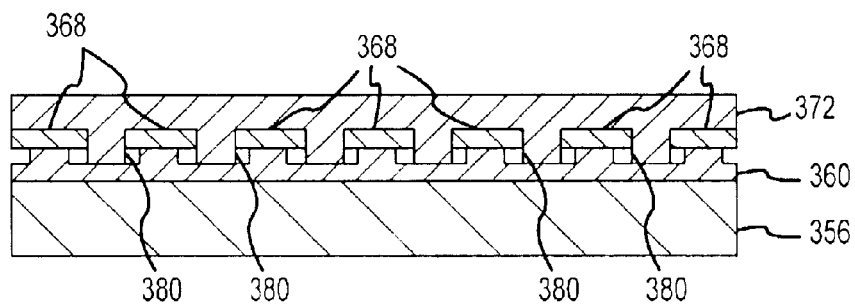

A second sacrificial layer 372 is then deposited on the strips 368 and on the first sacrificial layer 360 as illustrated in FIG. 14D. Although FIG. 14D shows an intersection between the second sacrificial layer 372 and the first sacrificial layer 360, typically this will not be the case such that the second sacrificial layer 372 and the first sacrificial layer 360 will appear to be continuous. Not all portions of the undercuts 370 will "fill" with the material that defines the second sacrificial layer 372, for example if the formation of the second sacrificial layer 372 is done with a PECVD oxide. These resulting voids define a plurality of at least generally laterally extending etch release channels 380. One of these etch release channels 380 is disposed on and extends along the entire length of each bottom side portion of each of the strips 368.

Figure 14E:
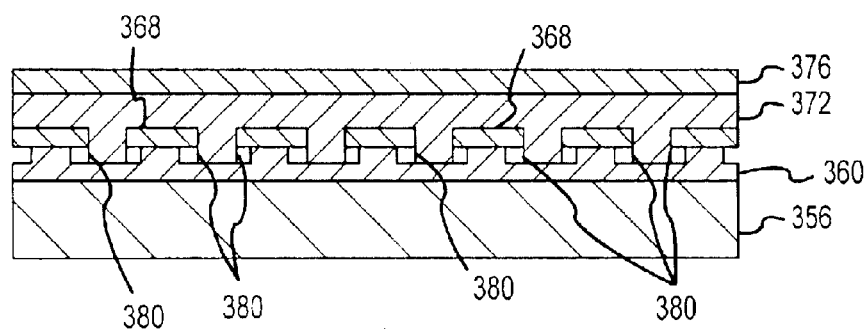
Figure 14F:
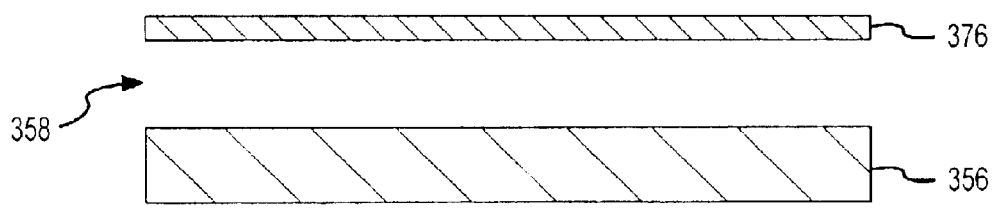

The upper surface of the second sacrificial layer 372 may retain a wavy or uneven contour after being deposited (not shown). The upper surface of the second sacrificial layer 372 may then be planarized in an appropriate manner, such as by chemical mechanical polishing, to yield a sufficiently flat upper surface for the third sacrificial layer 372 and as illustrated in FIG. 14D. In any case, a first structural layer 376 is deposited on the second sacrificial layer 372 as illustrated in FIG. 14E which defines the entirety of a microstructure 358. It should be appreciated that the system that includes the microstructure 358 will likely include other components than those illustrated in FIGS. 14A–F and that may interface with the microstructure 358 in some manner (e.g., one or more actuators).

The microstructure 358 is now ready to be released. "Released" means to remove each of the sacrificial layers in the system, and thereby including the first sacrificial layer 360 and the second sacrificial layer 372. The plurality of strips 368 are also removed in this release. Etchants are used to provide the releasing function. Predefined flow paths for this etchant are defined in and extend through portions of the second sacrificial layer 372 and the first sacrificial layer 360 in the form of the above-noted etch release channels 380. The existence of the etch release channels 380 provides access to interiorly disposed locations within the sacrificial layers 360, 372 for the etchant to complete the release before the etchant has any significant adverse effect on the microstructure 358.

The manner in which the etch release channels 380 are formed is similar to the methodology of FIGS. 13A–M. The primary difference is that the methodology of FIGS. 14A–F does not define any reinforcing structure for its microstructure 358, whereas the methodology of FIGS. 13A–M does define a reinforcing assembly 256 for its microstructure 232. A related difference is that the strips 368 in the methodology of FIGS. 14A–F are removed during the release etch or in a post-release etch, whereas the reinforcing assembly 256 in the methodology of FIGS. 13A–M is not removed during the release.

Another method for making another embodiment of a reinforced microstructure 302 is illustrated in FIGS. 15A–G.

In addition to being able to form a desired reinforcing structure, the methodology of FIGS. 15A–G further provides a desired manner for releasing the microstructure 302 at the end of processing by forming a plurality of at least generally laterally extending etch release channels in one or more of its sacrificial layers to facilitate the removal thereof when releasing the microstructure 302. Any of the layouts noted above for etch release rails may be used to form these etch release channels, but in the manner set forth in relation to FIGS. 15A–G.

Figure 15A:
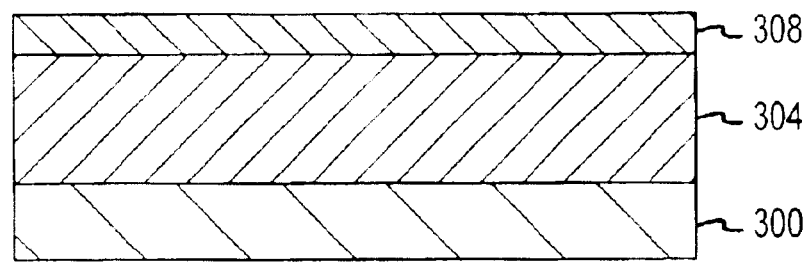
FIGS. 15A–G are sequential views of another embodiment for making one embodiment of a microstructure for a surface micromachined system.
Figure 15B:
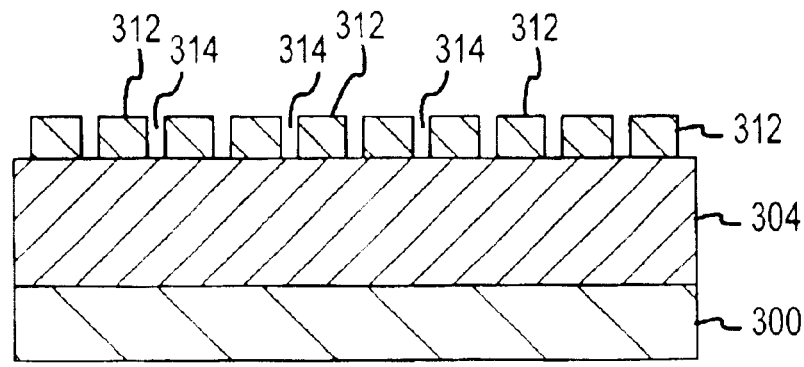

FIG. 15A illustrates a substrate 300 on which the microstructure 302 will be fabricated. Multiple layers are first sequentially deposited/formed over the substrate 300. A first sacrificial layer 304 is deposited over the substrate 300, and a first structural layer 308 is then deposited on the first sacrificial layer 304. The first support layer 308 is then patterned to define a plurality of lower reinforcement sections 312 of a reinforcing assembly 310 for the microstructure 302 as illustrated in FIG. 15B. These lower reinforcement sections 312 are at least generally laterally extending. Adjacent lower reinforcement sections 312 are separated by a spacing 314 that is also thereby at least generally laterally extending as well. Generally, a relationship between the distance between adjacent lower reinforcement sections 312 and the height or vertical extent of the lower reinforcement sections 312 is selected to allow a plurality of etch release channels to be defined in the spacings 314. In one embodiment: 1) the width or lateral extent of each of the spacings 314, or stated another way the distance between adjacent lower reinforcement sections 312 measured parallel with an upper surface of the substrate 300, is no more than about 1.5 $\mu$m; and 2) the height or vertical extend of each of the lower reinforcement sections 312 is at least about 1.5 $\mu$m. Stated another way, a ratio of the height of a given lower reinforcement section 312 to a width or lateral extent between this lower reinforcement section 312 and an adjacent lower reinforcement section 312 (i.e., one of the rail spacings 314) is at least about 1:1.

Figure 15C:
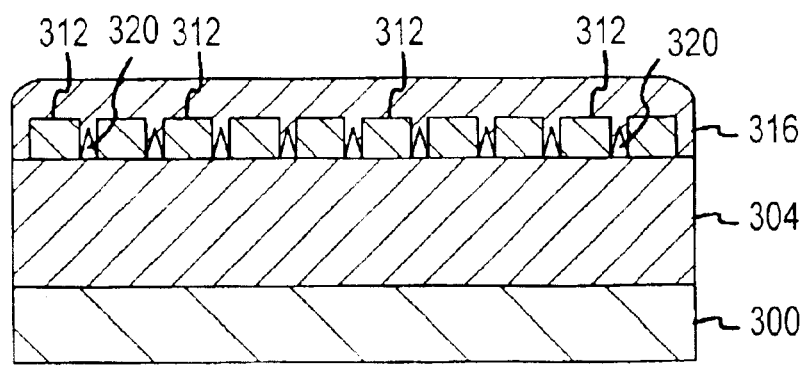

A second sacrificial layer 316 is deposited on the first structural layer 308 as illustrated in FIG. 15C. The second sacrificial layer 316 extends within and occupies a portion of each of the spacings 314 that were previously formed from the first structural layer 308. However, the material that defines the second sacrificial layer 316 does not fill or occupy the entirety of the spacings 314 due to the relative close spacing between adjacent lower reinforcement sections 312 in relation to the height or vertical extent of the lower reinforcement sections 312. This may be characterized as "keyholing." In any case, the remaining voids in the lower portion of each of the spacings 314 define a plurality of at least generally laterally extending etch release channels 320.

Figure 15D:
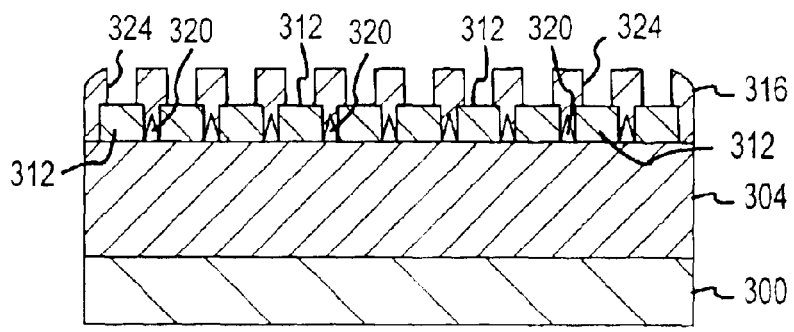

The upper surface of the second sacrificial layer 316 may retain a wavy or uneven contour. The upper surface of the second sacrificial layer 316 may then be planarized in an appropriate manner, such as by chemical mechanical polishing, to yield a sufficiently flat upper surface for the second sacrificial layer 316 and as illustrated in FIG. 15C. In any case, the second sacrificial layer 316 is then patterned to define a plurality of interconnect apertures 324 as illustrated in FIG. 15D. These interconnect apertures 324 at a minimum allow for establishing a structural connection with the lower reinforcement sections 312, and may be in the form of at least generally laterally extending grooves or trenches (e.g. to define rails), or may be in the form of a plurality of separate and discrete holes that are disposed in spaced relation (e.g. to define a plurality of columns or posts). In any case, each interconnect aperture 324 is disposed directly above (e.g., vertically aligned) a corresponding lower reinforcement section(s) 312, although the lower reinforcement sections 312 will typically have a slightly larger width than their corresponding interconnect aperture(s) 324.

Figure 15E:
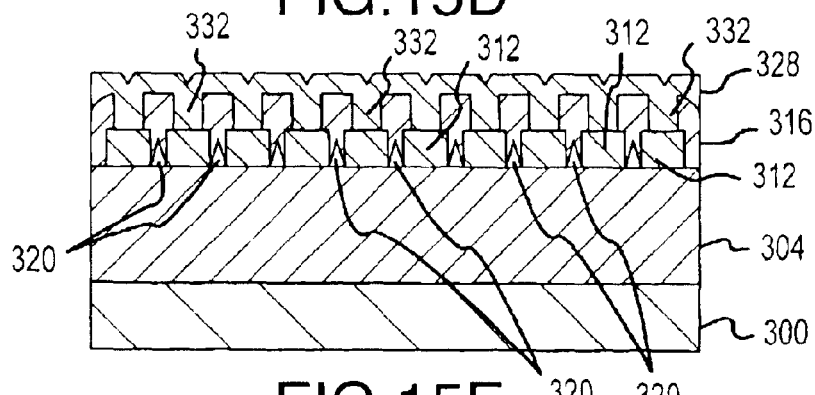

A second structural layer 328 is deposited on the second sacrificial layer 316 as illustrated in FIG. 15E. The material that defines the second structural layer 328 is also deposited within and at least substantially fills the interconnect apertures 324 that were previously formed in the second sacrificial layer 316, and such may be characterized as being part of the second structural layer 328. This portion of the second structural layer 328 may be characterized as a plurality of upper reinforcement sections 332 that are the upper extreme of the reinforcing assembly 310 (FIG. 15G) for the microstructure 302 that is being fabricated. Although FIG. 15E shows an intersection between the lower extreme of each of the upper reinforcement sections 332 and the upper extreme of their corresponding lower reinforcement section 312, typically such an intersection will not exist and instead will at least appear to be a continuous structure.

Figure 15F:
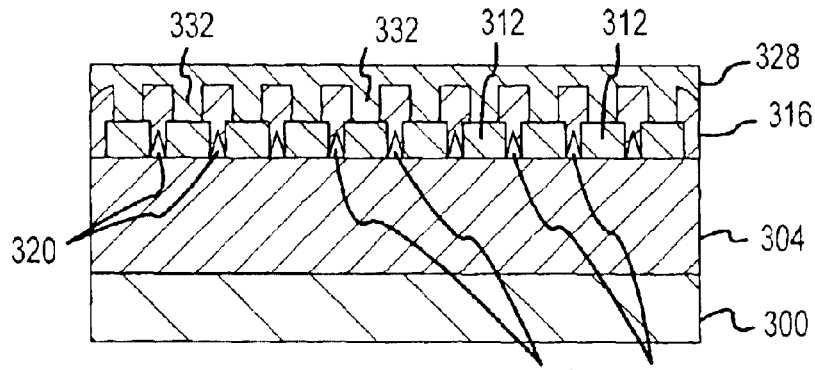
Figure 15G:
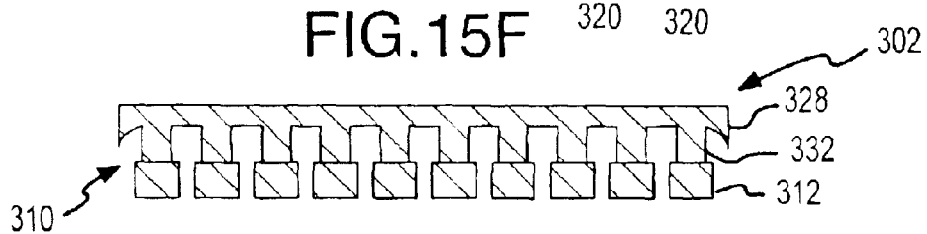
Figure 15G:
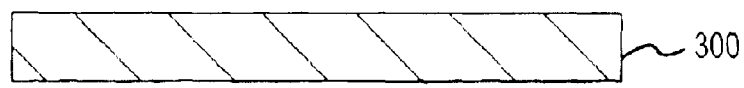

The upper surface of the second structural layer 328 will typically have a wavy or uneven contour or at least a plurality of laterally disposed and preferably axially extending depressions. Generally, those portions of the second structural layer 328 that are disposed between adjacent upper reinforcement sections 332 will be recessed to a degree. Therefore, the upper surface of the second structural layer 328 will typically be planarized in an appropriate manner, such as by chemical mechanical polishing, to yield a sufficiently flat upper surface for the second structural layer 328 and as illustrated in FIG. 15F. This completes the definition of the microstructure 302. It should be appreciated that the system that includes the microstructure 302 will likely include other components than those illustrated in FIGS. 15A–G and that may interface with the microstructure 302 in some manner (e.g., one or more actuators).

The microstructure 302 is now ready to be released. "Released" means to remove each sacrificial layer and thereby including the first sacrificial layer 304 and the second sacrificial layer 316. An etchant is used to provide the releasing function. Predefined flow paths for this etchant are defined in and extend through portions of the first sacrificial layer 304 and the second sacrificial layer 316 in the form of the above-noted etch release channels 320. The existence of the etch release channels 320 provides access to interiorly disposed locations within the sacrificial layers for the etchant to complete the release before the etchant has any significant adverse effect on the microstructure 302.

As opposed to other of the reinforced microstructures disclosed herein, the microstructure 302 is only a single structural layer (second structural layer 328) that is structurally reinforced by a plurality of "cantilevered" structures extending downwardly therefrom, namely the plurality of at least generally laterally extending lower reinforcement sections 312. Notwithstanding the characterization of the structures 312 and 332 as "reinforcement sections," it should be appreciated that the entire focus of the methodology of FIGS. 15A–G could in fact be to simply provide a plurality of at least generally laterally extending etch release conduits, to in turn provide a "rapid etch release function" for the microstructure 302. That is, it is not required that the structures 312 and 332 actually structurally reinforce the microstructure 302, although such is preferably the case. Therefore, the structures 312 could also be characterized as etch release rails or the like.

The basic principle for forming etch release channels or conduits encompassed by the methodology represented in FIGS. 15A–G is that the deposition of a sacrificial material onto a layer having at least one and more typically a plurality of slots having a height that is at least as great as the width produces a keyholing effect at the bottom of the slot, which in turn defines an etch release channel or conduit. The layer with the noted types of slots may exist at various levels within the microstructure being fabricated and yet still allow for the formation of etch release channels or conduits in this same general manner. Moreover, a layer with the noted types of slots does not need to be structurally interconnected with the uppermost structural layer of the microstructure being fabricated to allow for the formation of etch release channels or conduits in this same general manner. For instance, the layer with the noted types of slots instead could be anchored to the underlying substrate or another underlying structural layer. In fact, this layer with the noted types of slots need not remain in the final structure of the microstructure being fabricated at all, but instead may be removed during the release of the microstructure from the substrate.

Figure 16A:
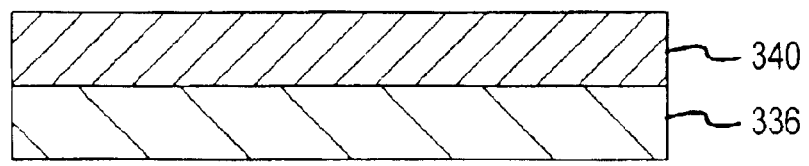
FIGS. 16A–C are sequential views of another embodiment for making one embodiment of a microstructure for a surface micromachined system.
Figure 16B:
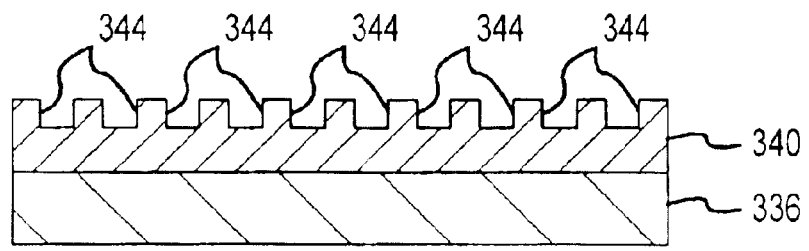
Figure 16C:
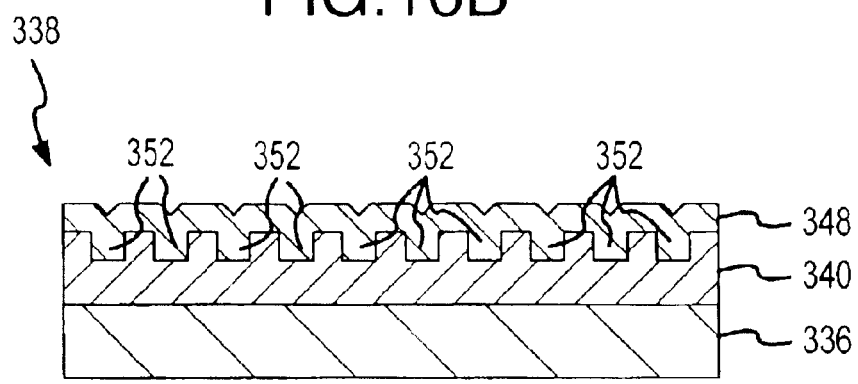

Another method for making another embodiment of a reinforced microstructure 338 is illustrated in FIGS. 16A–C. FIG. 16A illustrates a substrate 340 on which the microstructure 338 will be fabricated. A first sacrificial layer 340 is deposited over the substrate 336. The first sacrificial layer 340 may actually be a plurality of sacrificial layers that are deposited at different times in the process. In any case, the first sacrificial layer 340 is patterned to define a plurality of at least generally laterally extending apertures 344 as illustrated in FIG. 16B. These apertures 344 do not extend down through the entire thickness of the first sacrificial layer 340 in the illustrated embodiment, and may be made by a timed etch. These apertures 344 may also be made by first etching down to the substrate 336, and then backfilling with a sacrificial material in a subsequent deposition to provide apertures 344 of the desired depth.

The apertures 344 effectively function as a mold cavity and may be in any desired shape for the resulting reinforcing structure. For instance, the apertures 344 may be arranged to define a plurality of at least generally laterally extending ribs or rails (e.g., similar to the rails 118 of the mirror microstructure 106 of FIG. 5; the rails 154 or 142 of the mirror microstructure 130 of FIG. 7). Another option would be to arrange the apertures 344 to define a waffle pattern, honeycomb pattern, hexagonal pattern, or the like (e.g., a grid or network of reinforcing structures), such as defined by a plurality of intersecting rails that utilized by the mirror microstructure 166 of FIGS. 9A–B.

A first structural layer 348 is deposited on the first sacrificial layer 340 as illustrated in FIG. 16C. The first structural layer 348 extends within and occupies at least substantially the entirety of each of the apertures 344 that were previously formed in the first sacrificial layer 340. Those portions of the first structural layer 348 that are disposed within the apertures 344 may be characterized as reinforcement structures 352 that "cantilever" or extend downwardly from the first structural layer 348 at least generally toward the underlying substrate 336.

The upper surface of the first structural layer 348 may retain a wavy or uneven contour. The upper surface of the first structural layer 348 may then be planarized in an appropriate manner, such as by chemical mechanical polishing, to yield a sufficiently flat upper surface for the first support layer 348. Thereafter, the first structural layer 348 is released by removing the first sacrificial layer 340. A plurality of small etch release holes (not shown) will extend through the entire vertical extent of the first structural layer 348 to allow for the removal of the first sacrificial layer 340 that is disposed between the first structural layer 348 and the substrate 336. Therefore, the primary benefit of the design of the microstructure 338 is the structural reinforcement of the first structural layer 348 and the existence of a relatively large space between the lower extreme of the reinforcing assembly 352 and the substrate 336.

Another method for making a microstructure is illustrated in FIGS. 17A–G. This methodology may be utilized to make the mirror microstructure 106 of FIGS. 5–6, and the principles of this methodology may be utilized in/adapted for the manufacture of the mirror microstructure 30 of FIGS. 2–3, the mirror microstructure 58 of FIG. 4, the mirror microstructure 130 of FIG. 7, the mirror microstructure 384 of FIGS. 10A–C, and the mirror microstructure 384' of FIG. 10D, as well as the variations therefore that are presented in FIGS. 11A–F. In addition to being able to form a desired reinforcing structure, the methodology of FIGS. 17A–G further provides a desired manner for releasing the microstructure at the end of processing by forming a plurality of at least generally laterally extending etch release conduits in one or more of its sacrificial layers to facilitate the removal thereof to provide the releasing function.

Figure 17A:
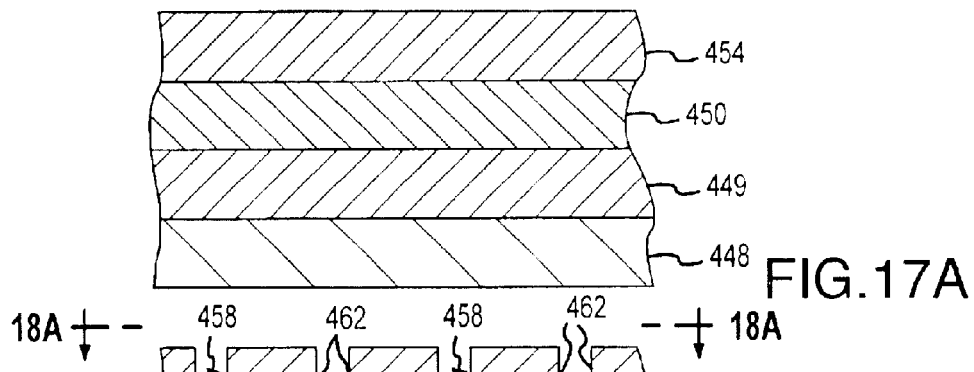
FIGS. 17A–G are sequential views of another embodiment for making one embodiment of a microstructure for a surface micromachined system.
Figure 17B:
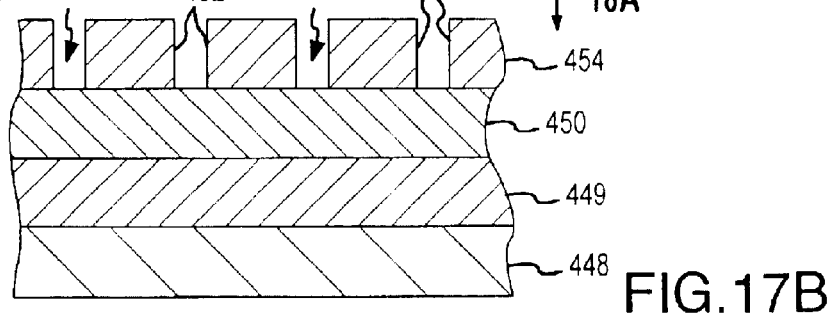

Multiple layers are first sequentially deposited/formed over an appropriate substrate 448 as illustrated in FIG. 17A, including a first sacrificial layer 449, a first structural layer 450, and a second sacrificial layer 454. The second sacrificial layer 454 is then patterned to define a plurality of etch release conduit apertures 458 as illustrated in FIG. 17B. These etch release conduit apertures 458 may be in the form of at least generally laterally extending grooves or trenches, and nonetheless are defined by a pair of at least generally vertically disposed and spaced sidewalls 462.

Figure 17C:
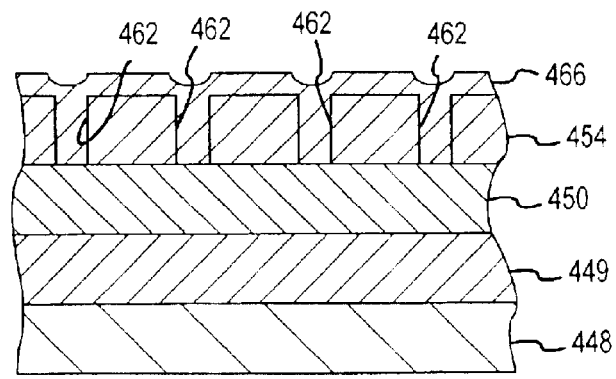

A third sacrificial layer 466 is then deposited on the second sacrificial layer 454 as illustrated in FIG. 17C. The material that defines the third sacrificial layer 466 is also deposited within and at least substantially fills the etch release conduit apertures 458 that were previously formed in the second sacrificial layer 454, and such may be characterized as being part of the third sacrificial layer 466. Although FIG. 17C shows an intersection between the third sacrificial layer 466 and the second sacrificial layer 454, typically such an intersection will not exist and instead will at least appear to be continuous. In any case, that portion of the third sacrificial layer 466 that is deposited alongside the sidewalls 462 of the etch release conduit apertures 458 will be of a lower density than other portions of the third sacrificial layer 466, as well as the second sacrificial layer 454 and first sacrificial layer 449 for that matter. These low density regions ultimately become a plurality of etch release channels as will be discussed in more detail below. It should be appreciated that the spacing between the sidewalls 462 of each aperture 458 may also be subject to the types of "keyholing" effects discussed above in relation to the methodology of FIGS. 15A–G. That is, in the event that the ratio of the height of the sidewalls 462 of a given etch release conduit aperture 458 to the spacing between these two sidewalls 462 is at least about 1:1, an etch release conduit or channel will also develop in the lower portion of this etch release conduit aperture 458 due to the "closing" off of the upper portion of this etch release conduit aperture 458 during the deposition of the third sacrificial layer 466.

Figure 17D:
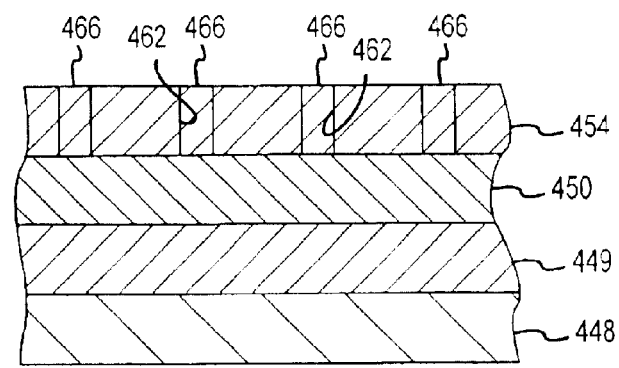

The upper surface of the third sacrificial layer 466 may retain a wavy or uneven contour, as illustrated in FIG. 17C. Generally, those portions of the third sacrificial layer 466 that are disposed over the etch release conduit apertures 458 may be disposed at a lower elevation than those portions of the third sacrificial layer 466 that are disposed between adjacent etch release conduit apertures 458. In the event that this is the case and as illustrated in FIG. 17D, the upper surface of the third sacrificial layer 466 may be planarized in an appropriate manner, such as by chemical mechanical polishing, to yield a sufficiently flat upper surface for the stack as thus far defined. This planarization may totally eliminate the third sacrificial layer 466 except from within the etch release conduit apertures 458 as shown, or the third sacrificial layer 466 may remain as a continuous layer on the first sacrificial layer 454 (not shown, but in the manner depicted in FIG. 19D discussed below).

Figure 17E:
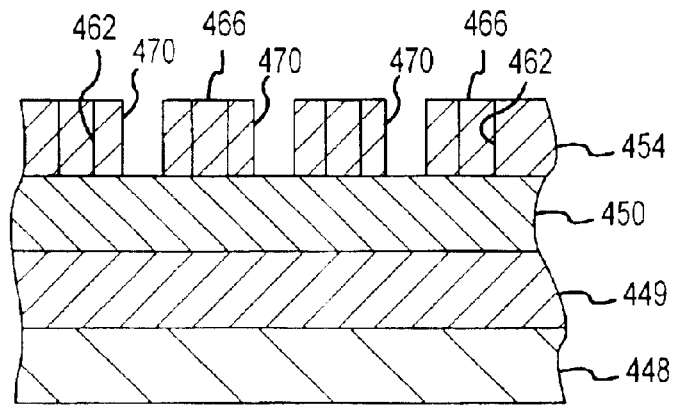

Reinforcement structures may be incorporated into the microstructure using the method of FIGS. 17A–G. In this regard, the second sacrificial layer 454, as well as any overlying portion of the third sacrificial layer 466, may be patterned to define a plurality of interconnect apertures 470 as illustrated in FIG. 17E. Notably, these interconnect apertures 470 are disposed between the etch release conduit apertures 458 that now have the material of the third sacrificial layer 466 therein. That is, preferably none of the interconnect apertures 470 extend downwardly through and/ or intersect any of the etch release conduit apertures 458 that now include material from the third sacrificial layer 466. These interconnect apertures 470 allow for establishing a structural interconnection with the first structural layer 450, and may be in various forms. For instance, these interconnect apertures 470 may be in the form of at least generally laterally extending grooves or trenches (e.g., to define a plurality of rails or at least the upper portion thereof and of the type utilized by the microstructure 106 of FIG. 5 and the microstructure 130 of FIG. 7, as well as the variations therefore illustrated in FIGS. 11A–F), or may be in the form of a plurality of separate and discrete holes that are disposed in spaced relation (e.g., to define a plurality of posts or columns of the type utilized by the mirror microstructure 30 of FIGS. 2–3).

Figure 17F:
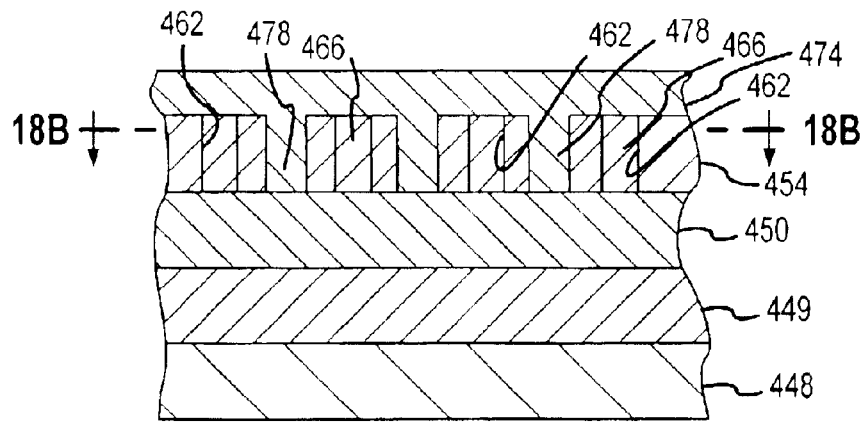
Figure 17G:
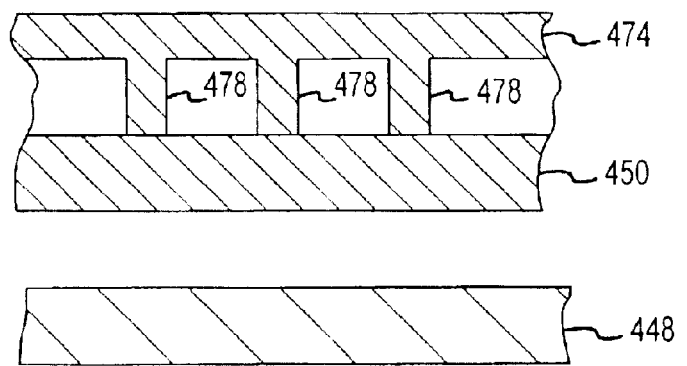

A second structural layer 474 is deposited on any exposed portions of the second sacrificial layer 454 and the third sacrificial layer 466, as illustrated in FIG. 17F. The material that defines the second structural layer 474 is also deposited within and at least substantially fills the interconnect apertures 470 within the second sacrificial layer 454, and such may be characterized as being part of the second structural layer 474. This portion of the second structural layer 474 may be characterized as a plurality of reinforcement sections 478 for the microstructure 476 that is being fabricated. Although FIG. 17F shows an intersection between the lower extreme of each of the reinforcement sections 478 and the upper extreme of first structural layer 450, typically such an intersection will not exist and instead will at least appear to be continuous.

The upper surface of the second structural layer 474 may retain have a wavy or uneven contour. Generally, those portions of the second structural layer 474 that are disposed over the reinforcement sections 478 may be recessed to a degree. Therefore, the upper surface of the second structural layer 474 may be planarized in an appropriate manner, such as by chemical mechanical polishing, to yield a sufficiently flat upper surface for the second structural layer 474 and as illustrated in FIG. 17F. This completes the definition of the microstructure 476. It should be appreciated that the system that includes the microstructure 476 will likely include other components than those illustrated in FIGS. 17A–G and that may interface with the microstructure 476 in some manner (e.g., one or more actuators). Moreover, it should be appreciated that the steps illustrated in FIGS. 17A–G may be repeated in an appropriate manner in order to define a microstructure of the type presented in FIGS. 4 and 7 (e.g., three or more spaced, but structurally interconnected, structural layers).

The microstructure 476 is now ready to be released. "Released" means to remove each of the sacrificial layers of the surface micromachined system and thereby including the first sacrificial layer 449, the second sacrificial layer 454, and the third sacrificial layer 466. An etchant is used to provide the releasing function. The manner in which the microstructure 476 was formed in accordance with the methodology of FIGS. 17A–G reduces the time required for the sacrificial layers 454 and 466 to be totally removed. Ultimately, a plurality of at least generally laterally extending etchant flow pipes, channels, or conduits are formed in the third sacrificial layer 466. Those portions of the third sacrificial layer 466 that are positioned alongside the sidewalls 462 of the etch release conduit apertures 458 that were formed in the second sacrificial layer 454 are less dense than the remainder of the third sacrificial layer 466. The etch rate will be greater in the low density regions of the third sacrificial layer 466 than throughout the remainder of the third sacrificial layer 466. This will effectively form an etch release pipe, channel or conduit in the third sacrificial layer 466 along each sidewall 462. The development of the etch release channels during the initial portion of the release etch provides access to radially inwardly disposed locations within the sacrificial layers for the etchant to complete the release before the etchant has any significant adverse effect on the microstructure 476.

The methodology represented by FIGS. 17A–G provides a number of advantages. One is that the first sacrificial layer 454 may be patterned to define any appropriate arrangement for the etch release conduit apertures 458 within/throughout a sacrificial layer(s) (and thereby an arrangement for the low density regions which will ultimately define the etch release conduits), including an arrangement where one or more of these etch release conduit apertures 458 intersect. That is, the formation of the etch release conduits is not adversely affected by having the low density regions intersect.

Figure 18A:
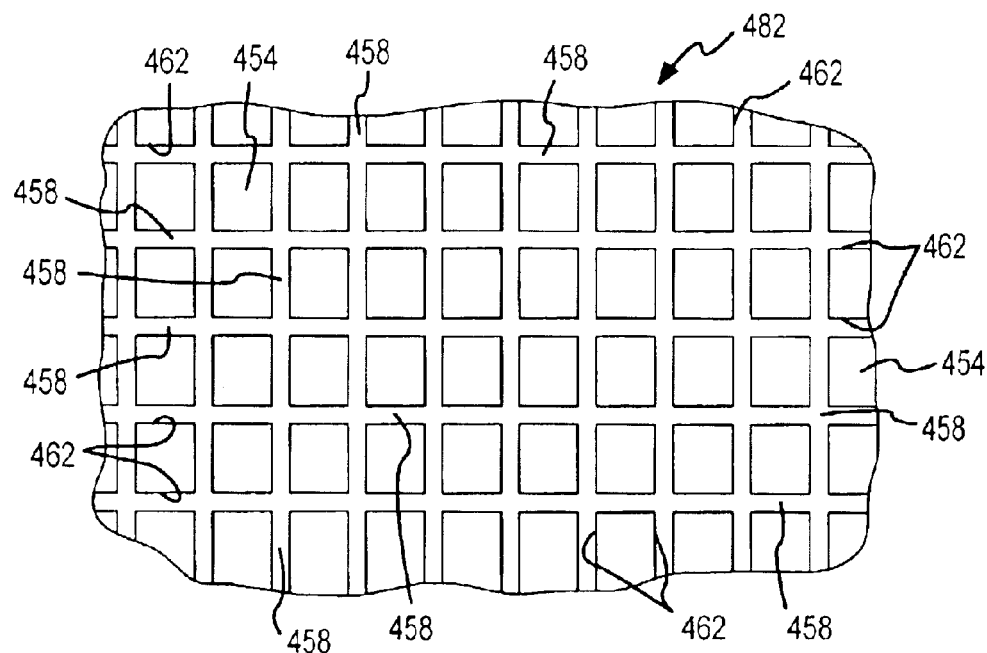
FIG. 18A is a top/plan view of one embodiment of an etch release conduit aperture grid that may be defined using the methodology of FIGS. 17A–G, and at a point in time in the process corresponding with FIG. 17B and along line 18A—18A in FIG. 17B.
Figure 18B:
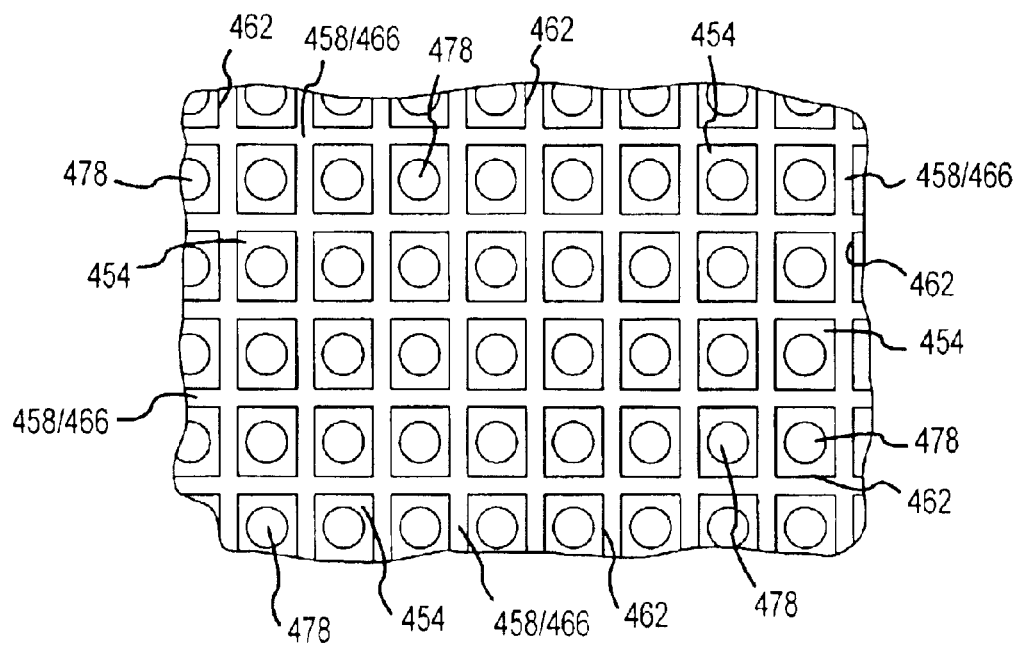
FIG. 18B is a cutaway view of the embodiment of FIG. 18A, at a point in time in the process corresponding with FIG. 17F and along line 18B—18B in FIG. 17F.

FIGS. 18A–B present one arrangement where the first sacrificial layer 454 has been patterned to define a network 482 or grid of one embodiment of intersecting/ interconnected etch release conduit apertures 458. The network 482 of intersecting/interconnected etch release conduit apertures 458 increases the amount of the sacrificial layer that is initially exposed to the release etchant within radially inward locations, and thereby should reduce the total amount of time required to release the microstructure 476 that is being formed. The various etch release conduit apertures 458 may be routed to define a desired network 482 for distribution of the release etchant throughout the first sacrificial layer 454 to not only reduce this total etch release time, but to also allow for use of a desired reinforcing structure. In this regard, FIG. 18B illustrates one embodiment that may be used for the reinforcement sections 478 in combination with the network 482 of FIG. 18A. The reinforcement sections 478 of FIG. 18B are in the form of a plurality of spaced posts or columns that structurally interconnect the first structural layer 450 and the second structural layer 474 of the microstructure 459 (e.g., for defining a microstructure of the type illustrated in FIG. 2A).

Figure 19A:
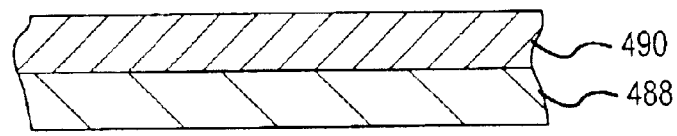
FIGS. 19A–F are sequential views of another embodiment for making one embodiment of a microstructure for a surface micromachined system, and which uses the same technique for forming a plurality of etch release conduits as the method of FIGS. 17A–G.
Figure 19B:
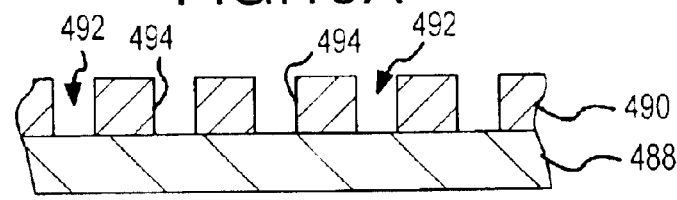

Another advantage associated with the manner in which the etch release conduits are formed in the methodology of FIGS. 17A–G, is that these etch release conduits may be formed without requiring the use of any reinforcement structures. This is illustrated by the sequential view presented in FIGS. 19A–F. Multiple layers are sequentially deposited/formed over an appropriate substrate 488, including a first sacrificial layer 490 as illustrated in FIG. 19A. The first sacrificial layer 490 is then patterned to define a plurality of etch release conduit apertures 492 as illustrated in FIG. 19B. These etch release conduit apertures 492 may be of the type used by the methodology of FIGS. 17A–G, and are defined by a pair of at least generally vertically disposed and spaced sidewalls 494.

Figure 19C:
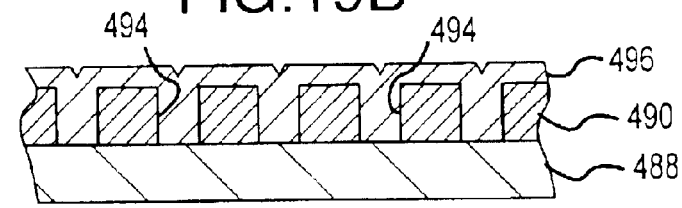

A second sacrificial layer 496 is then deposited on the first sacrificial layer 490, as illustrated in FIG. 19C. The material that defines the second sacrificial layer 496 is also deposited within and at least substantially fills the etch release conduit apertures 492 that were previously formed in the first sacrificial layer 490, and such may be characterized as being part of the second sacrificial layer 496. Although FIG. 19C shows an intersection between the second sacrificial layer 496 and the third sacrificial layer 490, typically such an intersection will not exist and instead will at least appear to be continuous. In any case, that portion of the second sacrificial layer 496 that is deposited alongside the sidewalls 494 of the etch release conduit apertures 492 will be of a lower density than other portions of the second sacrificial layer 496, as well as the first sacrificial layer 490 for that matter.

Figure 19D:
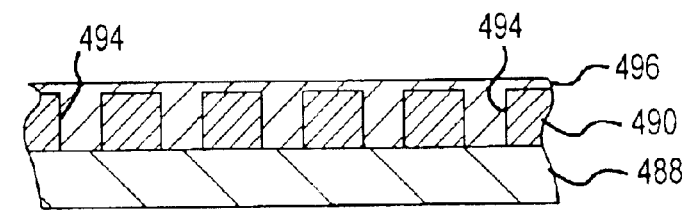

The upper surface of the second sacrificial layer 496 may retain a wavy or uneven contour, as illustrated in FIG. 19C. The upper surface of the second sacrificial layer 496 may be planarized in an appropriate manner, such as by chemical mechanical polishing, to yield a sufficiently flat upper surface for the stack as thus far defined and as illustrated in FIG. 19D. This planarization may totally eliminate the second sacrificial layer 496 except from within the etch release conduit apertures 492 (not shown), or the second sacrificial layer 496 may remain as a continuous layer on the first sacrificial layer 490 as shown in FIG. 19D.

Figure 19E:
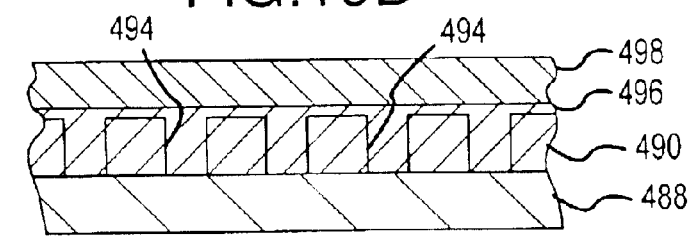
Figure 19F:
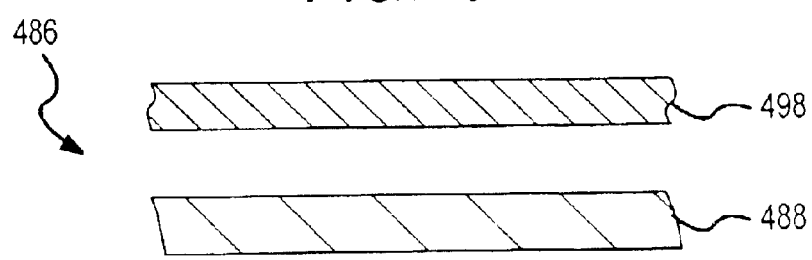

A first structural layer 498 is then deposited on any exposed portions of the first sacrificial layer 490 and the second sacrificial layer 496, as illustrated in FIG. 19E. This completes the definition of the microstructure 486. It should be appreciated that the system that includes the microstructure 486 will likely include other components than those illustrated in FIGS. 19A–F and that may interface with the microstructure 486 in some manner (e.g., one or more actuators).

The microstructure 486 is now ready to be released. "Released" means to remove each of the sacrificial layers of the surface micromachined system and thereby including the first sacrificial layer 490 and the second sacrificial layer 496. An etchant is used to provide the releasing function. The manner in which the microstructure 486 was formed in accordance with the methodology of FIGS. 19A–F reduces the time required for the sacrificial layers 490 and 496 to be totally removed. Ultimately, a plurality of at least generally laterally extending etchant flow pipes, channels, or conduits are formed in the second sacrificial layer 496. Those portions of the second sacrificial layer 496 that are positioned alongside the sidewalls 494 of the etch release conduit apertures 492 that were formed in the first sacrificial layer 490 are less dense than the remainder of the second sacrificial layer 496. The etch rate will be greater in the low density regions of the second sacrificial layer 496 than throughout the remainder of the second sacrificial layer 496. This will effectively form an etch release pipe, channel or conduit in the second sacrificial layer 496 along each sidewall 494. The development of the etch release channels during the initial portion of the release etch provides access to radially inwardly disposed locations within the sacrificial layers for the etchant to complete the release before the etchant has any significant adverse effect on the microstructure 486.

Etch release channels that exist prior to the release of the microstructure 486 may also be formed by the "keyholing" concept discussed above in relation to FIGS. 15A–G. Generally, a relationship between the width of the etch release conduit apertures 492 and the height or vertical extent of these etch release conduit apertures 492 may be selected to allow a plurality of etch release channels to be defined in the lower portion of these apertures 492. When this relationship is selected in the same general manner discussed above in relation to FIGS. 15A–G, the second sacrificial layer 496 will extend within and occupy only a portion of each of the apertures 492 that were previously formed from the first sacrificial layer 490. However, the material that defines the second sacrificial layer 496 will not fill or occupy the entirety of the apertures 492 due to the relative close spacing between the sidewalls 494 that define the etch release conduit apertures 492 in relation to the height or vertical extent of these apertures 492 (i.e., a void will remain in the lower portion of each aperture 492). This again may be characterized as "keyholing." In any case, the remaining voids in the lower portion of each of the etch release conduit apertures 492 will define a plurality of at least generally laterally extending etch release channels.

Another method for making a microstructure is illustrated by reference to FIGS. 20A–D. The fundamental principles of this methodology may be utilized to make the mirror microstructure 30 of FIG. 2A, the mirror microstructure 58 of FIG. 4, the mirror microstructure 106 of FIGS. 5–6, the mirror microstructure 130 of FIG. 7, the mirror microstructure 384 of FIGS. 10A–C, the mirror microstructure 384' of FIG. 10D, as well as the variations therefore that are presented in FIGS. 11A–F. In addition to accommodating the fabrication of at least certain types of reinforcing structures for the microstructure, the methodology embodied by FIGS. 20A–D further provides a desired manner for releasing the microstructure at the end of fabrication by forming a plurality of at least one at least generally laterally extending etch release conduit within one or more of its sacrificial layers to facilitate the removal of this sacrificial material during the release of the microstructure from the substrate.

Multiple layers of at least two different types of materials are sequentially deposited to define a stack 594 on a substrate 582 that is appropriate for surface micromachining. The various deposition and patterning steps that may yield the configuration illustrated in FIG. 20A have been sufficiently described in relation to other embodiments, and will not be repeated. The stack 594 includes a microstructure 592, which in the illustrated embodiment is in the form of a single structural layer 590 that is disposed in spaced relation to the substrate 582. Any configuration that is appropriate for the manner of defining etch release channels in the manner contemplated by FIGS. 20A–D may be utilized for the microstructure 592, including where the structural layer 590 is structurally reinforced in an appropriate manner. In any case, the stack 594 also includes an etch release conduit fill material 586 that is encased within a sacrificial material 584 both within the area occupied by the microstructure 592 and laterally beyond the microstructure 592 or "off to the side" of the microstructure 592. Generally, this etch release conduit fill material 586 is removed by a first etchant to form at least one laterally extending etch release conduit 602 at least somewhere underneath at least one structural layer of the microstructure 592. That is, the first etchant is more selective to the etch release conduit fill material 586 than the sacrificial material 584 in an amount such that it does not remove any significant portion of the sacrificial material 584. Thereafter, a second, different etchant (i.e., a release etchant) enters the etch release conduit(s) 602. This second, different etchant removes at least that portion of the sacrificial material 584 which is accessible through the etch release conduit (s) 602 to release the microstructure 592 from the substrate 582. That is, the second etchant is more selective to the sacrificial material 584 than the structural layer 590 in an amount such that it does not remove any significant portion of the structural layer 590.

The etch release conduit fill material 586 may be disposed at one or more levels relative to the substrate 582 within the microstructure 592. An at least generally vertically extending runner 588 of etch release conduit material 586 is disposed laterally beyond the area occupied by the microstructure 592 (i.e., off to the side), and extends at least generally downwardly from an uppermost exterior surface 596 of the stack 594 toward the substrate 582 to the etch release conduit fill material 586 at one or more of the levels within the stack 594. Any appropriate number of runners 588 may be utilized, and each may be of any appropriate configuration.

Figure 20A:
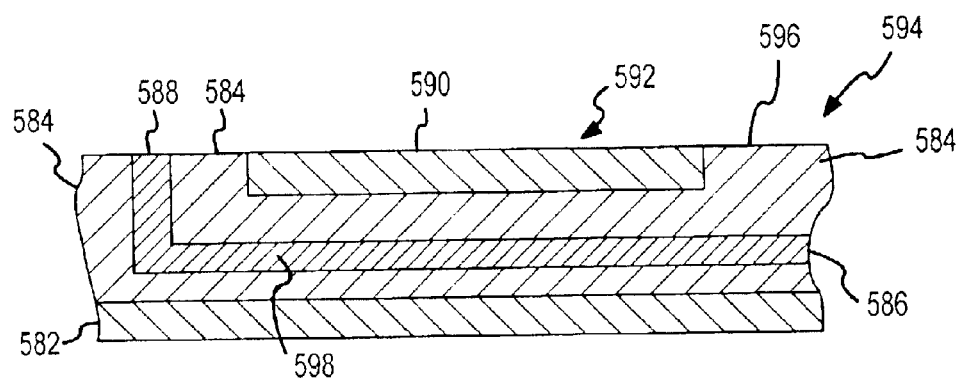
FIGS. 20A–D are sequential views of another embodiment for making one embodiment of a microstructure for a surface micromachined system.
Figure 20B:
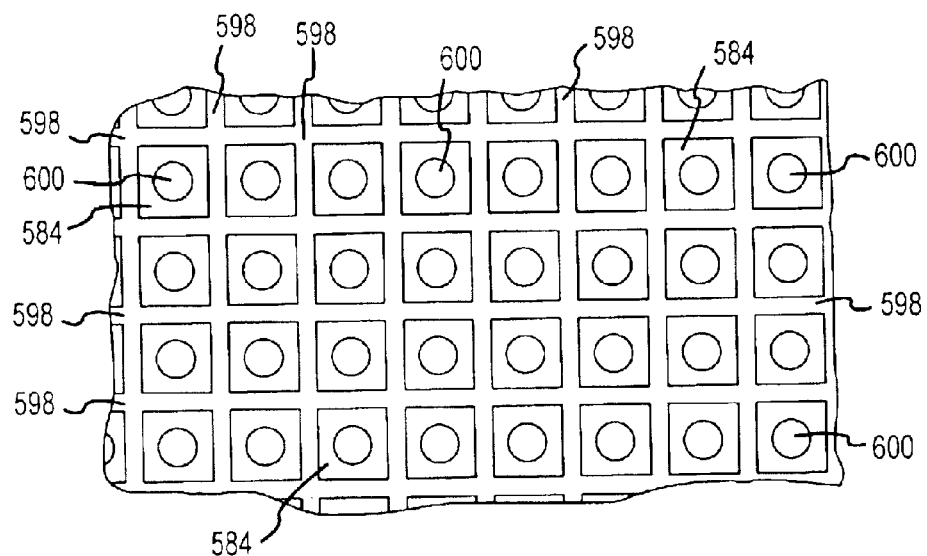

The etch release conduit fill material 586 at any level within the stack 594 may occupy the entirety of this level under at least one structural layer of the microstructure 592. More typically, a patterning operation will have been done at a given level to define an appropriate layout of etch release rails from the etch release conduit fill material 586. FIG. 20B illustrates one embodiment of a layout of etch release rails 598 of etch release conduit fill material 586 that are in the form of a grid or network. Other layouts for the etch release rails 598 may be utilized, including without limitation those discussed above. In the case of the embodiment of FIG. 20B, sacrificial material 584 is also disposed at the same level within the stack 594 as the etch release rails 598 (i.e., in the space between adjacent etch release rails 598). Reinforcement structures 600 also may be disposed at the same level within the stack 594 as the etch release rails 598 in this same space as well if desired. These reinforcement structures 600 are separated from the etch release conduit fill material 586 by sacrificial material 584. That is, the etch release conduit fill material 584 is encased within sacrificial material 584.

Regardless of the layout of the etch release rails 598 of etch release conduit fill material 586, the microstructure 592 is released in the same general manner. Initially, the stack 594 is exposed to a first etchant that is selective to the etch release conduit fill material 586. In one embodiment, the etch release conduit fill material 586 is the same material that is used to form the various structural layers that define the microstructure 592. In this case, it is necessary for the various structural layers of the microstructure 592 to be isolated from the etch release conduit fill material 586 by sacrificial material 584. There may be instances where a particular etchant may be sufficiently selective to the etch release conduit fill material 586 so as to not require this isolation of the structural material of the microstructure 592 from the etch release conduit fill material 586.

Figure 20C:
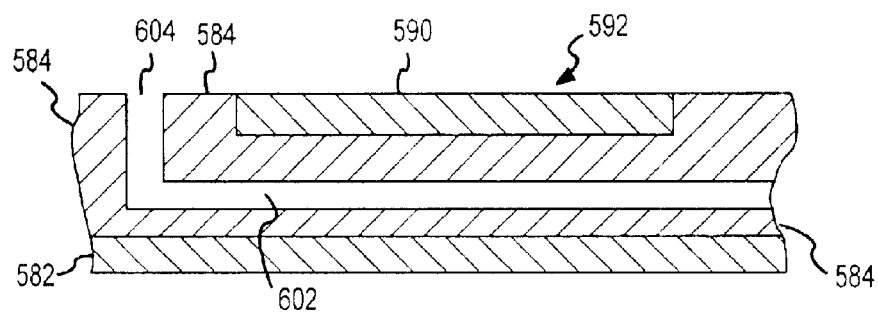

The first etchant removes the etch release conduit fill material 586 within the runner 588 to define an access 604, as well as any etch release rails 598 of etch release conduit fill material 586 connected therewith. This first etchant preferably does not remove any significant portion of any sacrificial material 584 that encases the etch release rails 598 and/or the runner(s) 588. The resulting void by this removal of material of the etch release rails 598 defines at least one etch release conduit 602 that is at least generally laterally extending and disposed under at least one structural layer of the microstructure 592 (FIG. 20C). In the layout of etch release rails 598 illustrated in FIG. 20B, there would be a grid or network of etch release conduits 602 within the sacrificial material 584 disposed under the area occupied by the structural layer 590.

Figure 20D:
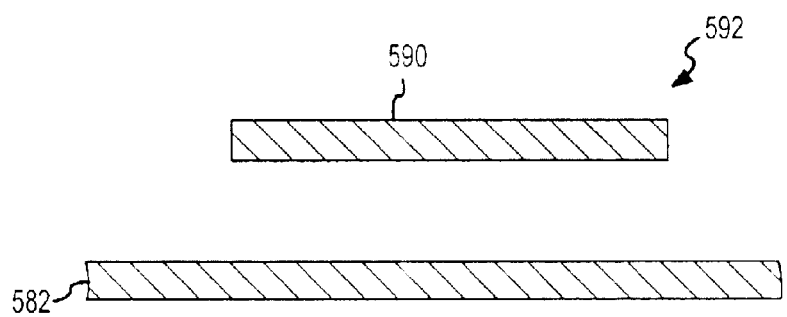

There is a separate and distinct second etching operation in accordance with the methodology of FIGS. 20A–D. After the first etching operation has been executed to define at least one and more typically a plurality of etch release conduits 602, the stack 594 undergoes a second etching operation. The second etching operation uses a second etchant that is different from the first etchant, and that is selective to the sacrificial material 584. This second etchant flows down through the various accesses 604 that may be associated with the stack 594 and into any etch release conduit 602 fluidly interconnected therewith. The second etchant removes any sacrificial material 584 in contact therewith to release the microstructure 592 from the substrate 582 (FIG. 20D). In the event that the etch release conduit fill material 586 is polysilicon, representative examples for the first etchant would be potassium hydroxide, tetramethylammonium hydroxide, and xenon difluoride. Assuming that the sacrificial material 584 is doped or undoped silicone dioxide or silicone oxide, representative examples for the second etchant would be HF-based, including those identified above.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A surface micromachined optical system that comprises:
    a first substrate;
    a first mirror microstructure disposed in spaced relation to and movably interconnected with said first substrate; and
    a first actuator associated with said first mirror microstructure, wherein said first mirror microstructure comprises:
        a first structural layer that is disposed in spaced relation to said first substrate; a second structural layer that is disposed in spaced relation to said first structural layer, wherein said first structural layer is disposed between said second structural layer and said first substrate;
        a first fixed, structural interconnection between said first and second structural layers;
        a third structural layer that is disposed in spaced relation to said second structural layer, wherein said second structural layer is disposed between said first and third structural layers; and
        a second fixed, structural interconnection between said second and third structural layers, wherein an entirety of said first mirror microstructure moves in response to said first actuator.

2. A system, as claimed in claim 1, wherein:
said first, second, and third structural layers are at least substantially vertically aligned.

3. A system, as claimed in claim 1, wherein:
said first structural layer comprises a first center, said second structural layer comprises a second center, and said third structural layer comprises a third center, and wherein said first, second, and third centers are vertically aligned.

4. A system, as claimed in claim 1, wherein:
said first, second, and third structural layers are polysilicon, and wherein said first substrate is silicon.

5. A system, as claimed in claim 1, wherein:
said third structural layer comprises a plurality of etch release holes that extend through an entire thickness of said third structural layer.

6. A system, as claimed in claim 1, wherein:
said third structural layer is devoid of any etch release holes that extend through an entire thickness of said third structural layer.

7. A system, as claimed in claim 1, wherein:
said third structural layer comprises a lower surface that projects toward said second structural layer and an oppositely disposed upper surface, and wherein said upper surface comprises an optically reflective surface of said third structural layer.

8. A system, as claimed in claim 7, wherein:
a minimum surface area of said optically reflective surface is about 2,000 $\mu m^2$.

9. A system, as claimed in claim 1, wherein:
said third structural layer comprises a lower surface that projects toward said second structural layer and an oppositely disposed upper surface, and wherein said first mirror microstructure further comprises a first optically reflective layer that is deposited on said upper surface of said third structural layer.

10. A system, as claimed in claim 9, wherein:
said first optically reflective layer comprises a material selected from the group consisting of gold, silver, and aluminum.

11. A system, as claimed in claim 1, further comprising:
a plurality of suspension springs movably interconnecting said first mirror microstructure with said substrate.

12. A system, as claimed in claim 1, wherein:
said first fixed, structural interconnection comprises a plurality of first columns extending between and fixedly interconnecting said first and second structural layers; and
said second fixed, structural interconnection comprises a plurality of second columns extending between and fixedly interconnecting said second and third structural layers.

13. A system, as claimed in claim 12, wherein:
said plurality of first columns are disposed at least substantially perpendicular to each of said first and second structural layers; and
said plurality of second columns are disposed at least substantially perpendicular to each of said second and third structural layers.

14. A system, as claimed in claim 12, wherein:
said plurality of first and second columns structurally reinforce said first mirror microstructure.

15. A system, as claimed in claim 12, wherein:
said plurality of first columns are at least substantially uniformly distributed across at least substantially an entirety of said second structural layer; and
said plurality of second columns are at least substantially uniformly distributed across at least substantially an entirety of said third structural layer.

16. A system, as claimed in claim 12, wherein:
said plurality of first columns are equally spaced, and wherein said plurality of second columns are equally spaced.

17. A system, as claimed in claim 12, wherein:
said mirror microstructure comprises a center that extends through said first, second, and third structural layers, wherein individual members of a first pair of said plurality of first columns are disposed at a different radial distance from said center, and wherein individual members of a second pair of said plurality of second columns are also disposed at a different radial distance from said center.

18. A system, as claimed in claim 1, wherein:
said first fixed, structural interconnection comprises a plurality of at least generally laterally extending first rails that are disposed between and fixedly interconnect said first and second structural layers; and
said second fixed, structural interconnection comprises a plurality of at least generally laterally extending second rails that are disposed between and fixedly interconnect said second and third structural layers.

19. A system, as claimed in claim 18, wherein:
said plurality of first rails are disposed in non-intersecting relation; and
said plurality of second rails are disposed in non-intersecting relation.

20. A system, as claimed in claim 18, wherein:
said plurality of first rails are disposed in at least substantially parallel relation; and
said plurality of second rails are disposed in at least substantially parallel relation.

21. A system, as claimed in claim 18, wherein:
said plurality of first rails extend at least toward a first point; and
said plurality of second rails extend at least toward a second point.

22. A system, as claimed in claim 21, wherein:
at least one of said plurality of first rails extends closer to said first point than at least one other of said plurality of first rails; and
at least one of said plurality of second rails extends closer to said second point than at least one other of said plurality of second rails.

23. A system, as claimed in claim 21, wherein:
each of said plurality of first rails terminate at least substantially equidistantly from said first point; and
each of said plurality of second rails terminate at least substantially equidistantly from said second point.

24. A system, as claimed in claim 21, wherein:
at least two of said plurality of first rails intersect at said first point; and
at least two of said plurality of second rails intersect at said second point.

25. A system, as claimed in claim 18, wherein:
a first pair of said plurality first rails extend at least toward a first point, and wherein a second pair of said plurality of first rails extend at least toward a second point that is spaced from said first point; and a first pair of said plurality second rails extend at least toward a third point, and wherein a second pair of said plurality of second rails extend at least toward a fourth point that is spaced from said second point.

26. A system, as claimed in claim 18, wherein:

a first group of said plurality of first rails are disposed in a different orientation than a second group of said plurality of first rails; and a first group of said plurality of second rails are disposed in a different orientation than a second group of said plurality of second rails.

27. A system, as claimed in claim 18, wherein:

said plurality of first rails are axially extending; and said plurality of second rails are axially extending.

28. A system, as claimed in claim 18, wherein:

said plurality of first rails are other than linear; and said plurality of second rails are other than linear.

29. A system, as claimed in claim 18, wherein:

said mirror microstructure comprises a center that extends through said first, second, and third structural layers, wherein a first member of a first pair of said plurality first rails is disposed at a different radial distance from said center than a second member of said first pair of said plurality first rails, and wherein a first member of a first pair of said plurality second rails is disposed at a different radial distance from said center than a second member of said first pair of said plurality second rails.

30. A system, as claimed in claim 18, wherein:

said plurality of first rails are oriented perpendicular to said plurality of second rails.

31. A system, as claimed in claim 18, wherein:

said plurality of first rails extend at least generally sinusoidally in at least substantially parallel relation with said first substrate; and said plurality of second rails extend at least generally sinusoidally in at least substantially parallel relation with said first substrate.

32. A system, as claimed in claim 18, wherein:

at least two of said plurality of first rails intersect; and at least two of said plurality of second rails intersect.

33. A system, as claimed in claim 18, wherein:

each of said plurality of first and second rails are at least generally axially extending;

a first portion of said plurality of first rails are disposed in a first orientation in a lateral dimension while a second portion of said plurality of first rails are disposed in a second orientation in said lateral dimension that is different than said first orientation; and a first portion of said plurality of second rails are disposed in a third orientation in said lateral dimension while a second portion of said plurality of second rails are disposed in a fourth orientation in said lateral dimension that is different than said third orientation.

34. A system, as claimed in claim 33, wherein:

said first and second orientations are disposed about 90 degrees relative to each other; and said third and fourth orientations are disposed about 90 degrees relative to each other.

35. A system, as claimed in claim 1, wherein:

said first fixed, structural interconnection comprises a plurality of first rails extending between and fixedly interconnecting said first and second structural layers;

said first fixed, structural interconnection further comprises a plurality of second rails extending between and fixedly interconnecting said first and second structural layers, wherein said plurality of first and second rails intersect;

said second fixed, structural interconnection comprises a plurality of third rails extending between and fixedly interconnecting said second and third structural layers;

said second fixed, structural interconnection further comprises a plurality of fourth rails extending between and fixedly interconnecting said second and third structural layers, wherein said plurality of third and fourth rails intersect.

36. A system, as claimed in claim 35, wherein:

said plurality of first rails are at least generally perpendicular to said plurality of second rails; and said plurality of third rails are at least generally perpendicular to said plurality of fourth rails.

37. A system, as claimed in claim 1, wherein:

said first fixed, structural interconnection comprises a first grid; and said second fixed, structural interconnection comprises a second grid.

38. A system, as claimed in claim 37, wherein:

said first and second grids each comprise a plurality of closed cells.

39. A system, as claimed in claim 1, wherein:

said first fixed, structural interconnection comprises a first structural member that extends between and fixedly interconnects said first and second structural layers, wherein said first structural member is positioned relative to a center of said second structural layer in a lateral dimension such that a first reinforcement ratio is no more than about 0.5, wherein said first reinforcement ratio is a ratio of a first distance to a second distance, wherein said first distance is a distance from said center to a portion of said first structural member that is disposed closest to said center, and wherein said second distance is a diameter of said second structural layer; and said second fixed, structural interconnection comprises a second structural member that extends between and fixedly interconnects said second and third structural layers, wherein said second structural member is positioned relative to a center of said third structural layer in a lateral dimension such that a second reinforcement ratio is no more than about 0.5, wherein said second reinforcement ratio is a ratio of a third distance to a fourth distance, wherein said third distance is a distance from said center to a portion of said second structural member that is disposed closest to said center, and wherein said fourth distance is a diameter of said third structural layer.

40. A system, as claimed in claim 1, wherein:

a width of said first fixed, structural interconnection is less than twice a thickness of said second structural layer; and a width of said second fixed, structural interconnection is less than twice a thickness of said third structural layer.

41. A system, as claimed in claim 1, wherein:

a maximum thickness of each of said first, second, and third structural layers is about 10 $\mu$m.

42. A system, as claimed in claim 1, wherein:

a maximum thickness of each of said first, second, and third structural layers is about 6 $\mu$m.

43. A surface micromachined optical system that comprises:
- a first substrate;
- a first mirror microstructure disposed in spaced relation to and movably interconnected with said first substrate; and
- a first actuator associated with said first mirror microstructure, wherein said first mirror microstructure comprises:
  - a first structural layer that is disposed in spaced relation to said first substrate;
  - a second structural layer that is disposed in spaced relation to said first structural layer, wherein said first structural layer is disposed between said second structural layer and said first substrate;
  - a third structural layer that is disposed in spaced relation to said second structural layer, wherein said second structural layer is disposed between said first and third structural layers; and
  - first and second means for fixedly structurally interconnecting said first and second, structural layers and said second and third structural layers, respectively, such that an entirety of said first mirror microstructures moves in response to said first actuator.

44. A surface micromachined optical system that comprises:
- a first substrate;
- a first mirror microstructure disposed in spaced relation to and movably interconnected with said first substrate; and
- a first actuator associated with said first mirror microstructure, wherein said first mirror microstructure comprises:
  - a first structural layer that is disposed in spaced relation to said first substrate;
  - a second structural layer that is disposed in spaced relation to said first structural layer, wherein said first structural layer is disposed between said second structural layer and said first substrate;
  - a first fixed, structural interconnection between said first and second structural layers, wherein said first fixed, structural interconnection comprises a plurality of first columns extending between and fixedly interconnecting said first and second structural layers;
  - a third structural layer that is disposed in spaced relation to said second structural layer, wherein said second structural layer is disposed between said first and third structural layers; and
  - a second fixed, structural interconnection between said second and third structural layers, wherein said second fixed, structural interconnection comprises a plurality of second columns extending between and fixedly interconnecting said second and third structural layers, wherein said mirror microstructure comprises a center that extends through said first, second, and third structural layers, wherein individual members of a first pair of said plurality of first columns are disposed at a different radial distance from said center, and wherein individual members of a second pair of said plurality of second columns are also disposed at a different radial distance from said center.

45. A surface micromachined optical system that comprises:
- a first substrate;
- a first mirror microstructure disposed in spaced relation to and movably interconnected with said first substrate; and
- a first actuator associated with said first mirror microstructure, wherein said first mirror microstructure comprises:
  - a first structural layer that is disposed in spaced relation to said first substrate;
  - a second structural layer that is disposed in spaced relation to said first structural layer, wherein said first structural layer is disposed between said second structural layer and said first substrate;
  - a first fixed, structural interconnection between said first and second structural layers, wherein said first fixed, structural interconnection comprises a plurality of at least generally laterally extending first rails that are disposed between and fixedly interconnect said first and second structural layers;
  - a third structural layer that is disposed in spaced relation to said second structural layer, wherein said second structural layer is disposed between said first and third structural layers; and
  - a second fixed, structural interconnection between said second and third structural layers, wherein said second fixed, structural interconnection comprises a plurality of at least generally laterally extending second rails that are disposed between and fixedly interconnect said second and third structural layers, wherein said mirror microstructure comprises a center that extends through said first, second, and third structural layers, wherein a first member of a first pair of said plurality first rails is disposed at a different radial distance from said center than a second member of said first pair of said plurality first rails, and wherein a first member of a first pair of said plurality second rails is disposed at a different radial distance from said center than a second member of said first pair of said plurality second rails.

46. A surface micromachined optical system that comprises:
- a first substrate;
- a first mirror microstructure disposed in spaced relation to and movably interconnected with said first substrate; and
- a first actuator associated with said first mirror microstructure, wherein said first mirror microstructure comprises:
  - a first structural layer that is disposed in spaced relation to said first substrate;
  - a second structural layer that is disposed in spaced relation to said first structural layer, wherein said first structural layer is disposed between said second structural layer and said first substrate;
  - a first fixed, structural interconnection between said first and second structural layers, wherein said first fixed, structural interconnection comprises a plurality of at least generally laterally extending first rails that are disposed between and fixedly interconnect said first and second structural layers, and wherein said plurality of first rails extend at least generally sinusoidally in at least substantially parallel relation with said first substrate;
  - a third structural layer that is disposed in spaced relation to said second structural layer, wherein said second structural layer is disposed between said first and third structural layers; and a second fixed, structural interconnection between said second and third structural layers, wherein said second fixed, structural interconnection comprises a plurality of at least generally laterally extending second rails that are disposed between and fixedly interconnect said second and third structural layers, and wherein said plurality of second rails extend at least generally sinusoidally in at least substantially parallel relation with said first substrate.

47. A surface micromachined optical system that comprises:

a first substrate;

a first mirror microstructure disposed in spaced relation to and movably interconnected with said first substrate; and a first actuator associated with said first mirror microstructure, wherein said first mirror microstructure comprises:

a first structural layer that is disposed in spaced relation to said first substrate;

a second structural layer that is disposed in spaced relation to said first structural layer, wherein said first structural layer is disposed between said second structural layer and said first substrate;

a first fixed, structural interconnection between said first and second structural layers, wherein said first fixed, structural interconnection comprises a first grid;

a third structural layer that is disposed in spaced relation to said second structural layer, wherein said second structural layer is disposed between said first and third structural layers; and a second fixed, structural interconnection between said second and third structural layers, wherein said second fixed, structural interconnection comprises a second grid.

48. A system, as claimed in claim 47, wherein:

said first and second grids each comprise a plurality of closed cells.

* * * * *